(12) United States Patent
Johnson

(10) Patent No.: US 7,116,405 B2
(45) Date of Patent: Oct. 3, 2006

(54) MASKLESS, MICROLENS EUV LITHOGRAPHY SYSTEM WITH GRAZING-INCIDENCE ILLUMINATION OPTICS

(76) Inventor: Kenneth C. Johnson, 2502 Robertson Rd., Santa Clara, CA (US) 95051

(*) Notice: Subject to any disclaimer, the term of this patent is extended or adjusted under 35 U.S.C. 154(b) by 103 days.

(21) Appl. No.: 10/897,082

(22) Filed: Jul. 21, 2004

(65) Prior Publication Data
US 2005/0122593 A1    Jun. 9, 2005

Related U.S. Application Data

(60) Provisional application No. 60/527,106, filed on Dec. 4, 2003.

(51) Int. Cl.
*G03B 27/54* (2006.01)
*G21K 1/06* (2006.01)
(52) U.S. Cl. .......................... 355/67; 378/85
(58) Field of Classification Search .............. 355/67; 378/85
See application file for complete search history.

(56) References Cited

U.S. PATENT DOCUMENTS

| | | | |
|---|---|---|---|
| 5,859,424 A | 1/1999 | Norton et al. | |
| 6,133,986 A | 10/2000 | Johnson | |
| 6,177,980 B1 | 1/2001 | Johnson | |
| 6,188,519 B1 | 2/2001 | Johnson | |
| 6,285,737 B1 | 9/2001 | Sweatt et al. | |
| 6,301,000 B1 | 10/2001 | Johnson | |
| 6,392,752 B1 | 5/2002 | Johnson | |
| 6,424,404 B1 | 7/2002 | Johnson | |
| 6,489,685 B1 | 12/2002 | Asahi et al. | |
| 6,489,984 B1 | 12/2002 | Johnson | |
| 6,628,390 B1 | 9/2003 | Johnson | |
| 7,006,595 B1* | 2/2006 | Singer et al. | 378/34 |
| 2002/0171922 A1* | 11/2002 | Shiraishi et al. | 359/359 |

OTHER PUBLICATIONS

R. Volkel, H.P. Herzig, P. Nussbaum, R. Dandliker, W.B. Hugle; Microlens array imaging system for photolithography; Nov. 1996; Optics Engineering; 35(11); pp. 3323-3330.*

H.I. Smith; A proposal for maskless, zone-plate-array nanolithography; Journal of Vacuum Science Technology B; Nov./Dec. 1996; 14(6); pp. 4318-4322.*

(Continued)

*Primary Examiner*—W. B. Perkey
*Assistant Examiner*—Vivian Nelson
(74) *Attorney, Agent, or Firm*—Townsend and Townsend and Crew LLP

(57) ABSTRACT

An EUV lithography system achieves high-resolution printing without the use of photomasks, projection optics, multilayer mirrors, or an extremely high-power EUV source. The system comprises a xenon laser-produced-plasma (LPP) illumination source (requiring 93 W hemispherical EUV emission in the wavelength range 10–12 nm), all-ruthenium optics (grazing-incidence mirrors and microlenses) and spatial light modulators comprising MEMS-actuated microshutters. Two 300-mm wafers are simultaneously exposed with a single 10 kHz LPP source to achieve a throughput of 6 wafers per hour, per LPP source. The illumination is focused by the microlens arrays onto diffraction-limited (42-nm FWHM) spots on the wafer plane, and the spots are intensity-modulated by the microshutters as they are raster-scanned across the wafer surface to create a digitally synthesized exposure image. The optical path between the source and the microlenses traverses seven grazing-incidence mirrors (two collimator elements and five fold mirrors), which have high reflection efficiency and essentially unlimited wavelength bandpass.

29 Claims, 35 Drawing Sheets

OTHER PUBLICATIONS

Stamm et al., "High Power EUV Lithography Sources Based on Gas Discharges and Laser Produced Plasmas," *Proc. SPIE*, 5037:119-129 (2003).

Partlo et al., "Progress Toward use of a Dense Plasma Focus as a Light Source for Production EUV Lithography," *Proc. of SPIE*, 4343:232-248 (2001).

International Sematech, 5th Next Generation Lithography (NGL) Workshop, Aug. 29-30, 2001; Poster Presentation—Cymer.

Tamotsu et al., "Development of a Liquid-Jet Laser-Produced-Plasma Light Source for EUV Lithography," *Proc. SPIE*, 5037:776-783 (2003).

NanoFilm Technology, http://www.nanofilm.com.sg/index.htm.

Graham et al., "Atomic Hydrogen Cleaning of EUV Multilayer Optics," *Proc. SPIE*, 5037:460-469 (2003).

Wong, A. W., *Resolution Enhancement Techniques in Optical Lithography*, SPIE Press, 2001.

Born and Wolf, *Principles of Optics, 7th Ed.*, Cambridge University Press (1999).

Liu et al., "Investigation of the LIGA process to fabricate microchannel plates," *Transducers '97*, 1:645-648 (1997).

Loeschner et al., "Masked Ion Beam Lithography and Direct-Structuring on Curved Surfaces," *Proc. SPIE*, 5037:156-161 (2003).

Yongqui et al., "Investigation of direct milling of micro-optical elements with continuous relief on a substrate by focused ion beam technology," *Opt. Eng.*, 39(11):3008-3013 (2000).

Yongqui et al., "Semiconductor Microlenses Fabricated by One-Step Focused Ion Beam Direct Writing," *IEEE Transactions on Semiconductor Manufacturing*, 15(2):229-231 (2002).

Brugger et al., "Resistless patterning of sub-micron structures by evaporation through nanostencils," *Microelectronic Engineering*, 53:403-405 (2003).

Peake et al., "A Micromachined, Shadow-Mask Technology for the OMVPE Fabrication of Integrated Optical Structures," *Journal of Electronics Materials*, 29(1): 86-90 (1999).

Grunwald, R., "Microlens formation by thin-film deposition with mesh-shaped masks," *Applied Optics*, 38(19):4117-4124 (1999).

Nakahara et al., "Etching technique for ruthenium with a high etch rate and high selectivity using ozone gas," *J. Vac. Sci. Tech. B.*, 19(6):2133-2136 (2001).

MacLeod, B. D., "Fully Automated Interference Lithography," *Proc. SPIE*, 4688:910-921 (2002).

Stein et al., "Diffraction x-ray optics using production fabrication methods," *J. Vac. Sci. Technol.*, B 21(1):214-219 (2003).

Miyamoto, K., "The Phase Fresnel Lens," *J. Opt. Soc. Am.*, 51(1):17-20 (1961).

Harvey, J. E., "Grazing incidence hyperboloid-hyperboloid designs for wide-field x-ray imaging applications," *Applied Optics*, 40(1):136-144 (2001).

\* cited by examiner

| $D_1$ | 10 μm |
|---|---|
| $D_2$ | 1 μm |
| $z_1$ | 387.874 μm |
| $z_2$ | 387.774 μm |
| $z_3$ | 2.774 μm |
| $z_4$ | 2.410 μm |
| $z_5$ | 2.310 μm |
| $z_6$ | 0 |
| $z_7$ | -2.261 μm |

| Wavelength | 1-N | K | Xe intensity |
|---|---|---|---|
| 9.50 nm | 0.04312 | 0.00427 | 0.02974 |
| 9.75 nm | 0.04619 | 0.00434 | 0.03346 |
| 10.00 nn | 0.04941 | 0.00448 | 0.03346 |
| 10.25 nm | 0.05276 | 0.00467 | 0.04275 |
| 10.50 nm | 0.05626 | 0.00496 | 0.07063 |
| 10.75 nm | 0.05990 | 0.00529 | 0.17100 |
| 11.00 nm | 0.06370 | 0.00568 | 0.15613 |
| 11.25 nm | 0.06776 | 0.00616 | 0.12082 |
| 11.50 nm | 0.07197 | 0.00685 | 0.09665 |
| 11.75 nm | 0.07633 | 0.00764 | 0.07807 |
| 12.00 nm | 0.08081 | 0.00869 | 0.06320 |
| 12.25 nm | 0.08532 | 0.00982 | 0.05576 |
| 12.50 nm | 0.08997 | 0.01097 | 0.04833 |

| Assumption | Focus spot FWHM |
|---|---|
| Monochromatic, point source | 40.01 nm |
| Xe spectrum, point source | 41.57 nm |
| Xe spectrum, 0.5 mrad source | 41.72 nm |
| Xe spectrum, 0.5 mrad source, 21-point exposure | 49.72 nm |

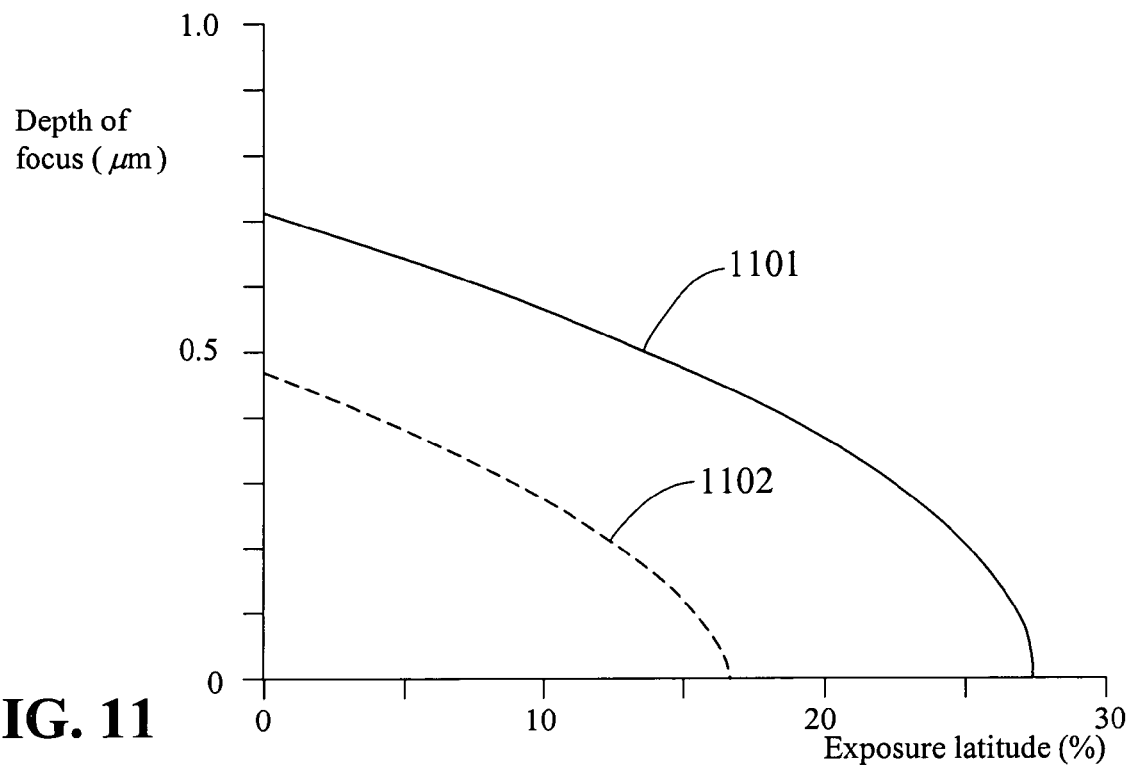

FIG. 11

Axisymmetric Zernike orders:

| |
|---|
| $R_0^0[\rho] = 1$ |
| $\sqrt{3} R_2^0[\rho] = \sqrt{3}(-1+2\rho^2)$ |
| $\sqrt{5} R_4^0[\rho] = \sqrt{5}(1-6\rho^2+6\rho^4)$ |
| $\sqrt{7} R_6^0[\rho] = \sqrt{7}(-1+2\rho^2)(1-10\rho^2+10\rho^4)$ |

Odd-symmetric Zernike orders:

| |
|---|
| $2 R_1^1[\rho]\cos\theta = 2\rho\cos\theta$ |
| $2 R_1^1[\rho]\sin\theta = 2\rho\sin\theta$ |
| $2\sqrt{2} R_3^1[\rho]\cos\theta = 2\sqrt{2}\rho(-2+3\rho^2)\cos\theta$ |
| $2\sqrt{2} R_3^1[\rho]\sin\theta = 2\sqrt{2}\rho(-2+3\rho^2)\sin\theta$ |
| $2\sqrt{3} R_5^1[\rho]\cos\theta = 2\sqrt{3}\rho(3-12\rho^2+10\rho^4)\cos\theta$ |
| $2\sqrt{3} R_5^1[\rho]\sin\theta = 2\sqrt{3}\rho(3-12\rho^2+10\rho^4)\sin\theta$ |

Modeled surface distortions:

| | |
|---|---|
| $L_1$ top: | 1.5 nm RMS, all orders |
| $L_1$ bottom: | 1.5 nm RMS, all orders |
| $L_2$ top: | 0.75 nm RMS, axisymmetric orders; 0.2 nm RMS, odd-symmetric orders |
| $L_2$ bottom: | 0.75 nm RMS, axisymmetric orders; 0.2 nm RMS, odd-symmetric orders |

FIG. 12

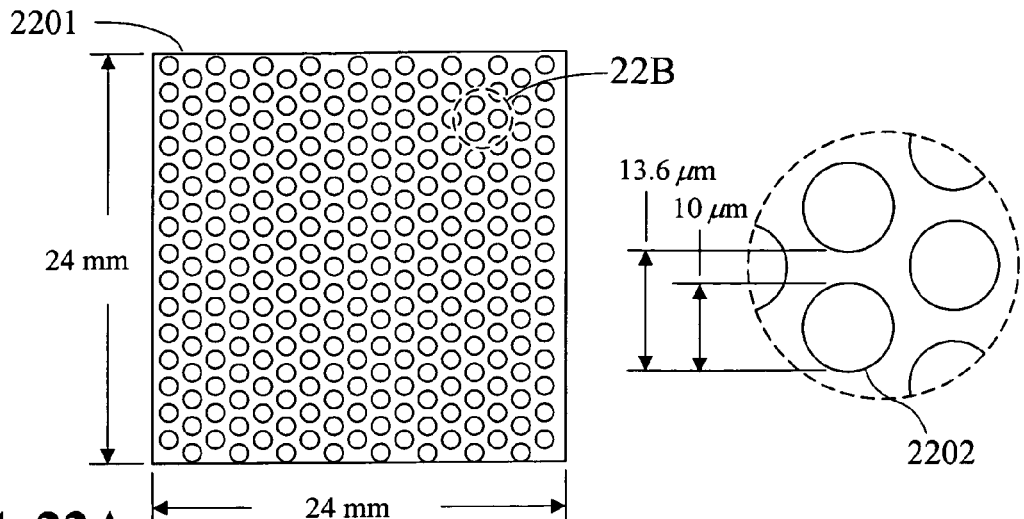
FIG. 22A  FIG. 22B
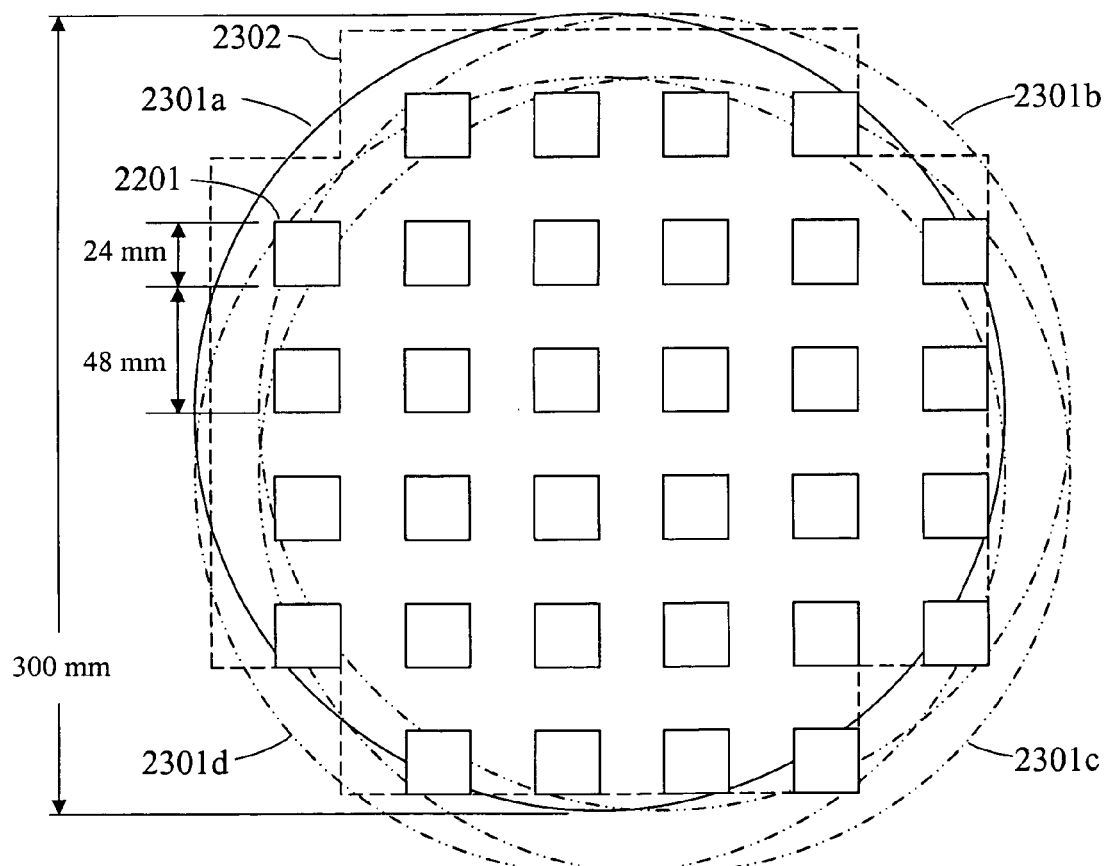
FIG. 23

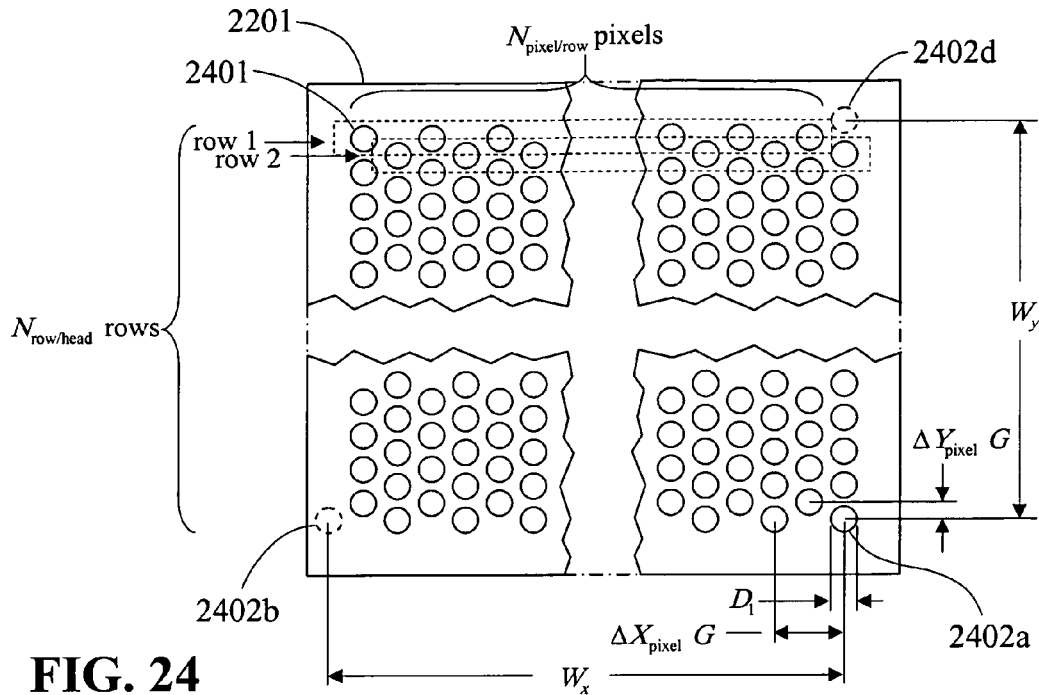
FIG. 24
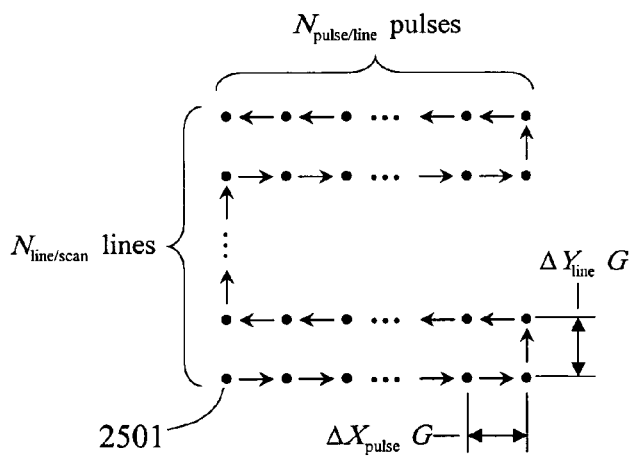
FIG. 25
| Eq. 2601 | $G = 8$ nm |
|---|---|
| Eq. 2602 | $N_{pixel/row} = 1026$ |
| Eq. 2603 | $N_{row/head} = 3538$ |
| Eq. 2604 | $\Delta X_{pixel}\, G = 2924\, G$ $= 23.392\, \mu m$ |
| Eq. 2605 | $\Delta Y_{pixel}\, G = 848\, G$ $= 6.784\, \mu m$ |
| Eq. 2606 | $W_x = N_{pixel/row}\, \Delta X_{pixel}\, G$ $= 24.000192$ mm |
| Eq. 2607 | $W_y = N_{row/head}\, \Delta Y_{pixel}\, G$ $= 24.001792$ mm |
| Eq. 2608 | $N_{pulse/line} = \Delta X_{pixel}$ $= 2924$ |
| Eq. 2609 | $N_{line/scan} = \Delta Y_{pixel}$ $= 848$ |
| Eq. 2610 | $\Delta X_{pulse}\, G = 13\, G$ $= 104$ nm |
| Eq. 2611 | $\Delta Y_{line}\, G = 13\, G$ $= 104$ nm |
FIG. 26

Printing throughput:

| | | |
|---|---|---|
| Eq. 2701 | number of pulses per scan | $N_{pulse/scan} = N_{pulse/line} \cdot N_{line/scan} = 2,479,552$ |
| Eq. 2702 | number of pulses per print cycle | $N_{pulse} = 4 \cdot N_{pulse/scan} = 9,918,208$ |
| Eq. 2703 | source repetition rate | $\nu_{source} = 10^4 \text{ sec}^{-1}$ |
| Eq. 2704 | scanning time per print cycle | $t_{cycle\_scan} = N_{pulse} / \nu_{source} = 992.\text{sec} = 16.53\min$ |
| Eq. 2705 | total cycle time | $t_{cycle} \cong 20\min$ |
| Eq. 2706 | print time per wafer | $t_{wafer} = t_{cycle}/2 \cong 10\min$ |

FIG. 27

EUV power requirement:

| | | |
|---|---|---|
| Eq. 2801 | number of pixels per printhead | $N_{pixel/head} = N_{pixel/row} \cdot N_{row/head} = 3,629,988$ |
| Eq. 2802 | total number of pixels | $N_{pixel} = N_{pixel/head} \cdot 32 \cdot 2 = 232,319,232$ |
| Eq. 2803 | number printing dots | $N_{dot} = N_{pixel} \cdot N_{pulse} = 2,304,190,465,376,256$ |
| Eq. 2804 | print area | $A_{print} = N_{dot} \cdot G^2 = 1475.\text{cm}^2$ |
| Eq. 2805 | resist exposure threshold | $Q_{A\_resist} = 5\text{mJ}/\text{cm}^2$ |
| Eq. 2806 | peak exposure level (21-dot pattern) | $Q_{A\_peak} = 2 Q_{A\_resist} = 10\text{mJ}/\text{cm}^2$ |
| Eq. 2807 | clearing exposure level | $Q_{A\_clear} = 2.12 Q_{A\_peak} = 21.2\text{mJ}/\text{cm}^2$ |
| Eq. 2808 | EUV energy delivered to 2 wafers | $Q_{print} = Q_{A\_clear} \cdot A_{print} = 31.26\text{J}$ |
| Eq. 2809 | lens efficiency | $\eta_{L_1, L_2} = 0.0172$ |
| Eq. 2810 | $L_1$ aperture fill factor | $\eta_{ff} = \pi(D_1/2)^2 /(\Delta X_{pixel} \Delta Y_{pixel} G^2) = 0.495$ |
| Eq. 2811 | total EUV energy on printheads | $Q_{heads} = Q_{print}/(\eta_{L_1, L_2} \eta_{ff}) = 3673.\text{J}$ |
| Eq. 2812 | collimation efficiency (from $2\pi$ sr) | $\eta_{coll} = 0.0808$ |
| Eq. 2813 | fold mirror efficiency | $\eta_{fold} = 0.485$ |
| Eq. 2814 | misc efficiency loss | $\eta_{misc} = 0.8$ |
| Eq. 2815 | source energy ($2\pi$ sr, 3.25-nm band) | $Q_{source} = Q_{heads}/(\eta_{coll} \eta_{fold} \eta_{misc}) = 1.171 \cdot 10^5 \text{J}$ |
| Eq. 2816 | source power ($2\pi$ sr, 3.25-nm band) | $\Phi_{source, 3.25nm} = Q_{source}/t_{cycle\_scan} = 118.1\text{W}$ |
| Eq. 2817 | source power ($2\pi$ sr, 2-nm band) | $\Phi_{source, 2nm} = 0.784 \cdot \Phi_{source, 3.25nm} = 92.6\text{W}$ |

FIG. 28

M1, M2 geometry definition

| Eq. 3101 | $y_1 = l_1 \sin \Theta_1$ |
|---|---|
| Eq. 3102 | $z_1 = l_1 \cos \Theta_1$ |
| Eq. 3103 | $l_2 = \dfrac{c - l_1 - z_1}{1 - \cos \Theta_2}$ |
| Eq. 3104 | $y_2 = y_1 + l_2 \sin \Theta_2$ |
| Eq. 3105 | $z_2 = z_1 + l_2 \cos \Theta_2$ |
| Eq. 3106 | $\gamma_1 = (\Theta_1 - \Theta_2)/2$ |
| Eq. 3107 | $\gamma_2 = \Theta_2 / 2$ |
| Eq. 3108 | $(y_2 - y_1)\dfrac{dy_2}{d\Theta_1} + (z_2 - z_1 - l_2)\dfrac{dz_2}{d\Theta_1} = 0$ |
| Eq. 3109 | $\dfrac{dy_2}{d\Theta_1} = \dfrac{\sin \Theta_1}{y_2} \dfrac{I_0}{E_{print}}$ |

FIG. 31

Derivation of Eq's. 3103, 3108

| Eq. 3201 | $\left( \dfrac{\{y_1, z_1\}}{\sqrt{y_1^2 + z_1^2}} - \dfrac{\{y_2 - y_1, z_2 - z_1\}}{\sqrt{(y_2 - y_1)^2 + (z_2 - z_1)^2}} \right) \cdot \{dy_1, dz_1\} = 0$ |
|---|---|
| Eq. 3202 | $\left( \dfrac{\{y_2 - y_1, z_2 - z_1\}}{\sqrt{(y_2 - y_1)^2 + (z_2 - z_1)^2}} - \{0, 1\} \right) \cdot \{dy_2, dz_2\} = 0$ |
| Eq. 3203 | $d\left( \sqrt{y_1^2 + z_1^2} + \sqrt{(y_2 - y_1)^2 + (z_2 - z_1)^2} - z_2 \right) = 0$ |
| Eq. 3204 | $l_1 + l_2 - z_2 = c$ |
| Eq. 3205 | $\dfrac{(y_2 - y_1)dy_2 + (z_2 - z_1)dz_2}{l_2} - dz_2 = 0$ |

FIG. 32

Derivation of Eq. 3109

| | |
|---|---|
| Eq. 3301 | $d\Phi_{source} = I_\lambda \, d\omega \, d\lambda$ |
| Eq. 3302 | $d\omega = \sin\Theta_1 \, d\Theta_1 \, d\phi$ |
| Eq. 3303 | $dA = y_2 \, dy_2 \, d\phi$ |
| Eq. 3304 | $d\Phi_{head} = \eta_{mirror} \, d\Phi_{source}$ |
| Eq. 3305 | $dE_{head} = \dfrac{d\Phi_{head}}{dA} = \left(\dfrac{d\Phi_{head}}{d\Phi_{source}}\right)\left(\dfrac{d\Phi_{source}}{d\omega}\right)\left(\dfrac{d\omega}{dA}\right)$ $= \eta_{mirror} \, I_\lambda \, \dfrac{\sin\Theta_1 \, d\Theta_1}{y_2 \, dy_2} \, d\lambda$ |
| Eq. 3306 | $dE_{print} = \eta_{resist} \, \eta_{head} \, dE_{head}$ |
| Eq. 3307 | $E_{print} = \int dE_{print} = \int \eta_{resist} \, \eta_{head} \, \eta_{mirror} \, I_\lambda \, \dfrac{\sin\Theta_1 \, d\Theta_1}{y_2 \, dy_2} \, d\lambda$ $= \dfrac{\sin\Theta_1 \, d\Theta_1}{y_2 \, dy_2} \, I_0$ |
| Eq. 3308 | $I_0[\Theta_1] = \int \eta_{resist}[\lambda] \, \eta_{head}[\lambda] \, \eta_{mirror}[\lambda, \gamma_1, \gamma_2] \, I_\lambda[\lambda, \Theta_1] \, d\lambda$ |

FIG. 33

M1.1, M2.1 design

| | | |
|---|---|---|
| Eq. 3401 | | $I_0[\Theta_1] = I_1 \, \eta_{mirror}[11\,\text{nm}, \gamma_1, \gamma_2]$ |
| Eq. 3402 | (spec.) | $\Theta_{1\_max} = 60°$ |
| Eq. 3403 | (spec.) | $\Theta_{1\_min} = 50°$ |
| Eq. 3404 | (spec.) | $l_2[\Theta_{1\_min}] = 50\,\text{mm}$ |
| Eq. 3405 | (spec.) | $\gamma_2[\Theta_{1\_max}] = 15°$ |
| Eq. 3406 | (spec.) | $y_2[\Theta_{1\_max}] = 260\,\text{mm}$ |
| Eq. 3407 | (spec.) | $y_2[\Theta_{1\_min}] = 230\,\text{mm}$ |
| Eq. 3408 | | $c = 102.166\,\text{mm}$ |
| Eq. 3409 | | $I_1 / E_{print} = (269.531\,\text{mm})^2$ |
| Eq. 3410 | | $l_1[\Theta_{1\_min}] = 269.431\,\text{mm}$ |
| Eq. 3411 | | $\Theta_2[\Theta_{1\_min}] = 28.1695°$ |

FIG. 34

M1.2, M2.2 design

| Eq. 3501 | (spec.) | $\Theta_{1\_max} = 47°$ |
|---|---|---|
| Eq. 3502 | (spec.) | $l_2[\Theta_{1\_min}] = 50\,mm$ |
| Eq. 3503 | (spec.) | $\gamma_1[\Theta_{1\_min}] = \gamma_2[\Theta_{1\_min}]$ |
| Eq. 3504 | (spec.) | $I_1/E_{print} = (269.531\,mm)^2$ |
| Eq. 3505 | (spec.) | $y_2[\Theta_{1\_max}] = 224\,mm$ |
| Eq. 3506 | (spec.) | $y_2[\Theta_{1\_min}] = 194\,mm$ |
| Eq. 3507 | | $\Theta_{1\_min} = 37.7916°$ |
| Eq. 3508 | | $c = 63.557\,mm$ |
| Eq. 3509 | | $l_1[\Theta_{1\_min}] = 290.160\,mm$ |
| Eq. 3510 | | $\Theta_2[\Theta_{1\_min}] = 18.8958°$ |

FIG. 35

M1.3, M2.3 design

| Eq. 3601 | (spec.) | $\Theta_{1\_max} = 34.7916°$ |
|---|---|---|
| Eq. 3602 | (spec.) | $l_2[\Theta_{1\_min}] = 70\,mm$ |
| Eq. 3603 | (spec.) | $\gamma_1[\Theta_{1\_min}] = \gamma_2[\Theta_{1\_min}]$ |
| Eq. 3604 | (spec.) | $I_1/E_{print} = (269.531\,mm)^2$ |
| Eq. 3605 | (spec.) | $y_2[\Theta_{1\_max}] = 188\,mm$ |
| Eq. 3606 | (spec.) | $y_2[\Theta_{1\_min}] = 158\,mm$ |
| Eq. 3607 | | $\Theta_{1\_min} = 25.2994°$ |
| Eq. 3608 | | $c = 33.7198\,mm$ |
| Eq. 3609 | | $l_1[\Theta_{1\_min}] = 333.851\,mm$ |
| Eq. 3610 | | $\Theta_2[\Theta_{1\_min}] = 12.6497°$ |

FIG. 36

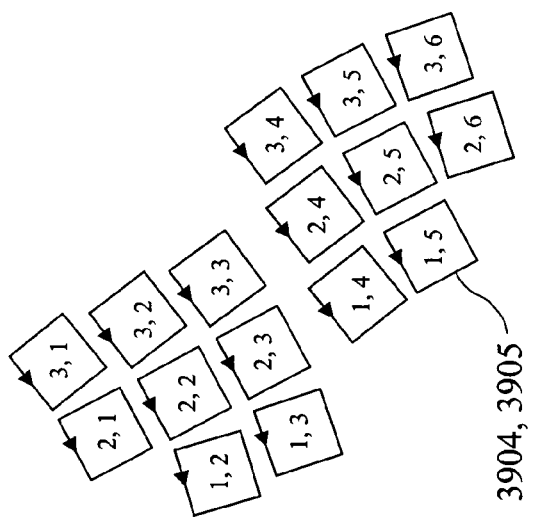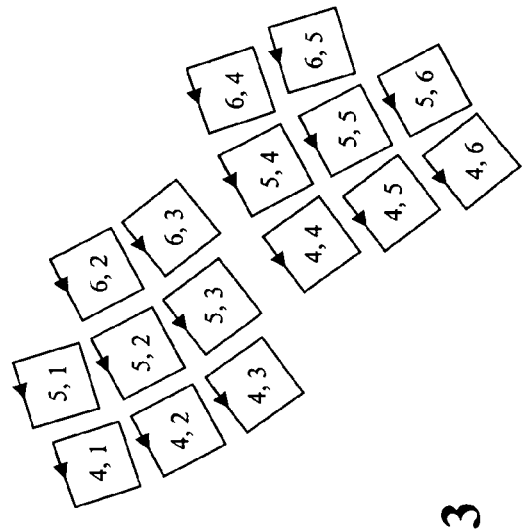
FIG. 43

Subgroup 2, 2 ray coordinates (mm)

| zone: | 1,2 | 1,3 | 2,1 | 2,2 | 2,3 | 3,1 | 3,2 | 3,3 |
|---|---|---|---|---|---|---|---|---|
| P | -61.440338<br>198.718607<br>608.374000 | -77.854626<br>231.245880<br>608.374000 | -78.086366<br>153.253122<br>608.374000 | -94.430024<br>185.329357<br>608.374000 | -110.773682<br>217.405592<br>608.374000 | -107.826121<br>134.005700<br>608.374000 | -124.653006<br>166.510144<br>608.374000 | -141.320046<br>198.908634<br>608.374000 |
| M3 | -61.440338<br>198.718607<br>1106.780763 | -77.854626<br>231.245880<br>985.387327 | -78.086366<br>153.253122<br>1276.460264 | -94.430024<br>185.329357<br>1156.750126 | -110.773682<br>217.405592<br>1037.039987 | -107.826121<br>134.005700<br>1348.292621 | -124.653006<br>166.510144<br>1226.984385 | -141.320046<br>198.908634<br>1106.071575 |
| M4 | -61.440338<br>-309.562894<br>1987.150148 | -77.854626<br>-351.816793<br>1995.281501 | -78.086366<br>-192.874500<br>1875.970891 | -94.430024<br>-234.313986<br>1883.593716 | -110.773682<br>-275.753472<br>1891.216541 | -107.826121<br>-110.443189<br>1771.690517 | -124.653006<br>-152.050076<br>1778.746870 | -141.320046<br>-193.674170<br>1786.044937 |
| M5 | 247.634502<br>-867.390622<br>2457.517836 | 208.041962<br>-867.811703<br>2430.375206 | 305.033965<br>-884.341796<br>2459.025223 | 265.650706<br>-884.198706<br>2431.585072 | 226.267448<br>-884.055616<br>2404.144922 | 324.976273<br>-891.578192<br>2430.353840 | 285.533941<br>-892.368029<br>2402.992719 | 246.092939<br>-892.888980<br>2375.632075 |
| M6 | 263.990679<br>-1021.020840<br>2542.843724 | 224.612453<br>-1021.587846<br>2515.396334 | 322.862358<br>-1038.959636<br>2542.246297 | 283.479100<br>-1038.816546<br>2514.806147 | 244.095842<br>-1038.673457<br>2487.365996 | 344.571761<br>-1047.335442<br>2511.013442 | 304.830218<br>-1047.935903<br>2484.088748 | 265.176070<br>-1048.321065<br>2457.038320 |
| M7 | 204.843718<br>-1296.524552<br>2627.937199 | 165.429740<br>-1297.258088<br>2600.541244 | 271.653651<br>-1277.487345<br>2615.919176 | 232.239673<br>-1277.487345<br>2588.523221 | 192.825695<br>-1277.487345<br>2561.127266 | 299.049606<br>-1259.375460<br>2576.505198 | 259.635628<br>-1258.450139<br>2549.109243 | 220.221650<br>-1257.716603<br>2521.713288 |
| H | 204.843718<br>-1420.192229<br>2627.937199 | 165.429740<br>-1420.192229<br>2600.541244 | 271.653651<br>-1420.192229<br>2615.919176 | 232.239673<br>-1420.192229<br>2588.523221 | 192.825695<br>-1420.192229<br>2561.127266 | 299.049606<br>-1420.192229<br>2576.505198 | 259.635628<br>-1420.192229<br>2549.109243 | 220.221650<br>-1420.192229<br>2521.713288 |

FIG. 44

Subgroup 2, 5 ray coordinates (mm)

| zone: | 1,4 | 1,5 | 2,4 | 2,5 | 2,6 | 3,4 | 3,5 | 3,6 |
|---|---|---|---|---|---|---|---|---|
| P | -134.005700<br>-107.826121<br>608.374000 | -153.253122<br>-78.086366<br>608.374000 | -166.510144<br>-124.653006<br>608.374000 | -185.329357<br>-94.430024<br>608.374000 | -198.718607<br>-61.440338<br>608.374000 | -198.908634<br>-141.320046<br>608.374000 | -217.405592<br>-110.773682<br>608.374000 | -231.245880<br>-77.854626<br>608.374000 |
| M3 | -134.005700<br>-107.826121<br>1524.649949 | -153.253122<br>-78.086366<br>1413.659672 | -166.510144<br>-124.653006<br>1587.448739 | -185.329357<br>-94.430024<br>1474.655034 | -198.718607<br>-61.440338<br>1351.535849 | -198.908634<br>-141.320046<br>1649.650980 | -217.405592<br>-110.773682<br>1535.650396 | -231.245880<br>-77.854626<br>1412.794807 |
| M4 | -134.005700<br>-362.999205<br>1966.622696 | -153.253122<br>-395.460458<br>1963.367724 | -166.510144<br>-281.465904<br>1859.056646 | -185.329357<br>-315.533154<br>1857.616889 | -198.718607<br>-363.130741<br>1874.078955 | -198.908634<br>-200.411892<br>1752.001060 | -217.405592<br>-235.605850<br>1751.866054 | -231.245880<br>-282.403260<br>1767.083434 |
| M5 | 160.454095<br>-894.449254<br>2414.748377 | 123.245947<br>-894.494439<br>2384.159750 | 180.076551<br>-906.996176<br>2386.512011 | 142.477398<br>-907.168815<br>2356.491872 | 101.631627<br>-905.212033<br>2331.169041 | 199.581856<br>-919.619721<br>2358.446574 | 161.708848<br>-919.843192<br>2328.823993 | 121.050442<br>-918.238443<br>2303.228035 |
| M6 | 180.049584<br>-1050.206504<br>2495.407979 | 141.074341<br>-1049.112280<br>2467.380825 | 199.372827<br>-1062.564050<br>2467.608039 | 160.305791<br>-1061.786656<br>2439.712946 | 117.987803<br>-1058.842251<br>2416.494930 | 218.664987<br>-1075.051806<br>2439.852819 | 179.537242<br>-1074.461032<br>2412.045068 | 137.620933<br>-1072.014586<br>2388.249163 |
| M7 | 126.015762<br>-1301.893457<br>2573.145289 | 86.601784<br>-1302.842841<br>2545.749334 | 153.411717<br>-1276.648701<br>2533.731311 | 113.997739<br>-1277.487345<br>2506.335356 | 74.583762<br>-1261.016197<br>2478.939401 | 180.807672<br>-1251.389368<br>2494.317333 | 141.393694<br>-1252.131849<br>2466.921378 | 101.979717<br>-1238.029664<br>2439.525423 |
| H | 126.015762<br>-1420.192229<br>2573.145289 | 86.601784<br>-1420.192229<br>2545.749334 | 153.411717<br>-1420.192229<br>2533.731311 | 113.997739<br>-1420.192229<br>2506.335356 | 74.583762<br>-1420.192229<br>2478.939401 | 180.807672<br>-1420.192229<br>2494.317333 | 141.393694<br>-1420.192229<br>2466.921378 | 101.979717<br>-1420.192229<br>2439.525423 |

FIG. 45

Subgroup 5, 2 ray coordinates (mm)

| zone: | 4,1 | 4,2 | 4,3 | 5,1 | 5,2 | 5,3 | 6,2 | 6,3 |
|---|---|---|---|---|---|---|---|---|
| P | 231.245880 | 217.405592 | 198.908634 | 198.718607 | 185.329357 | 166.510144 | 153.253122 | 134.005700 |
|   | 77.854626 | 110.773682 | 141.320046 | 61.440338 | 94.430024 | 124.653006 | 78.086366 | 107.826121 |
|   | 608.374000 | 608.374000 | 608.374000 | 608.374000 | 608.374000 | 608.374000 | 608.374000 | 608.374000 |
| M3 | 231.245880 | 217.405592 | 198.908634 | 198.718607 | 185.329357 | 166.510144 | 153.253122 | 134.005700 |
|   | 77.854626 | 110.773682 | 141.320046 | 61.440338 | 94.430024 | 124.653006 | 78.086366 | 107.826121 |
|   | 924.322019 | 801.466429 | 687.465846 | 985.580977 | 862.461791 | 749.668086 | 923.457153 | 812.466877 |
| M4 | 231.245880 | 217.405592 | 198.908634 | 198.718607 | 185.329357 | 166.510144 | 153.253122 | 134.005700 |
|   | -637.013399 | -683.810809 | -719.004767 | -556.285919 | -603.883506 | -637.950755 | -523.956202 | -556.417454 |
|   | 2162.509759 | 2177.727139 | 2177.592134 | 2055.514238 | 2071.976304 | 2070.536547 | 1966.225469 | 1962.970498 |
| M5 | 367.262643 | 326.597708 | 288.731229 | 386.683869 | 345.829158 | 308.238945 | 365.060608 | 327.865425 |
|   | -882.500614 | -880.884081 | -881.119336 | -895.531375 | -893.558457 | -893.747232 | -906.232834 | -906.301418 |
|   | 2369.507812 | 2343.901918 | 2314.289274 | 2341.570475 | 2316.234039 | 2286.227506 | 2288.566161 | 2257.997264 |
| M6 | 383.833133 | 344.426101 | 307.814361 | 403.040046 | 363.657552 | 327.535222 | 382.889002 | 347.460913 |
|   | -1036.276757 | -1035.501922 | -1036.551421 | -1049.161593 | -1048.176298 | -1049.315106 | -1060.850675 | -1062.058668 |
|   | 2454.528940 | 2427.122992 | 2395.695518 | 2426.896364 | 2399.455114 | 2367.323534 | 2371.787235 | 2338.656867 |
| M7 | 326.445561 | 287.031583 | 247.617605 | 353.841516 | 314.427538 | 275.013560 | 341.823493 | 302.409515 |
|   | -1303.585323 | -1302.842841 | -1316.945026 | -1278.325989 | -1277.487345 | -1293.958493 | -1252.131849 | -1271.905922 |
|   | 2537.091220 | 2509.695265 | 2482.299310 | 2497.677243 | 2470.281288 | 2442.885332 | 2430.867310 | 2403.471355 |
| H | 326.445561 | 287.031583 | 247.617605 | 353.841516 | 314.427538 | 275.013560 | 341.823493 | 302.409515 |
|   | -1420.192229 | -1420.192229 | -1420.192229 | -1420.192229 | -1420.192229 | -1420.192229 | -1420.192229 | -1420.192229 |
|   | 2537.091220 | 2509.695265 | 2482.299310 | 2497.677243 | 2470.281288 | 2442.885332 | 2430.867310 | 2403.471355 |

FIG. 46

Subgroup 5, 5 ray coordinates (mm)

| zone: | 4,4 | 4,5 | 4,6 | 5,4 | 5,5 | 5,6 | 6,4 | 6,5 |
|---|---|---|---|---|---|---|---|---|
| P | 141.320046<br>-198.908634<br>608.374000 | 124.653006<br>-166.510144<br>608.374000 | 107.826121<br>-134.005700<br>608.374000 | 110.773682<br>-217.405592<br>608.374000 | 94.430024<br>-185.329357<br>608.374000 | 78.086366<br>-153.253122<br>608.374000 | 77.854626<br>-231.245880<br>608.374000 | 61.440338<br>-198.718607<br>608.374000 |
| M3 | 141.320046<br>-198.908634<br>1231.045251 | 124.653006<br>-166.510144<br>1110.132441 | 107.826121<br>-134.005700<br>988.824205 | 110.773682<br>-217.405592<br>1300.076839 | 94.430024<br>-185.329357<br>1180.366700 | 78.086366<br>-153.253122<br>1060.656562 | 77.854626<br>-231.245880<br>1351.729499 | 61.440338<br>-198.718607<br>1230.336063 |
| M4 | 141.320046<br>-725.742489<br>2143.548256 | 124.653006<br>-767.366584<br>2150.846323 | 107.826121<br>-808.973471<br>2157.902677 | 110.773682<br>-643.663188<br>2038.376652 | 94.430024<br>-685.102674<br>2045.999477 | 78.086366<br>-726.542159<br>2053.622302 | 77.854626<br>-567.599867<br>1934.311692 | 61.440338<br>-609.853766<br>1942.443046 |
| M5 | 242.220146<br>-907.850077<br>2297.103773 | 202.781555<br>-908.375380<br>2269.746797 | 163.343248<br>-909.172480<br>2242.391801 | 262.039108<br>-916.671657<br>2268.580989 | 222.655849<br>-916.528567<br>2241.140839 | 183.272591<br>-916.385477<br>2213.700688 | 280.271123<br>-932.927354<br>2242.360642 | 240.680994<br>-933.352786<br>2215.221681 |
| M6 | 261.303278<br>-1063.282162<br>2378.510018 | 222.077832<br>-1063.943254<br>2350.842826 | 182.938736<br>-1064.929730<br>2323.051404 | 279.867501<br>-1071.289498<br>2351.802064 | 240.484243<br>-1071.146408<br>2324.361913 | 201.100985<br>-1071.003318<br>2296.921763 | 296.841613<br>-1086.703497<br>2327.381770 | 257.037170<br>-1086.983004<br>2300.547570 |
| M7 | 208.203627<br>-1310.617791<br>2454.903355 | 168.789649<br>-1312.157056<br>2427.507400 | 129.375672<br>-1314.423919<br>2400.111445 | 235.599582<br>-1277.487345<br>2388.093422 | 196.185604<br>-1277.487345<br>2388.093422 | 156.771627<br>-1277.487345<br>2360.697467 | 262.995537<br>-1244.356899<br>2376.075400 | 223.581560<br>-1242.817635<br>2348.679445 |
| H | 208.203627<br>-1420.192229<br>2454.903355 | 168.789649<br>-1420.192229<br>2427.507400 | 129.375672<br>-1420.192229<br>2400.111445 | 235.599582<br>-1420.192229<br>2415.489377 | 196.185604<br>-1420.192229<br>2388.093422 | 156.771627<br>-1420.192229<br>2360.697467 | 262.995537<br>-1420.192229<br>2376.075400 | 223.581560<br>-1420.192229<br>2348.679445 |

FIG. 47

| Eq. 4901 | $\delta = 0.0005$ rad |
| Eq. 4902 | $s = 3000$ mm |
| Eq. 4903 | $w = s\delta = 1.5$ mm |

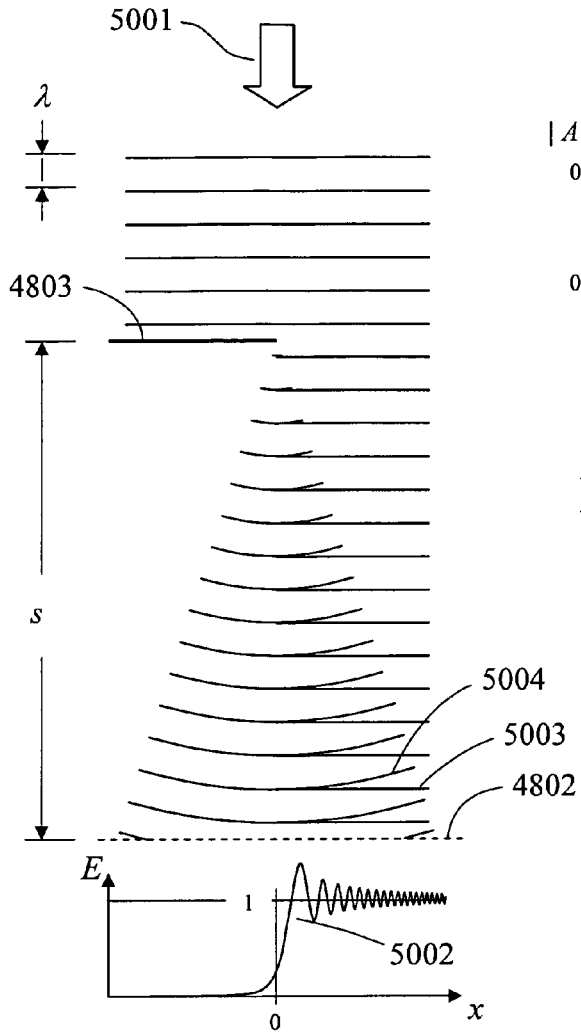
FIG. 50
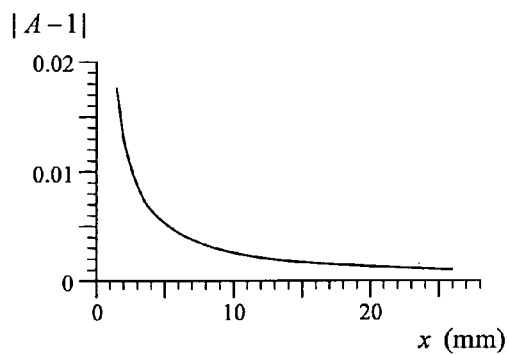
FIG. 52
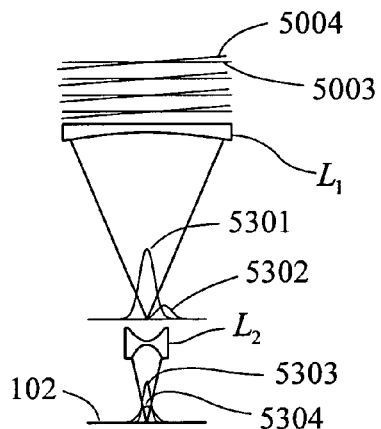
FIG. 53
| Eq. 5101 | $\lambda = 11$ nm |
|---|---|
| Eq. 5102 | $s = 3000$ mm |
| Eq. 5103 | $E[x] \propto |A[x]|^2$ |
| Eq. 5104 | $A[x] = \frac{1}{2}\left(1 + (1-i)\mathcal{C}[\sqrt{\frac{2}{\lambda s}}x] + (1+i)\mathcal{S}[\sqrt{\frac{2}{\lambda s}}x]\right)$ $\cong 1 - \frac{1+i}{2\pi\sqrt{\frac{2}{\lambda s}}x}\exp[i\pi\frac{x^2}{\lambda s}]$ $(x \gg \sqrt{\lambda s} = 0.18\,\text{mm})$ |
FIG. 51

| Eq. 5501 | $t[x] = \begin{cases} 0, & x \leq 0 \\ x/a - \sin[2\pi x/a]/(2\pi), & 0 \leq x \leq a \\ 1, & x \geq a \end{cases}$ |
|---|---|
| Eq. 5502 | $E_{apod}[x] \propto |A_{apod}[x]|^2$ |
| Eq. 5503 | $A_{apod}[x] = \int_0^a A[x-x_0]\, t'[x_0]\, dx_0$ |

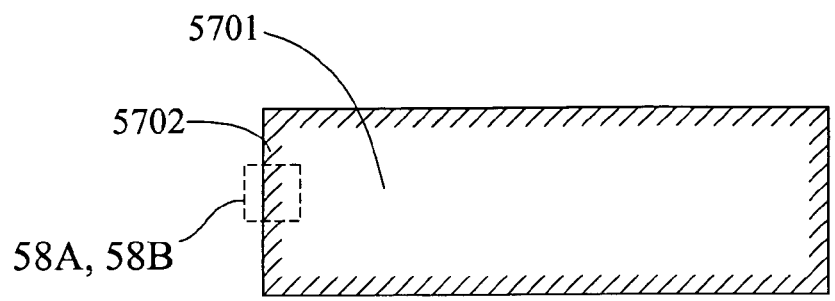
FIG. 57
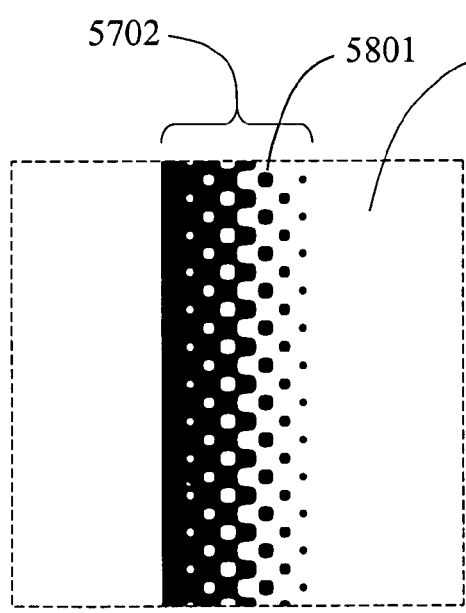 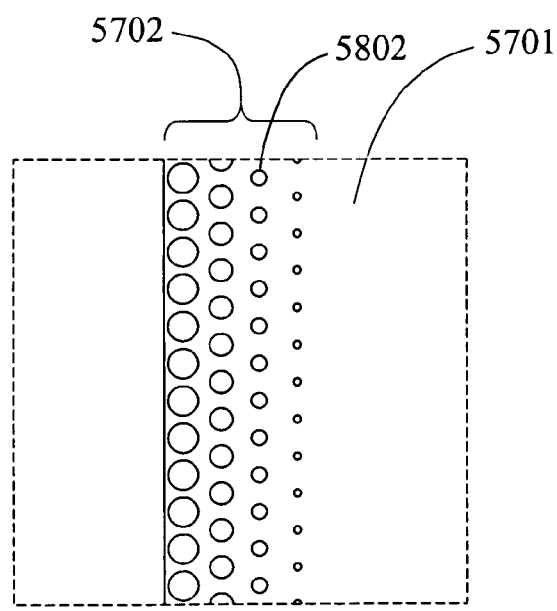
FIG. 58A  FIG. 58B

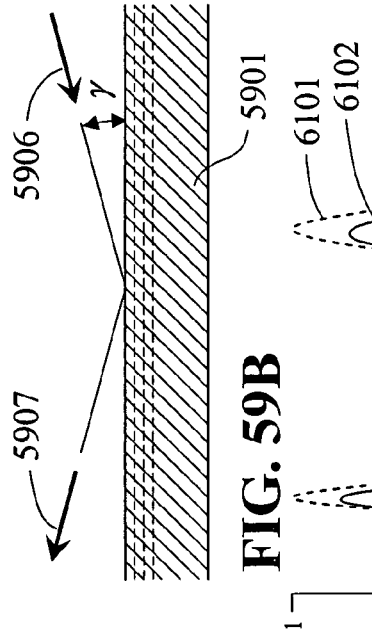
FIG. 59A
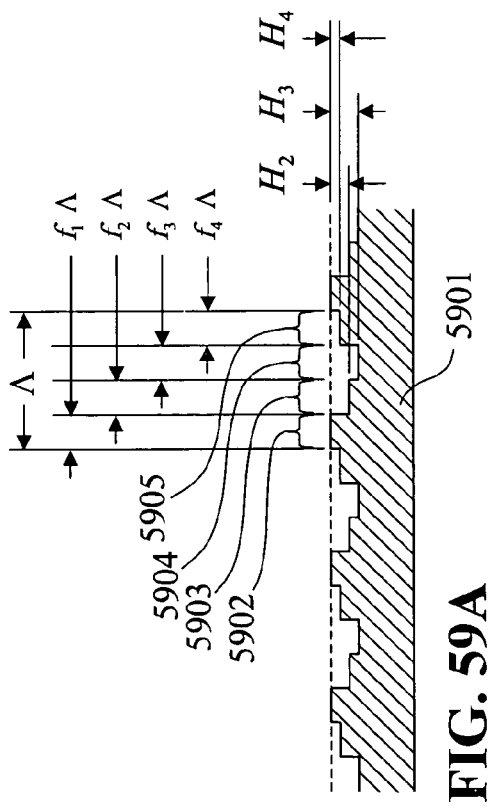
FIG. 59B
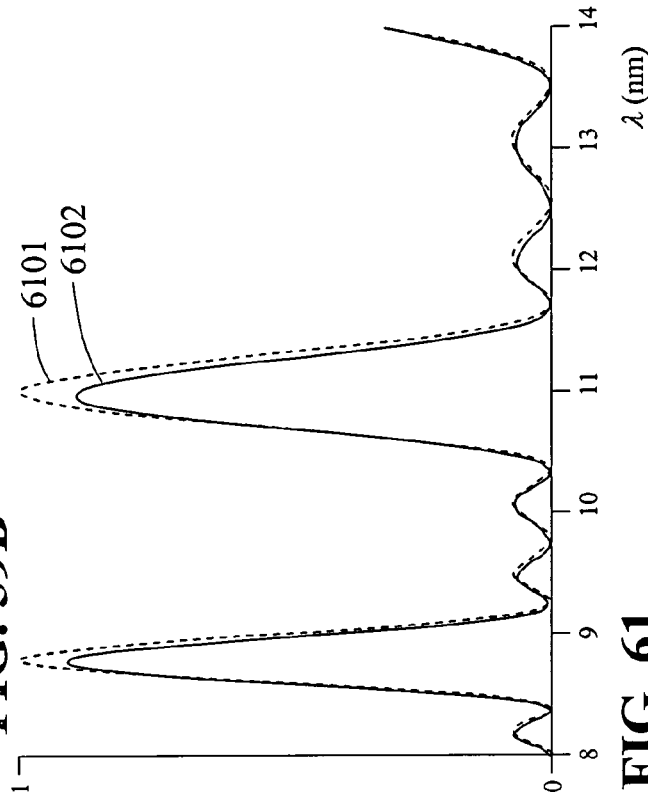
FIG. 61
| Eq. 6001 | $\gamma = 15°$ |
| Eq. 6002 | $\lambda_{design} = 11\,nm$ |
| Eq. 6003 | $\Lambda = 1.5\,\mu m$ |
| Eq. 6004 | $h = \dfrac{\lambda_{design}}{2\sin\gamma} = 21.25\,nm$ |
| Eq. 6005 | $H_j = m_j\,h$ |
| Eq's. 6006 | $m_1 = 0,\ m_2 = 8,\ m_3 = 12,\ m_4 = 4$ |
| Eq's. 6007 | $f_1 = f_2 = f_3 = f_4 = 0.25$ |
| Eq. 6008 | $R_{rel} = \dfrac{R_{grating}}{R_{flat}} \cong \left|\sum_j f_j \exp[i2\pi\, m_j\, \lambda_{design}/\lambda]\right|^2$ |
FIG. 60

MASKLESS, MICROLENS EUV LITHOGRAPHY SYSTEM WITH GRAZING-INCIDENCE ILLUMINATION OPTICS

CROSS-REFERENCE TO RELATED APPLICATION

This application claims priority from U.S. Provisional Patent Application No. 60/527,106, filed Dec. 4, 2003, for "Maskless, Microlens EUV Lithography System with Grazing-Incidence Illumination Optics", the entire disclosure of which is incorporated by reference.

BACKGROUND OF THE INVENTION

U.S. Pat. No. 6,498,685 (Ref. 1, incorporated herein by reference) disclosed an EUV lithography system comprising a xenon LPP (laser-produced plasma) illumination source, reflective illumination optics, microlens arrays, and microshutter SLM's (spatial light modulators), for achieving high-resolution, maskless printing. The illumination optics in the specific embodiment employed two Mo/Be (molybdenum/beryllium) multilayer mirrors for collimating the illumination. Mo/Be mirrors have a reflectance peak at 11.4 nm, which is well-matched to the xenon emission peak at 11 nm. Other prior-art EUV systems currently under commercial development (projection systems) use Mo/Si (molybdenum/silicon) mirrors, which are not as well-matched to the xenon source. (The Mo/Si reflectance peak is at 13.4 nm.) But Mo/Si mirrors are nevertheless preferred over Mo/Be due to the high toxicity of beryllium. The maskless system could also be designed to work with Mo/Si mirrors, but the efficiency of any system employing multilayer mirrors operating at near-normal incidence is significantly limited by the narrow bandpass of such mirrors (e.g., 0.27 nm FWHM for a Mo/Be mirror, and 0.56 nm FWHM for Mo/Si). As a result of this efficiency loss, EUV projection lithography systems are anticipated to have very high illumination power requirements, e.g., 400 W hemispherical source emittance in a 2% wavelength band at 13.5 nm. (This is for a throughput of 120 300-mm wafers per hour, Ref. 2.)

Prior-art EUV systems employing mask projection optics require near-normal-incidence mirrors, at least in the projection optics, in order to achieve high-resolution imaging of the mask onto the printing surface. But the collection optics need not necessarily use near-normal-incidence optics. For example, Cymer Corp. has been developing a system that uses a grazing-incidence collimator mirror (Refs. 3 and 4), and a similar system is disclosed in Ref. 5. However, the primary motivations for using a grazing-incidence mirror in this context are that its tolerance to source-generated debris is much better than Mo/Si mirrors and it is comparatively inexpensive. Improved optical efficiency is not a major consideration because the efficiency is fundamentally limited by the narrow bandpass of the projection optics mirrors.

SUMMARY OF THE INVENTION

The present invention improves upon the maskless EUV system disclosed in Ref. 1 by eliminating the use of near-normal-incidence mirrors and relying entirely on grazing-incidence mirrors in the illumination optics. For the purposes of this disclosure, a "grazing-incidence" mirror is defined as a mirror that operates at a grazing angle of less than 25 degrees (i.e., an incident angle to the normal greater than 65 degrees).

In one aspect of the invention, a printing exposure apparatus comprises a radiation source, illumination optics consisting of one or more grazing-incidence mirrors, a modulator mechanism, a microlens array (ruthenium elements in a specific embodiment), and a scanning mechanism. The illumination optics convey radiation from the radiation source to the microlens array, and the microlens array focuses the radiation onto a corresponding array of focal points on a printing surface. The modulator mechanism modulates the radiation, whereby the focal points' exposure intensity levels are controllably varied, and the scanning mechanism establishes relative motion between the printing surface and the microlens array in synchronization with the modulator mechanism as the printing surface is exposed. This forms a synthesized, high-resolution exposure image on the printing surface.

In a specific embodiment, the mirrors are preferably all ruthenium elements operating at a grazing angle of approximately 15° or less. As a result of using grazing-incidence illumination optics, the spectral bandwidth of the exposure radiation on the microlens array is not significantly limited by mirror reflections. For the purposes of this disclosure, "not significantly limited . . . " is defined to mean that the illumination radiation on the microlens arrays has a FWHM spectral bandwidth of at least 2 nm.) In this embodiment, each of the mirrors preferably has a reflection efficiency of at least 82% (at wavelength 11 nm.

In a specific embodiment, the source illumination is preferably collected by collimating collection optics, the collimated output from which is subdivided and distributed by distribution optics consisting of flat, grazing-incidence fold mirrors to illuminate one or more wafer print modules. In this embodiment, there are two print modules, each comprising 32 printheads covering a 300-mm wafer, and each printhead comprises 3,629,988 microlens apertures and microshutters (embodying the modulator mechanism) distributed over a 24-mm square printhead aperture.

In some embodiments, at least one mirror is apodized to minimize edge diffraction effects, which may be accomplished by a diffraction grating that performs the apodization disposed on a periphery of the mirror's surface. Similarly, in some embodiments, at least one mirror has a reflectance characteristic that is configured to improve illumination uniformity on the microlens array, which may be accomplished by a diffraction grating structure disposed on the mirror surface. Further, in some embodiments, at least one mirror has disposed on a surface thereof a diffraction grating structure that performs a spectral-filtering function.

In view of the possibility of embodiments such as the above-mentioned, it should be emphasized that for the purposes of this disclosure, a statement that the illumination optics, or a portion thereof, consists of one or more grazing-incidence mirrors (or at least one grazing-incidence mirror should not be seen as excluding the possibility of a coating, grating, or other structure on a surface or portion of the mirror surface.

A further understanding of the nature and advantages of the present invention may be realized by reference to the remaining portions of the specification and the drawings.

BRIEF DESCRIPTION OF THE DRAWINGS

FIGS. 9–11 illustrate print quality metrics for a 50-nm contact hole pattern;

FIG. 12 tabulates Zernike distortion functions and surface tolerance factors;

FIGS. 22A and 22B are a plan view of a printhead;

FIG. 23 is a plan view of a wafer print module;

FIGS. 24–26 show details of the microlens layout and the raster scan pattern;

FIG. 27 tabulates calculations for printing throughput;

FIG. 28 tabulates calculations for the EUV power requirement;

FIG. 31 tabulates the defining equations for the collection optics geometry;

FIGS. 32 and 33 outline derivation steps for several of the equations in FIG. 31;

FIGS. 34–36 tabulate design data and assumptions for the collection optics;

FIGS. 40–43 show several views of the distribution optics;

FIGS. 44–47 tabulate ray coordinate data for the distribution optics;

FIGS. 50–53 outline the analysis of diffraction effects at the edge of an illumination zone;

FIG. 57 illustrates an apodized mirror;

FIGS. 58A and 58B illustrate two alternative apodization mechanisms;

FIGS. 59A, 59B, 60, and 61 outline the analysis of a spectral-filter grating formed on a mirror surface.

DESCRIPTION OF SPECIFIC EMBODIMENTS

Table of Contents

The following Table of Contents is provided to aid the reader in referring to specific portions of the specification.
  Illumination Source
  Microlens Design
  Microlens Optical Performance
  Print Quality
  Microlens Manufacture and Alternative Designs
  Printhead and Wafer Module Configuration
  Printing Throughput and EUV Power Requirements
  Collection Optics
  Distribution Optics
  Edge Effects and Apodization
  Efficiency Tuning
  Spectral Filtering
  Control System Architecture
  References
  Conclusion Illumination Source The illumination source is preferably a xenon LPP source (Refs. 2 and 6), which is preferred over alternative sources because of its small source size (<100 micron). A much larger source would degrade optical resolution. Also, the LPP is a relatively "clean" source in terms of debris generation. (Plasma sources other than xenon might also be considered. For example, krypton has a couple of spectral peaks near 10 nm that could be used for EUV lithography, Ref. 3.) The source is assumed to operate at a 10 kHz repetition rate, and the SLM microshutters operate in synchronization with the source at a 10 kHz frame rate. More specifically, the source may be a liquid-jet xenon LPP source comprising a vertical xenon filament flowing across a horizontally-directed laser beam. A representative LPP output power requirement is approximately 93 W hemispherical source emission in the wavelength range 10–12 nm.

Microlens Design

Figures 1A, 1B, 1C:
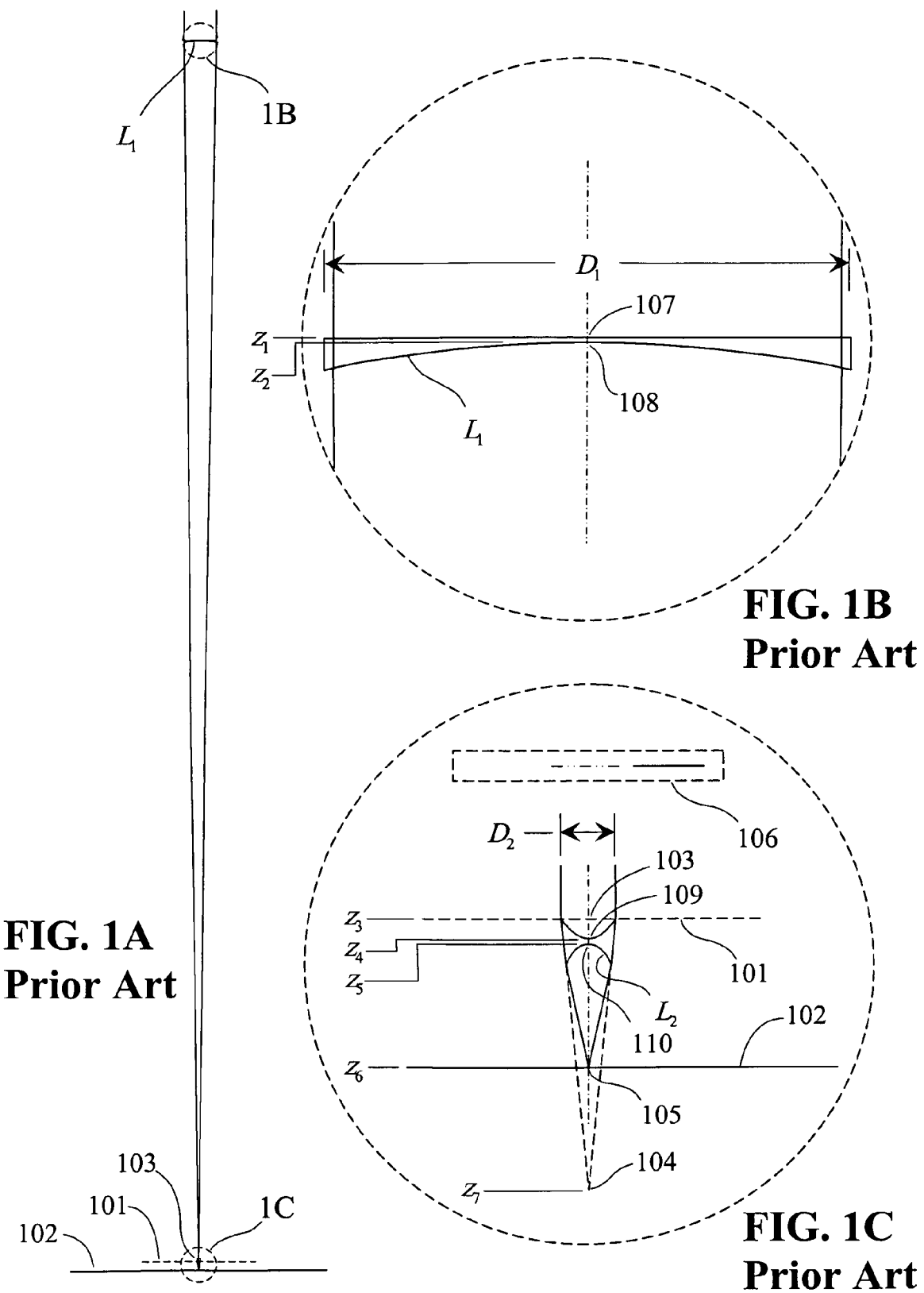
FIGS. 1A–1C are cross-sectional views of the microlens configuration.

FIGS. 1A–1C illustrate the microlens design in a specific embodiment. This microlens embodiment is similar to the Ref. 1 design as to overall geometry, and as such the figures are labeled "Prior Art." However, the dimensions of the specific microlenses are different and lens material is preferably ruthenium. The Ref. 1 system uses molybdenum microlenses. Molybdenum has somewhat better transparency at 11 nm, but ruthenium has better optical contrast. Other lens materials such as rhodium may be more appropriate for some applications. In a preferred embodiment, the first-stage microlens aperture diameter is 10 microns and the fill factor is 50% (compared to 5 microns and 63%, respectively, in Ref. 1), and the microlens substrate thickness (i.e., the first-stage microlens focal length) is 385 mm (vs. 171 mm for Ref. 1). The first- and second-stage microlens center thicknesses are 100 nm (vs. 20 nm in Ref. 1).

As will be described further below, the lenses are designed to provide a wafer-plane focus spot with a FWHM (full width at half maximum) of 42 nm (compared to 58 nm for the Ref. 1 system). The design comprises meniscus, refractive lens elements, and is configured to be relatively simple and easy to manufacture. Alternative, more complex designs (multi-element lenses, Bragg diffraction lenses, phase Fresnel lenses) could exhibit much better optical resolution and efficiency, but may be more difficult to manufacture. The specific embodiment uses two-stage microlens arrays, but alternative embodiments may use three or more stages (e.g., see Ref. 1, FIG. 16) or may use single-stage microlens arrays (Ref. 7).

The first-stage microlens $L_1$ focuses incident EUV radiation onto focal plane 101 proximate to wafer surface 102 (FIG. 1A). An enlarged view of $L_1$ is shown in FIG. 1B, and FIG. 1C shows an enlarged view of the focal region. The second-stage microlens $L_2$ is located with its entrance aperture centered at or near the $L_1$ focal point 103 on focal plane 101. (Although the lenses are focusing elements, they have a meniscus form because the refractive index of ruthenium is less than 1 at EUV wavelengths.) The top surface of $L_2$ is designed to focus collimated incident radiation toward virtual focus 104, and the bottom surface further focuses the radiation toward focal point 105 on surface 102. A microshutter 106 proximate to $L_2$ modulates the beam intensity at focal point 105.

Figures 2, 4, 5, 8:
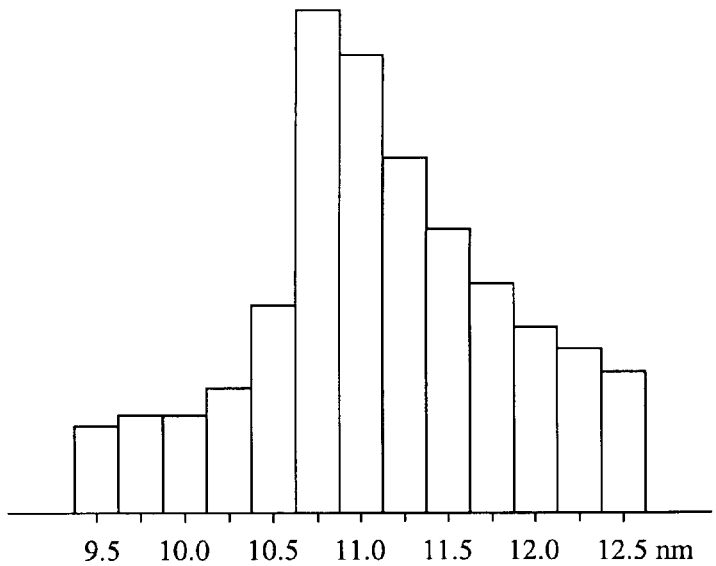
FIG. 2 tabulates design data for the FIG. 1 configuration.
FIG. 4 tabulates optical constants for ruthenium and the xenon plasma intensity as a function of wavelength.
FIG. 5 illustrates the approximate xenon plasma spectrum.
FIG. 8 tabulates the focus spot's FWHM under several simulation conditions.

Microlens dimensional data is tabulated in FIG. 2. $D_1$ and $D_2$ are the aperture diameters of $L_1$ and $L_2$, respectively. The "z" quantities are vertical height coordinates of various design points relative to the wafer, as follows:

$z_1$: $L_1$ top-surface vertex 107 (FIG. 1B)
$z_2$: $L_1$ bottom-surface vertex 108 (FIG. 1B)
$z_3$: $L_1$ focal plane 101 (FIGS. 1A, 1C)
$Z_4$: $L_2$ top-surface vertex 109 (FIG. 1C)
$z_5$: $L_2$ bottom-surface vertex 110 (FIG. 1C)
$z_6$: wafer surface 102 (FIGS. 1A, 1C)
$z_7$: $L_2$ top-surface virtual focus 104 (FIG. 1C)

The microlens dimensional scale is chosen to balance several competing design objectives. From the standpoint of optical performance, a smaller lens scale would be preferred for a variety of reasons:

(1) Smaller lenses would be thinner at the edge and hence less absorbing, resulting in improved optical efficiency.
(2) The $L_2$ transmittance would improve most near the edge of the lens and would thus have the effect of increasing the numerical aperture, resulting in improved optical resolution.
(3) The effects of chromatic dispersion and of the extended source size scale in proportion to lens focal length, so these factors would be less significant with smaller lenses.
(4) With smaller lenses the total number of lenses would be greater, and hence printing throughput would increase.
(5) The positional range of the SLM shutters scales with the lens dimensions.

On the other hand, several competing design factors weight against small lenses:

(1) Smaller lenses may be more difficult to manufacture.
(2) A smaller lens scale would result in a shorter working distance between the printhead and the wafer.
(3) With smaller lenses, the printheads would be thinner, more flexible and fragile.

The design illustrated in FIGS. 1A–1C and 2 is an estimated best compromise between the above factors. The design was developed by the following procedure: The $L_1$ and $L_2$ aperture dimensions and center thickness were predetermined, and the $L_2$ design was constrained to evenly distribute its optical power between the top and bottom $L_2$ surfaces (i.e., the paraxial wavefront curvature difference across the top surface equals the difference across the bottom surface). The $L_2$ focal length was selected to achieve a 40-nm point-spread function FWHM at wavelength 11 nm, and subject to this constraint the $L_1$ focal length was selected to approximately optimize optical efficiency.

The small working distance (about 2 micron) between the bottom $L_2$ surface and the wafer creates concerns about surface contamination or possible damage from particle contact. The lens surface should preferably have a cleanable, damage-resistant coating similar to coatings used for thin-film heads. For example, NanoFilm Technologies (Ref. 8) produces a DLC/Si coating for such applications. The coating is 3 nm thick and has ±5% uniformity over large deposition areas. The EUV transmission loss of such a film would be only several percent. Carbon buildup on the lens could be periodically cleaned by methods similar to those used for EUV multilayer mirrors (e.g., atomic hydrogen cleaning, Ref. 9).

Microlens Optical Performance

Figure 3:
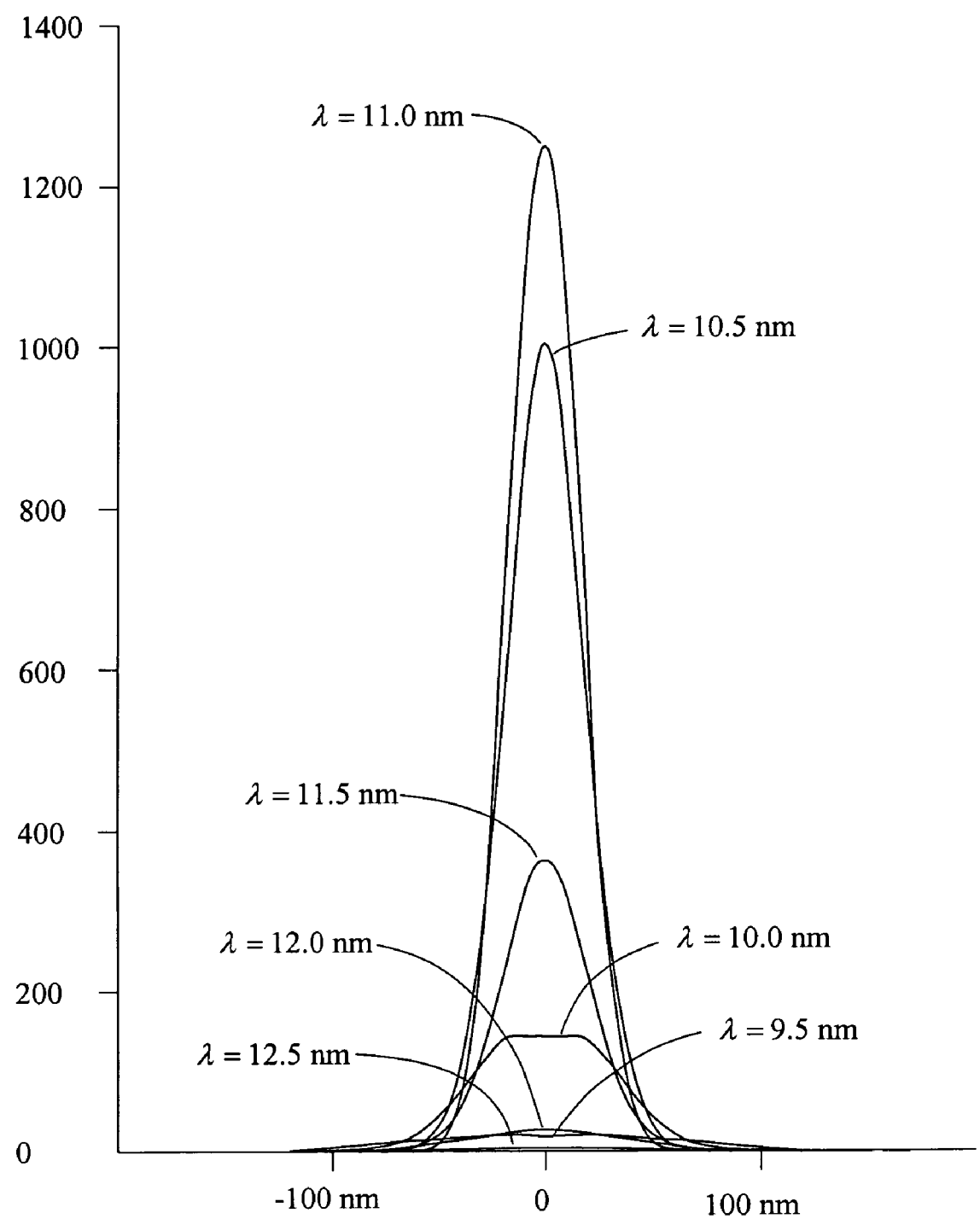
FIG. 3 illustrates the wafer-plane focus spot's intensity cross-section for several different wavelengths.

FIG. 3 illustrates the microlens monochromatic point spread function (PSF) for several wavelengths. The horizontal axis represents position on the wafer plane, and the vertical axis represents power flux density, assuming unit flux density incident on $L_1$. The PSF curves are labeled with the corresponding wavelengths ($\lambda$). The energy level falls off for wavelengths shorter or longer than the 11 nm design wavelength for two reasons: First, the chromatic dispersion in $L_1$, combined with the spatial filtering action of the $L_2$ aperture, tends to filter out short and long wavelengths. Second, long wavelengths are more strongly absorbed by ruthenium. The data tabulated in FIG. 4 illustrates these factors. The second and third columns of FIG. 4 tabulate ruthenium's refractive index contrast, 1−N, and absorption factor K, as a function of wavelength. (The complex refractive index is N+iK.) The refractive index contrast varies by a factor of 2.1 over a 3 nm wavelength band centered at 11 nm. The bulk absorption of ruthenium, which varies exponentially with K/wavelength, increases significantly toward the longer wavelengths.

The microlenses' spectral filtering effect is augmented by the LPP's emission spectrum, which is sharply peaked near 11 nm. For purposes of the present design, the xenon LPP spectrum is assumed to have the form tabulated in column 4 of FIG. 4 ("Xe intensity") and illustrated in FIG. 5. (See also FIG. 2 in Ref. 2.) The wavelength range 9.375–12.625 nm is divided into 13 intervals of width 0.25 nm, and the proportion of LPP emission energy in each interval is assumed to have the value tabulated in FIG. 4. (In practice the relative energy content of the short wavelengths would be somewhat reduced by the mirrors' reflectance spectrum, although this effect is neglected here.)

The wafer-plane PSF size is affected by the LPP source spectrum, and also by the source size. The source is not imaged directly onto the wafer, but is rather imaged by $L_1$ onto the $L_2$ aperture. Consequently, optical resolution is not very sensitive to source size, but if the source is excessively large the spatial filtering action of the $L_2$ aperture on off-axis source points will tend to broaden the PSF and reduce optical efficiency. For the present design, the collimated source size at the $L_1$ entrance aperture is assumed to be 0.5 mrad (milliradians). (The collection optics achieves 0.5 mrad collimation with a 100-micron plasma source.)

Image resolution is also strongly influenced by image digitization. A typical exposure pattern, such as a line or contact hole, is formed as a superposition of overlapping exposure spots centered at the points of a square printing grid. The number of spots overlapping a typical image point should preferably be great enough that a single defective pixel will not significantly affect the printed image. This implies that the dot density should be considerably higher than the optical resolution limit. On the other hand, an excessively high dot density will adversely impact printing throughput.

Figure 6:
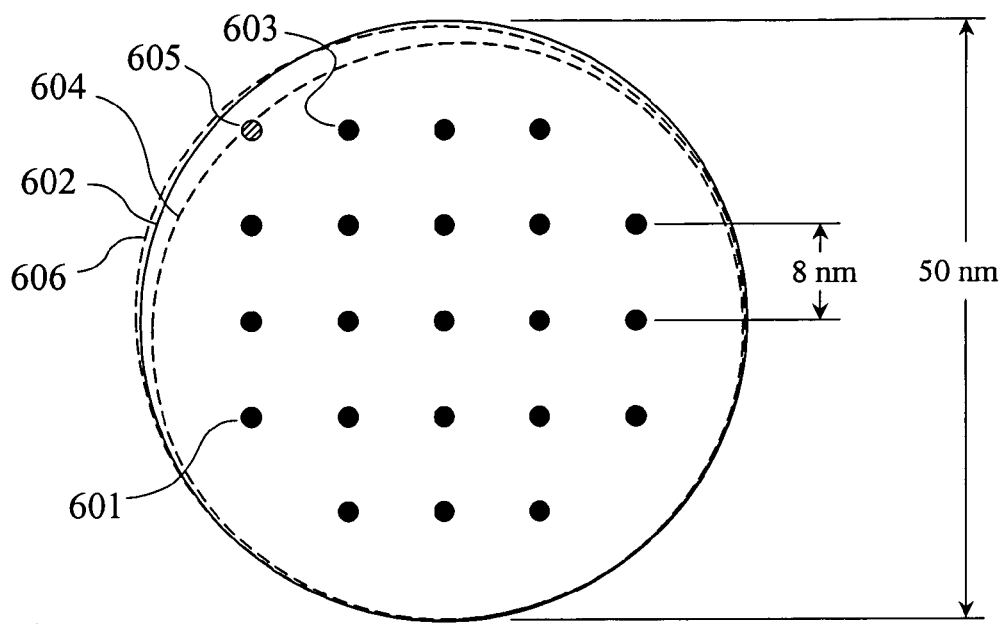
FIG. 6 illustrates a 21-point exposure pattern, e.g., for a contact hole.
Figure 7:
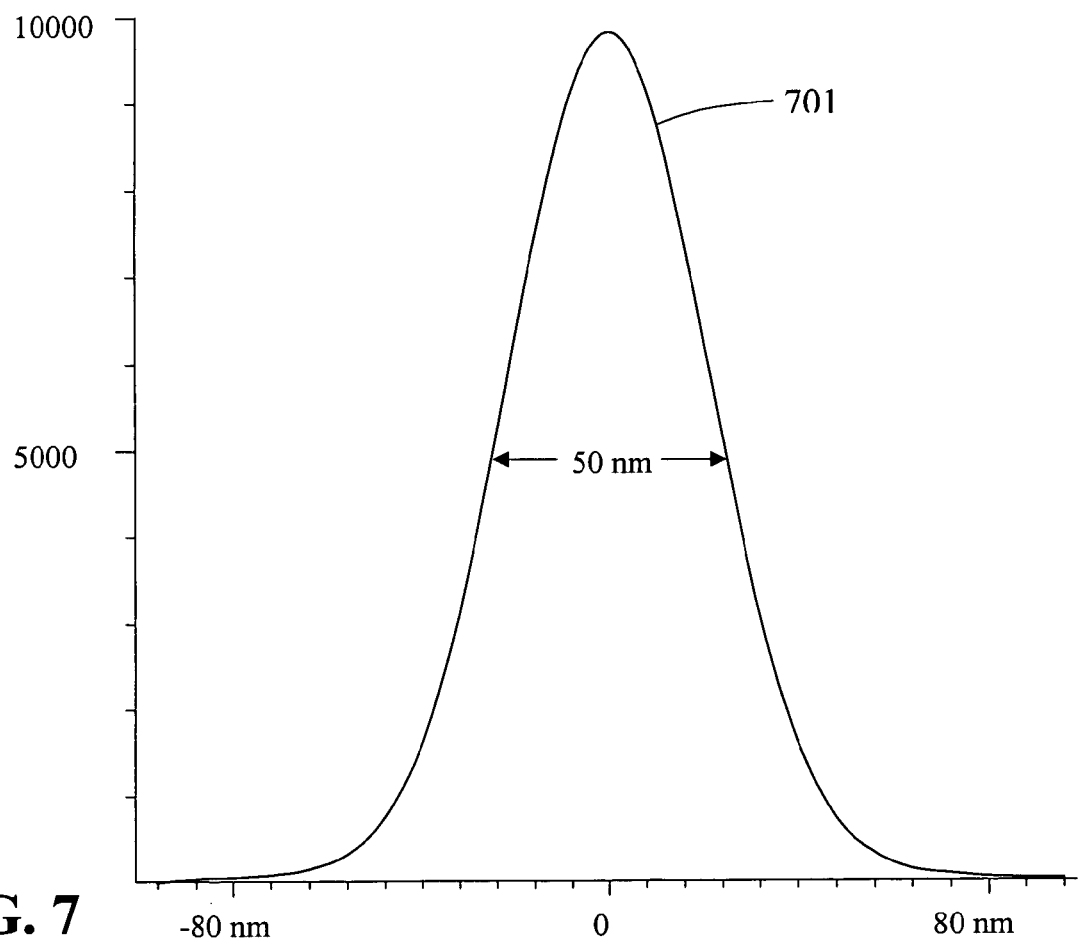
FIG. 7 illustrates the 21-point exposure pattern's energy flux cross-section.

An 8-nm printing grid step is assumed for the present design. (By comparison, the optical resolution limit is 26 nm.) FIG. 6 illustrates an example of an 8-nm grid pattern that could be used to print a contact hole. There are 21 exposure points (indicated by small, solid dots, e.g., dot 601) distributed on a 5-by-5 grid with the corner points omitted. FIG. 7 illustrates a cross-section of the 21-point exposure profile 701, which has a 50-nm FWHM, and FIG. 6 illustrates the exposure contour 602 at the 50% level. FIG. 8 tabulates the FWHM for several types of exposure spots: With an ideal monochromatic, point illumination source the PSF has the form illustrated by the "11 nm" curve in FIG. 3, which has a computed FWHM of 40.01 nm. With a point source and the assumed xenon LPP spectrum (FIG. 5) the FWHM is 41.57 nm. Including the 0.5 mrad source extent increases the FWHM just slightly to 41.72 nm. Finally, taking into account the source size and spectrum, the 21-point exposure of FIGS. 6 and 7 has a FWHM of 49.72 nm.

The horizontal axis in FIG. 7 represents position on the wafer plane, and the vertical axis represents the wafer-plane energy flux density (integrated over the 3.25-nm spectral band of FIG. 5, and summed over the 21 laser pulses), assuming unit flux density (per laser pulse) incident on $L_1$. If the resist exposure threshold is 5 mJ/cm$^2$, the actual incident flux could be chosen so that the peak level of curve 701 (approximately 10000) corresponds to 10 mJ/cm$^2$ (i.e., the incident flux on $L_1$ is approximately (10 mJ/cm$^2$)/10000=1 µJ/cm$^2$ per pulse). In this case the 50% contour in FIG. 6 would correspond to the 5 mJ/cm$^2$ threshold and the exposure pattern would produce a 50-nm contact hole.

As described in Ref. 1, the scan pattern is designed so that the exposure spots generated by any one microlens are widely spaced and do not overlap significantly. This ensures that printing defects will not be closely clustered, and therefore will not significantly affect the printed pattern. For example, FIG. 6 illustrates the effect of a single defective pixel. If point 603 is unexposed (e.g., due to a stuck microshutter), the exposure contour has a slightly distorted form 604. (Other exposure points covered by the defective pixel would be sufficiently far from point 603 that they do not significantly affect the printed image near the missing point.) The resulting image error, defined as the maximum distance from any point on contour 604 to the nearest point on contour 602, is 2.1 nm. The error can be significantly reduced by exposing a nearby point. For example, if point 605 is exposed to compensate for unexposed point 603 the printed image has the form represented by contour 606, and the image error is reduced to 0.6 nm.

Print Quality

Figure 9:
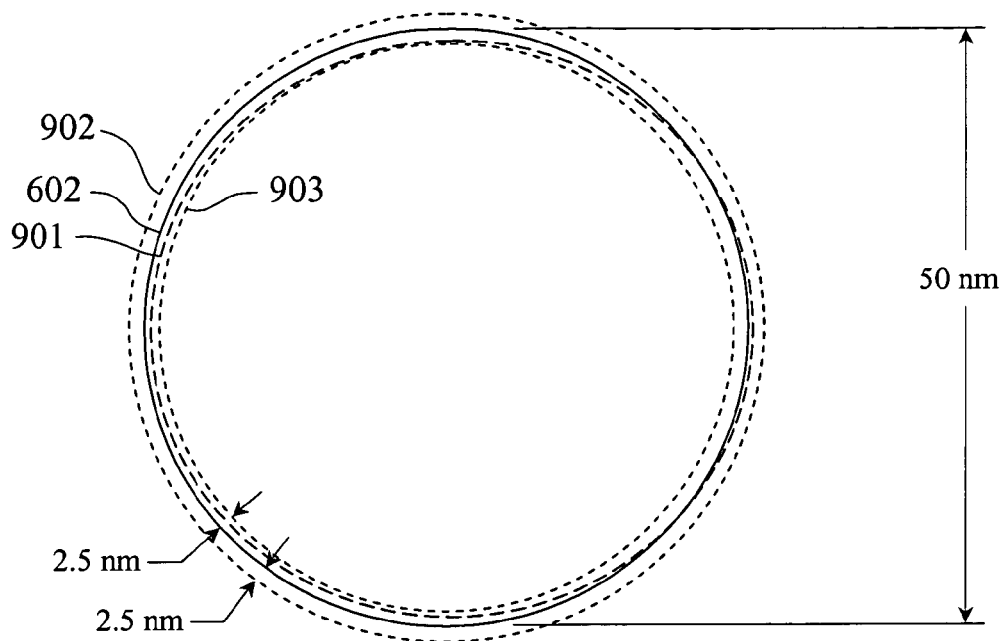
Figure 10:
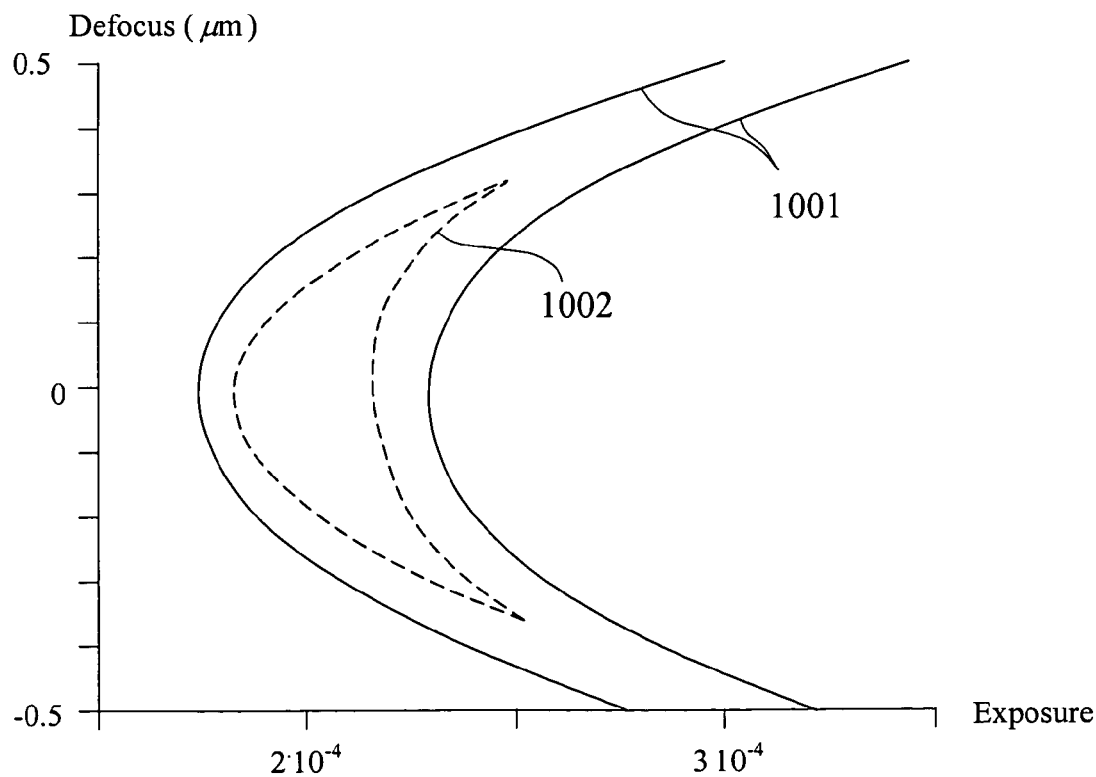

FIGS. 9–11 illustrate print quality metrics for the 50-nm contact hole pattern of FIG. 6. (The print metric definitions are adapted from Ref. 10; see sections 2.7.6–2.7.8.) Contour 602 in FIG. 9 represents the design image. The actual printed contour 901 is distorted by error factors such as focus, exposure, lens distortions, and lens positioning. The assumed imaging tolerance requirement is that every point on contour 901 must be within 2.5 nm of some point on contour 602. The tolerance limits are illustrated as curves 902 and 903.

FIG. 10 illustrates the ED (exposure-defocus) window for the 50-nm contact hole, based on the 2.5-nm imaging tolerance. Curves 1001 bound the set of defocus and exposure values for which the imaging tolerance is achieved. The "Exposure" axis in FIG. 10 represents the exposure flux density per pulse incident on $L_1$, measured in units of the resist exposure threshold. For example, if the resist exposure threshold is 5 mJ/cm$^2$, then an exposure value of 2·10$^{-4}$ in FIG. 10 corresponds to an incident flux on $L_1$ of (2·10$^{-4}$)·(5 mJ/cm$^2$)=1 µJ/cm$^2$ per pulse.

The DOF-EL curve (depth of focus versus exposure latitude) corresponding to FIG. 10 is illustrated in FIG. 11 (curve 1101). The total window (area under curve 1101) is 12.8% µm.

In practice the process window represented by curves 1001 and 1101 may be significantly restricted by optical aberrations induced by lens surface distortions. Non-systematic aberration errors that vary randomly between lenses are not too significant, because their effects tend to statistically average out to zero. (As illustrated in FIG. 6, even a completely dead pixel would not, by itself, result in an out-of-spec image.) Systematic errors that are consistent across a printhead or across an entire print module could, in some cases, be corrected by making compensating adjustments in exposure or processing conditions. Of greater concern are errors that are systematic across a printed image feature (i.e., the errors induced by different lenses are additive), but are non-systematic on a larger scale and hence cannot be corrected. The effect of such systematic, uncompensated errors is considered here.

The print quality is primarily affected by low-order Zernike distortions, in particular, axisymmetric distortions and odd-symmetric distortions that have non-zero center tilt. FIG. 12 tabulates the most significant axisymmetric and odd-symmetric Zernike distortions orders. (The "R" functions are defined in Ref. 11, section 9.2.1.) The functions tabulated in FIG. 12 are scaled so that each has a unit RMS (root-mean-square) value over the unit circle. The ρ coordinate represents radial position on an optical surface, with ρ=1 corresponding to the clear-aperture radius (as defined by a geometric ray trace of an edge ray), and θ represents azimuthal position.

Assuming the "Modeled surface distortions" tabulated in FIG. 12, the common process window has the form represented by curves 1002 (FIG. 10) and 1102 (FIG. 11). The RMS values in FIG. 12 represent surface distortions measured normal to each surface—not wave aberrations. (The latter are smaller by a factor of 1−N=0.064 at wavelength 11 nm; cf. FIG. 4.) Curves 1002 and 1102 are based on one thousand simulated printed images with random combinations of distortions that are at the FIG. 12 RMS limits. The total window represented by curve 1102 is 4.9% µm.

The imaging quality is most strongly affected by wedge errors in $L_2$, which are represented by odd-symmetric Zernike orders for the top and bottom $L_2$ surfaces. As indicated in FIG. 12, a 0.15-nm RMS error is assumed for these orders. A centering error in $L_2$ is equivalent to a surface wedge error; thus it is important that the lenses be manufactured by a process that achieves stringent (nanometer-scale) centering accuracy. In addition, the symmetry of the $L_2$ lens form, and the axial alignment between top and bottom $L_2$ surfaces, must be maintained to a high degree of accuracy.

Microlens Manufacture and Alternative Designs

Figure 13:
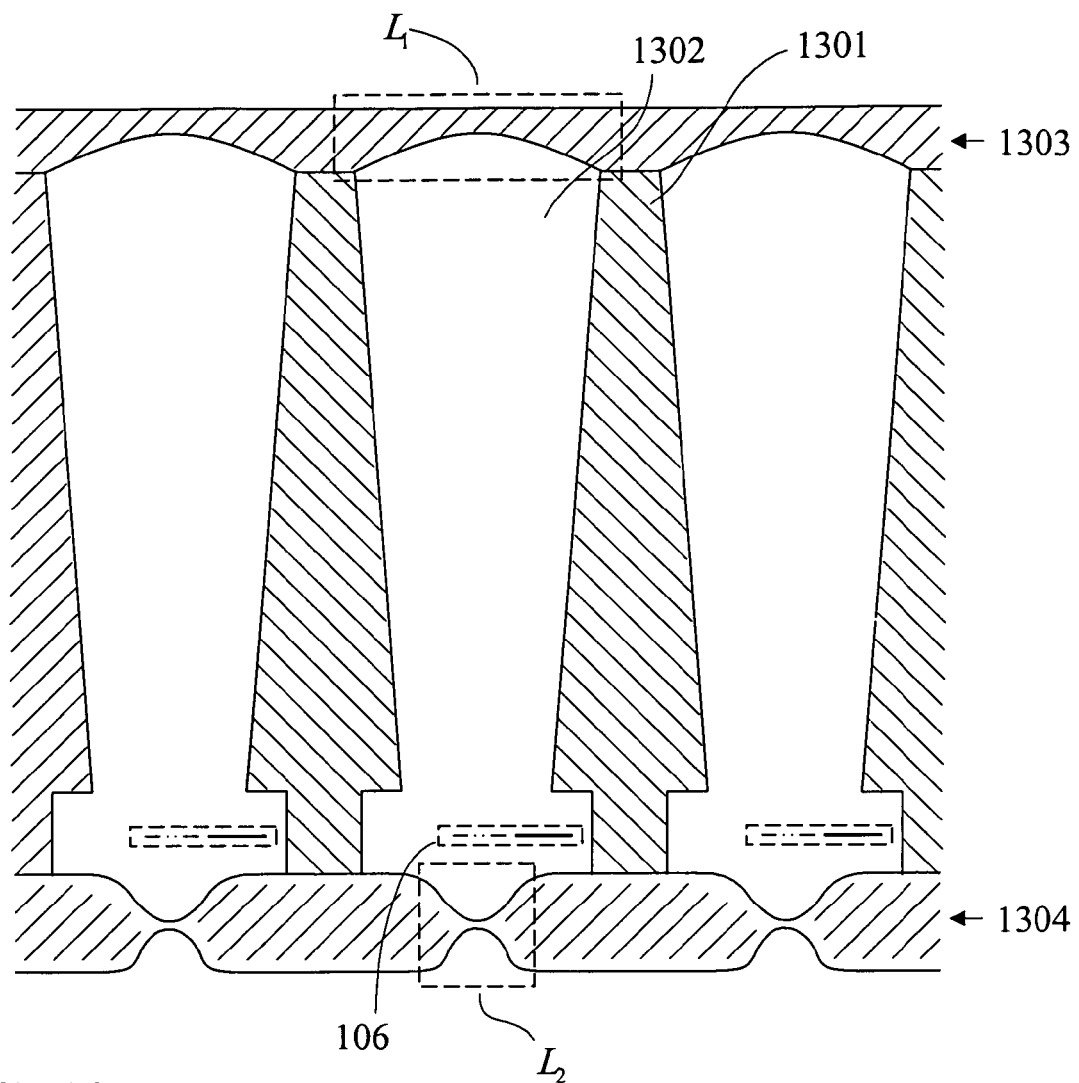
FIG. 13 is a schematic cross-section of a printhead.

FIG. 13 conceptually illustrates a printhead cross-section. The microlenses $L_1$ and $L_2$ and microshutter 106 are supported on a plate 1301 containing open channels 1302 between corresponding microlenses for EUV transmission. The microlenses are formed in ruthenium films 1303 and 1304.

The channels could potentially be fabricated by methods similar to those used to make microchannel plates. For example, Ref. 12 describes a LIGA process for forming a nickel mold, which is filled with spin-on glass and then removed by reverse electroplating, leaving microchannels in the glass structure. ("LIGA" is an acronym for LIthografie Galvanoformung Abformung., which is German for lithography electroplating and molding.)

The microlenses can be fabricated by a variety of processes such as focused ion beam etching or deposition or various masking processes (Refs. 13–18) or gray-scale etching (Ref. 19). Following is an outline of one possible process that could be used to form the $L_2$ lenses (see FIGS. 14A–14E).

A resist film 1401 (FIG. 14A) is coated on a mask layer 1402, and a dense array of holes (e.g., 1403) is formed in the resist using a 3-beam interference lithography process (Ref. 20). (It should be possible to fabricate holes with good uniformity and nanometer-scale centering accuracy by this method.) A subset of the resist holes is used to form holes in the mask layer (e.g., hole 1404, FIG. 14B). The resist is stripped, and the mask hole array is used to form the top $L_2$ surface 1405 in the ruthenium layer 1304, using a masked ion etching or deposition process (FIG. 14C). A patterned spacer layer 1406 maintains the mask 1402 and ruthenium layer 1304 in a fixed positional relationship while an ion beam 1407 is projected through the mask and is directionally scanned and modulated to form the desired surface shape. The mask and spacer are removed, and the printhead superstructure (including $L_1$ lenses and microshutters) is assembled on the ruthenium layer. (The printhead superstructure is not shown in FIGS. 14A–14E, but has the form illustrated in FIG. 13.) A second mask layer 1408 is then positioned below the ruthenium layer 1304 by means of a patterned spacer layer 1409, and is coated with resist 1410 (FIG. 14D). EUV illumination 1411 is projected through the printhead and is focused by surface 1405 through mask layer 1408 and into the resist 1410. The developed resist pattern is transferred into the mask 1408, which is subsequently used to form the bottom $L_2$ surface 1412 by the same process used to form the top surface 1405 (FIG. 14E).

Figure 15:
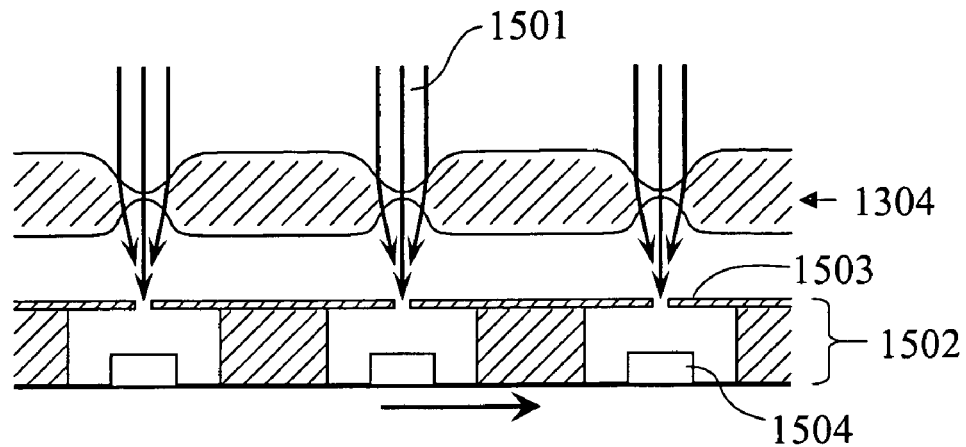
FIGS. 15 and 16 illustrate a process for correcting microlens fabrication errors.
Figure 16:
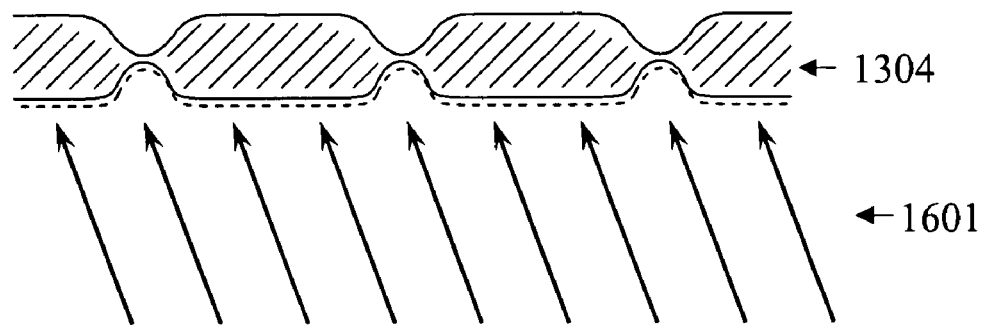

Fabricated surface errors may optionally be corrected by the steps illustrated in FIGS. 15 and 16. The errors are first mapped over the printhead by means of a metrology process (FIG. 15) in which EUV illumination 1501 is projected through the microlens array 1304 and is analyzed by means of a detector array 1502 comprising an aperture array 1503 and detector elements such as element 1504. The detector array is laterally scanned across the microlens array's focal plane, and the detector signals are analyzed to determine the power transmission of individual microlenses and the focal point centering errors. The scan may be performed at various focus levels to determine focus errors, and may be repeated with the detector array in various positions and orientations in order to average out errors in the detector system itself. (Rather than using the detector array 1502, the lens errors may alternatively be mapped by printing and measuring a focus-exposure matrix.)

After the errors have been mapped, an ion beam 1601 (FIG. 16) covering a localized region on the microlens array 1304 is raster-scanned over the array and is modulated to make small, region-specific corrections in the lens surface geometry. The scan may be repeated with the ion beam at different incident angles. Oblique-incidence scans may be used to correct odd-symmetric surface distortions, as illustrated in FIG. 16. Normal-incidence scans may be used to primarily correct lens thickness errors, or may be used in combination with oblique scans to correct thickness and focus errors. (The masked etch step of FIG. 14E would leave the lenses slightly under-etched, and the remaining excess material would be removed in the final corrective step of FIG. 16.) After the final etch, the metrology process (FIG. 15) is repeated for quality control and to determine calibration parameters for the printhead's focus/alignment servo-mechanism.

The above process could significantly reduce low-order lens aberrations. It may not be possible to correct high-order aberrations by this method, but the effects of such aberrations could, to some extent, be counterbalanced by inducing compensating low-order aberrations in the lenses.

Figure 17:
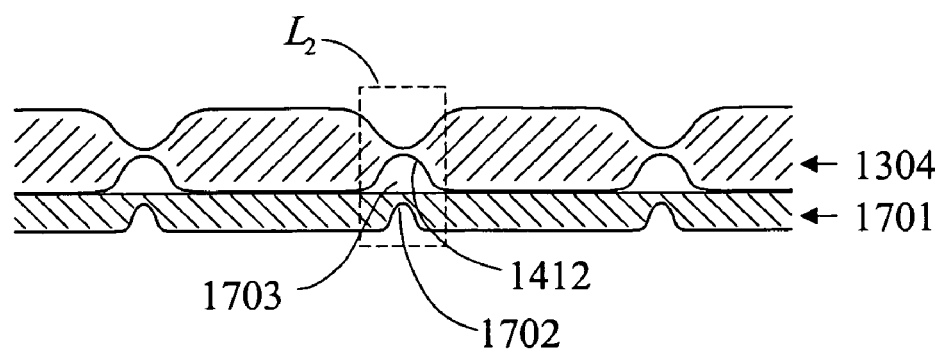
FIG. 17 is a cross-sectional view of a two-element microlens.

The process illustrated in FIGS. 14A–14E, 15, 16 could be extended to form more complex, higher-performing microlenses. For example, FIG. 17 illustrates a two-element $L_2$ design, which is similar to the single-element design of FIGS. 14A–14E, but with an additional ruthenium layer 1701 and lens surface 1702 formed on the bottom (cf. FIG. 15 in Ref. 1). The space 1703 between the embedded surface 1412 and layer 1701 could be filled with a high-index material such as boron or lithium, and the bottom lens surface 1702 could be formed by the same type of masked etching or deposition process used to make surface 1412.

Figure 18:
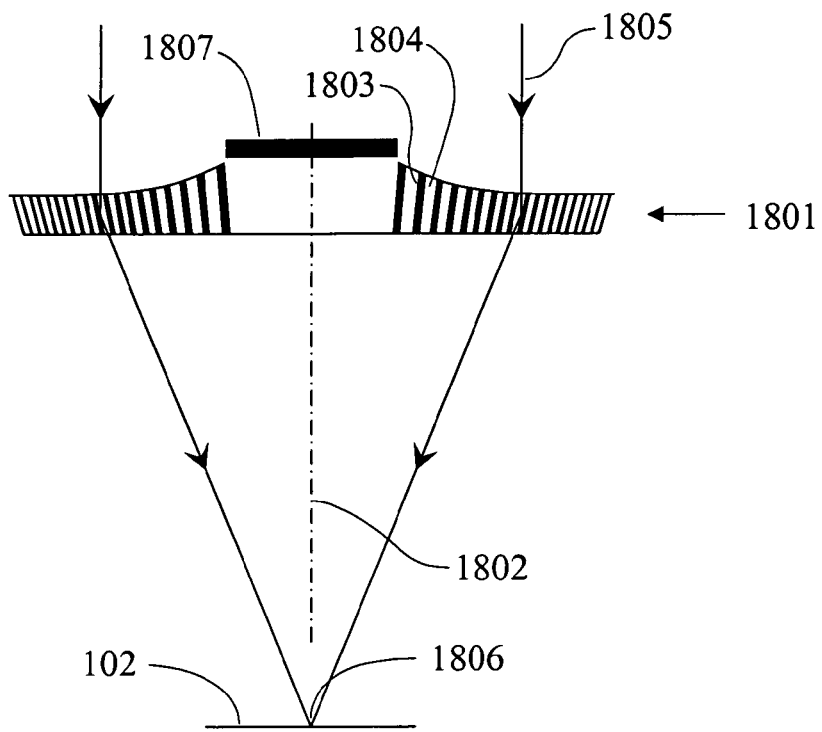
FIG. 18 is a cross-sectional view of a Bragg diffraction lens.

A limitation of the two-element lens configuration of FIG. 17 is that the $L_2$ optical absorption is greatly increased by the extra element, possibly necessitating a reduction in lens size and working distance to reduce the loss. FIG. 18 illustrates an alternative lens type, a Bragg diffraction lens, that does not have this limitation. The lens is similar to a zone plate lens, except that the "zones" have very high aspect ratios and are optimally tilted in the manner of Bragg diffraction gratings. (An $L_2$ lens formed as a conventional, thin zone plate lens would exhibit poor optical efficiency due to the combination of the very small grating period and the low optical contrast of EUV materials.) The Bragg lens 1801, illustrated cross-sectionally in FIG. 18, has axial symmetry about a vertical axis 1802 and comprises radially-stratified layers of a low-index material (e.g., layer 1803) and a high-index material (e.g., layer 1804). The action of the diffracting layers is analogous to grazing-incidence mirrors that reflect and focus incident radiation 1805 onto a focal point 1806 on the wafer surface 102. The Bragg diffraction mechanism is not efficient for small diffraction angles, so the central portion of the lens is masked by an obscuration 1807. (Alternatively, a meniscus, refractive lens, or Fresnel lens, could be used in the inner region, provided that its thickness can be controlled to accurately phase-match the inner and outer lens regions.)

The particular design illustrated in FIG. 18 is configured to operate at a 13.5-nm design wavelength, and the low- and high-index layers are molybdenum and silicon. The lens diameter is 2 micron and the numerical aperture is 0.5, resulting in a focal length of 1.7 micron. The central obscuration's numerical aperture is 0.17. There are 18 grating periods, and the minimum grating period is 27 nm. The diffraction point-spread function has a theoretical FWHM of 13.1 nm (for collimated, monochromatic illumination). The diffraction efficiency in the first order exceeds 50% at 13.5 nm (neglecting any substrate or superstrate transmission loss), with about 90% of the transmitted energy in the first order. The lens has a very wide spectral band (>2 nm bandwidth), but chromatic dispersion could significantly limit optical resolution unless the spectrum is adequately narrowed. Thus, a system employing such lenses may need multilayer mirrors or other mechanisms (such as the mirror spectral filtering method described later in this disclosure) to limit the spectrum. Due to chromatic dispersion, the lens's dimensional scale may be a critical determinant of system optical efficiency. The efficiency is proportional to the usable spectral bandwidth, which is inversely proportional to the lens scale. Moreover, the required number of grating periods is proportional to the lens scale, so a small-size lens would be preferred from the standpoint of manufacturability as well as optical efficiency.

Figure 19A:
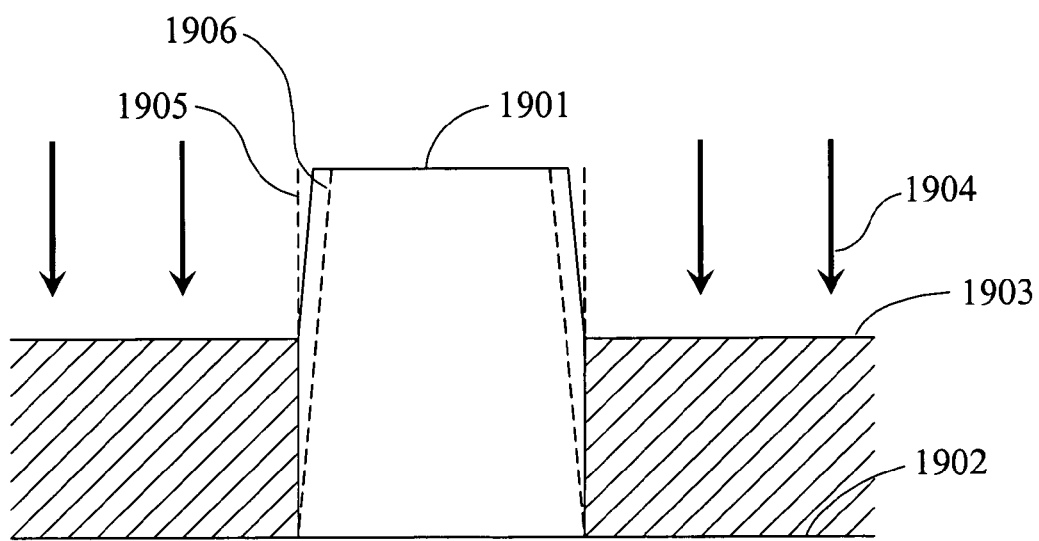
FIGS. 19A–19C illustrate a method for manufacturing a Bragg diffraction lens.
Figure 19B:
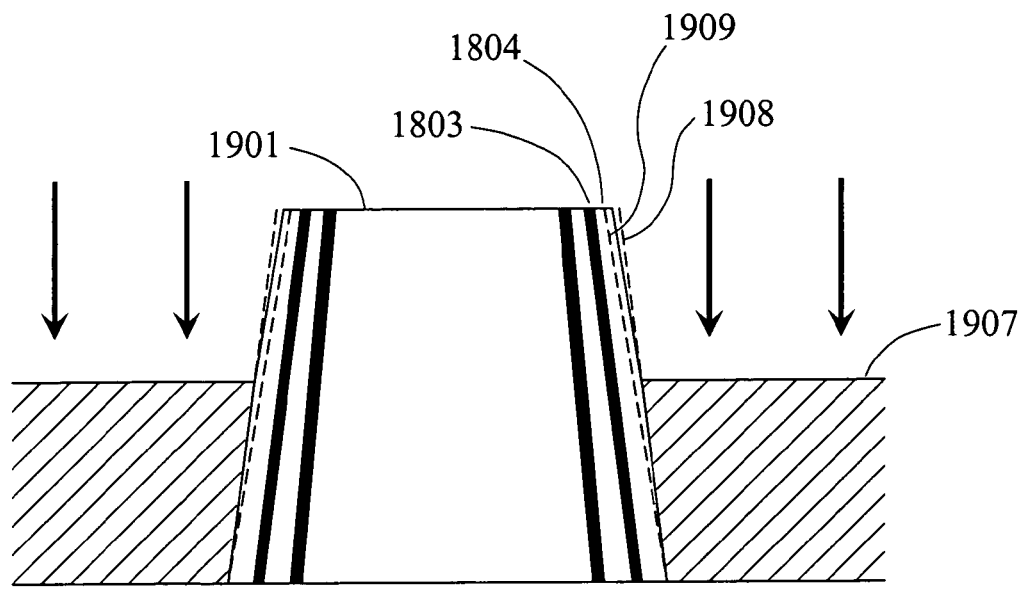
Figure 19C:
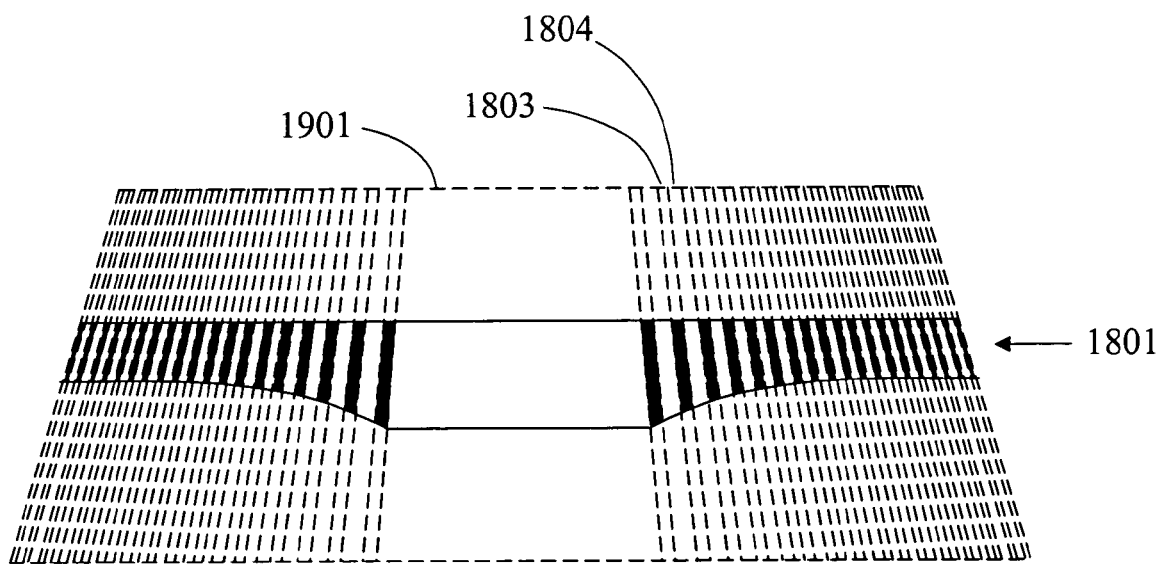

FIGS. 19A–C illustrate a method for constructing Bragg diffraction lenses. An array of vertical, cylindrical, silicon posts (e.g., post 1901, shown cross-sectionally in FIG. 19A) is formed on a substrate 1902 at the designated lens positions. (The posts are preferably formed by interference lithography.) The array is filled in with a filler layer 1903, which is subsequently planarized and etched back to the substrate. FIG. 19A illustrates the structure half-way through the etch process. The etchant 1904 has partial selectivity for silicon, resulting in a vertical taper in the post. (The etchant composition may be varied during the process to modify the silicon selectivity and optimize the profile shape.) The post's cylindrical profile before etching is indicated as 1905, and the resulting tapered profile after etching is indicated as 1906.

The post is then coated with conformal layers of molybdenum and silicon (such as molybdenum layer 1803 and silicon layer 1804, FIG. 19B). After each silicon layer is deposited, the structure is again filled with a filler layer 1907, which is etched back to induce a vertical thickness gradient in the silicon. For example, FIG. 19B illustrates the layer 1804 cross-section half-way through the etch process. The layer profile before etching is indicated as 1908, and the profile after etching is indicated as 1909. In this way, the layers' Bragg angles and surface curvature are optimized as the multiple layers are built up. After all the layers are formed, the top and bottom surfaces of the structure are planarized and etched to define the lens 1801 (FIG. 19C). For optimum optical performance, the lens thickness would be radially graded, with the central region being thicker.

[In a variation of the above process, the Bragg lens layers may be deposited on the wall of a conical hole, rather than on a post.]

Bragg lenses could be constructed for use at 11 nm wavelength by using, e.g., ruthenium for the low-index layers and boron or lithium for the high-index layers. Optical performance would not be as good as molybdenum/silicon lenses operating at 13.5 nm, however much better performance could be achieved by using vacuum as the high-index medium. A lens of this type could be formed by the process outlined above, with a sacrificial material substituted for the high-index medium. After forming the lens, the sacrificial layers are etched out, leaving the low-index layers as free-standing shell structures.

Figure 20:
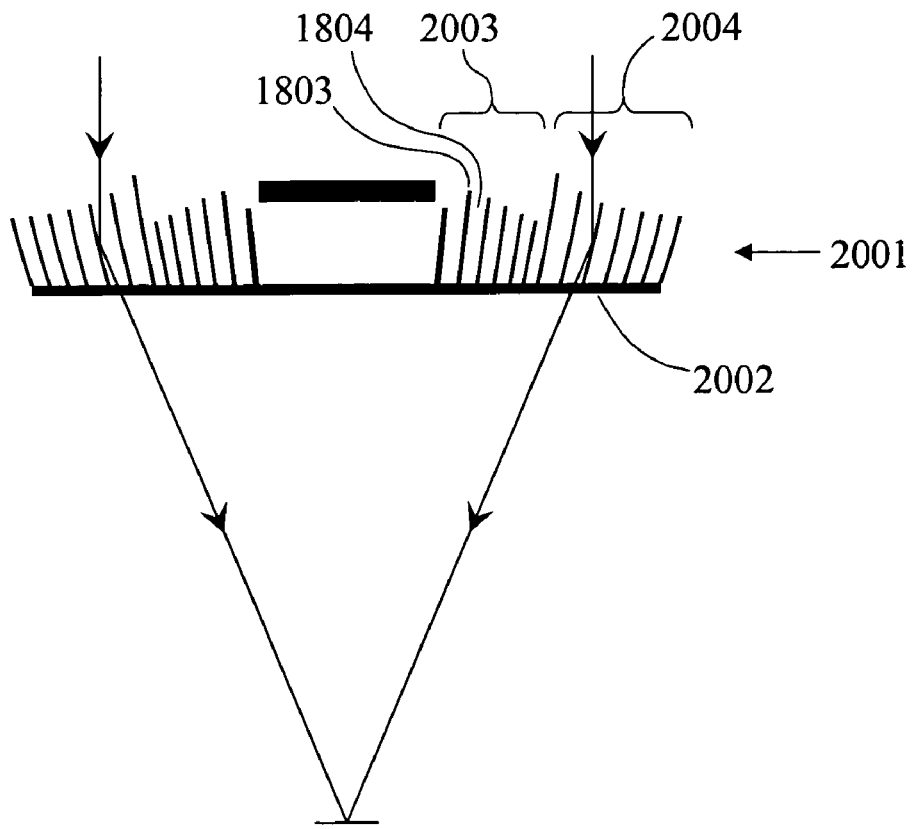
FIG. 20 illustrates an alternative construction for a Bragg diffraction lens.
Figure 21A:
FIGS. 21A–21D illustrate a method for manufacturing a phase Fresnel microlens.
Figure 21B:
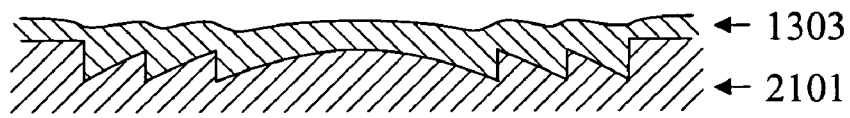
Figure 21C:
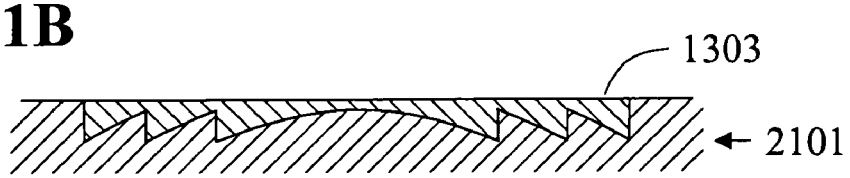
Figure 21D:

FIG. 20 is a cross-sectional view of such a lens 2001. The lens diameter is 2 micron, and the numerical aperture is 0.5. The low-index layers (e.g., 1803) are preferably ruthenium, and the high-index layers (e.g., 1804) are empty spaces between the ruthenium layers. The layers are supported on a substrate 2002 such as a DLC (diamond-like carbon) layer (Ref. 8). The illustrated design is configured to have ruthenium layers with a minimum thickness of approximately 10 nm (although thinner layers could provide marginally better optical performance). In this particular design illustration the lens aperture comprises two annular zones, an inner zone indicated by its radial section 2003, and an outer zone with radial section 2004. The inner zone is configured to operate in the first diffracted order, while the outer zone operates in the second order (i.e., the grating period in the outer zone is doubled relative to a first-order Bragg grating). This reduces the number of layers in the outer zone by a factor of two and increases the layer spacing relative to a first-order lens (although it also approximately doubles the lens thickness in the outer zone). In this design the outermost ruthenium layer thickness is approximately 10 nm and the outermost vacuum layer thickness is approximately 34 nm. The lens's first-order diffraction efficiency exceeds 60% at the 11 nm design wavelength (excluding substrate losses), with over 85% of the transmitted energy going into the first order. The focus spot's monochromatic point spread function has a theoretical FWHM of 10.6 nm.

It may also be possible to use Bragg lenses for lithography at x-ray wavelengths. For example, Ref. 21 describes a similar type of structure that focuses hard x-rays for microscopy applications.

The above design options apply primarily to the $L_2$ lens. For $L_1$, other options are available due to its comparatively large size and low numerical aperture. One alternative would be to form $L_1$ as a zone plate lens. Although zone plate lenses are limited by diffraction efficiency losses, absorption losses would be considerably less than a refractive lens of the type illustrated in FIG. 1B. (The latter exhibits only 15% transmittance at the 11-nm design wavelength.)

Figure 14A:
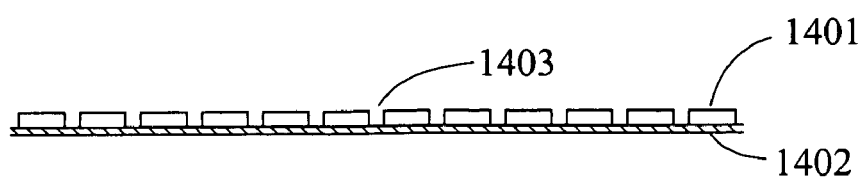
FIGS. 14A–14E illustrate a microlens manufacturing method.
Figure 14B:
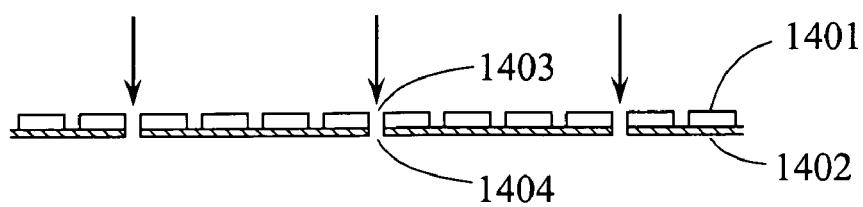
Figure 14C:
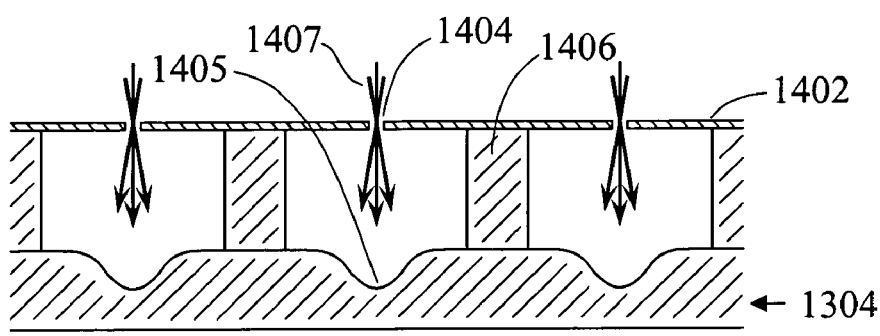
Figure 14D:
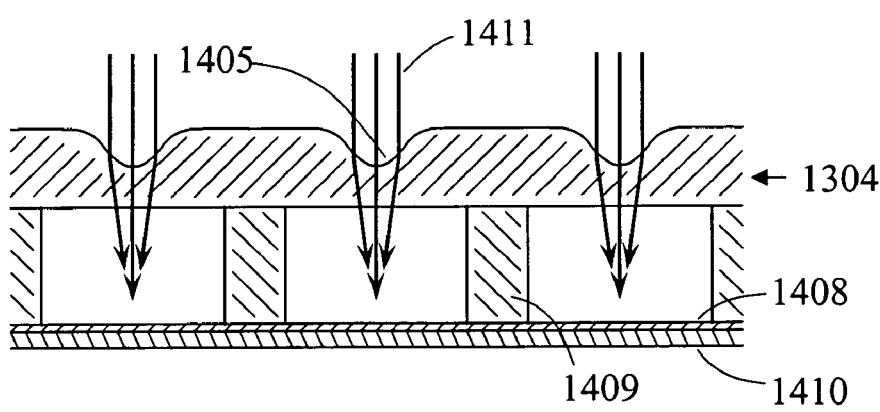
Figure 14E:
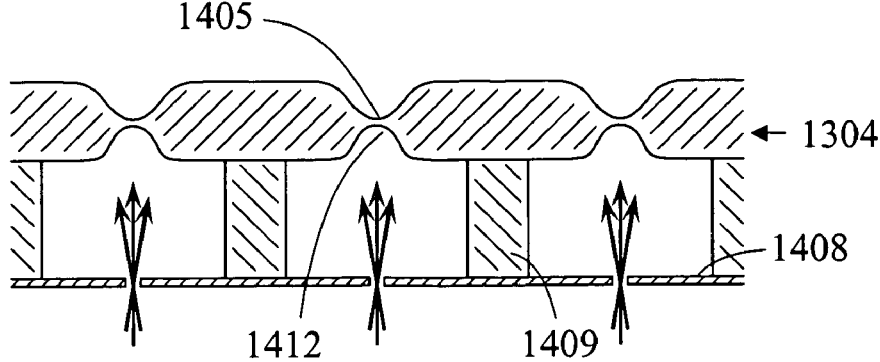

Another option would be to configure $L_1$ as a phase Fresnel lens (cf. FIGS. 14A, 14B in Ref. 1; see also Ref. 22). A method for manufacturing phase Fresnel lenses is illustrated in FIGS. 21A–21D. A replica lens mold 2101 (FIG. 21A) is formed, e.g., by means of nanoimprint lithography. The mold is filled with a deposited ruthenium layer 1303 (FIG. 21B), which is subsequently planarized (FIG. 21C) and relased from the mold (FIG. 21D) to leave a free-standing lens. (A large array of lenses would be formed in parallel by this method.)

Printhead and Wafer Module Configuration

FIG. 22A shows a plan view of a printhead 2201. The printhead aperture has dimensions 24-by-24 mm. The $L_1$ lens apertures are distributed over the printhead in a hexagonal pattern, as illustrated by the enlarged view in FIG. 22B. The $L_1$ apertures (e.g., 2202) have a 10 micron diameter and 13.6 micron center spacing, resulting in a lens fill factor of approximately 0.5 (FIG. 22A is only a schematic illustration. The actual number of $L_1$ apertures per printhead is $3.6 \cdot 10^6$.)

A wafer print module (FIG. 23) comprises 32 printheads (e.g., printhead 2201) distributed in 6-by-6 array with the corner elements omitted. The printhead center spacing is 48 mm (twice the aperture width). The printheads are disposed above the wafer 2301a. Either the wafer, the printheads, or both are laterally scanned during the printing process. FIG. 23 illustrates the wafer in four scan positions (2301a, 2301b, 2301c, 2301d) relative to the printheads. At each position a raster scan is performed to expose the portion of the wafer covered by the printheads. The total wafer-plane printable area relative to the wafer aperture 2301a is illustrated by the dashed line 2302. The printable area is four times the aggregate printhead aperture area. 97% of the wafer is within the printable area, and 93% of the printable area is within the wafer aperture. Two wafer print modules having the form of FIG. 23 are supplied illumination from a single LPP source.

FIGS. 24–26 show more detail of the microlens layout and the raster scan pattern. (This design was developed by the procedure demonstrated in Ref. 1, Eqs. 8.55–8.97.) Dimensional values, which are tabulated in FIG. 26, are all integer multiples of the printing grid step, G=8 nm (Eq. 2601). The printhead 2201 comprises microlens apertures (e.g., aperture 2401), which are arranged in rows ("row 1", "row 2", etc.) with the even-numbered rows offset relative to the odd-numbered rows to form the hexagonal layout pattern. The number of pixels per row ($N_{pixel/row}$) is 1026 (Eq. 2602), and the number of rows per printhead ($N_{row/head}$) is 3538 (Eq. 2603). The lens center spacing within each row ($\Delta X_{pixel}$ G) is 23.392 µm (Eq. 2604), and the center offset between rows ($\Delta Y_{pixel}$ G) is 6.784 µm (Eq. 2605). The nominal printhead dimensions ($W_x$ and $W_y$) are 24.000192 mm (Eq. 2606) and 24.001792 mm (Eq. 2607). These are the exact stepping displacements between scan positions 2301a, 2301b, 2301c, and 2301d in FIG. 23. If circle 2402a in FIG. 24 is interpreted as the position of a particular $L_1$ aperture relative to the wafer in scan position 2301a (FIG. 23), then the dashed circles 2402b and 2402d represent the same aperture's position (relative to the wafer) in scan positions 2301b and 2301d, respectively.

[Note: In Ref. 1 the printing grid steps $G_x$ and $G_y$ were adjusted slightly to satisfy Eqs. 8.92 and 8.97, but in the present design G is fixed and $W_x$ and $W_y$ are instead adjusted to satisfy these relationships.]

At each scan position the printheads are raster-scanned over the wafer so that each printhead pixel prints a dot pattern of the form illustrated in FIG. 25. Starting with dot 2501, the pixel prints a serpentine pattern of dots in synchronization with the pulsed EUV source. The number of pulses per raster line ($N_{pulse/line}$) is 2924 (Eq. 2608), and the number of raster lines per scan ($N_{line/scan}$) is 848 (Eq. 2609). The pixel's dot spacing between pulses ($\Delta X_{pulse}$ G) and the spacing between raster lines ($\Delta Y_{line}$ G) are both 104 nm (Eqs. 2610, 2611). This dimension is chosen so that there is no significant overlap between the exposure spots generated by any particular pixel, to avoid clustering of image defects from bad pixels.

For some applications a different scan pattern might be used to better optimize the tradeoff between print quality and throughput. For example, the raster pattern could skip every other dot on each raster line, and could also skip every other raster line. This would increase the printing grid step from 8 nm to 16 nm (still well within the 26 nm optical resolution limit), but would quadruple throughput. (However, the EUV power would also have to be quadrupled to maintain the same exposure level.)

Printing Throughput and EUV Power Requirements

FIG. 27 summarizes the factors that go into the wafer throughput calculation. The total number of laser pulses per scan is $N_{pulse/scan}=2.4 \cdot 10^6$ (Eq. 2701). There are four scans per print cycle, so the total number of pulses per cycle is $N_{pulse}=9.9 \cdot 10_6$ (Eq. 2702). Dividing this by the 10 kHz source repetition rate ($v_{source}$, Eq. 2703) yields a total scanning time per cycle ($t_{cycle\_scan}$) of 16.53 min (Eq. 2704). Taking into account the throughput overhead for wafer loading, alignment, and field stepping, the total time per cycle is estimated at $t_{cycle} \cong 20$ min (Eq. 2705). This is the time to print two wafers, so the print time per wafer is $t_{wafer} \cong 10$ min (i.e. 6 wph, Eq. 2706).

The EUV power calculation comprises the factors summarized in FIG. 28. First, the total print area is computed (Eqs. 2801–2804). The number of pixels per printhead is $N^{pixel/head}=3.6 \cdot 10^6$ (Eq. 2801), and multiplying this by the 32 printheads per module and the 2 modules gives the total number of pixels, $N_{pixel}=2.3 \cdot 10^8$ (Eq. 2802). Factoring in the number of pulses per print cycle ($N_{pulse}$) yields the total number of print dots, $N_{dot}=2.3 \cdot 10^{15}$ (Eq. 2803), and multiplying this by the printing grid cell area ($G^2$) gives the total print area per print cycle (this is for two wafers): $A^{print}=1475$.$cm^2$ (Eq. 2804).

Next, the wafer-plane energy density requirement is estimated. This calculation is based on the 21-point exposure pattern illustrated in FIGS. 6 and 7. The horizontal axis in FIG. 7 represents position on the wafer plane, and the vertical axis represents the wafer-plane energy flux density (integrated over the 3.25-nm spectral band of FIG. 5, and summed over all laser pulses), assuming unit flux density (per laser pulse) incident on $L_1$. The clearing exposure level (i.e. the wafer-plane energy flux with all points on the 8-nm grid exposed) would be higher than the peak of curve 701 by a factor of 2.12. (The peak level is 9820, and the clearing exposure level is 20800.) The actual incident flux is chosen so that the 50% level on curve 701 corresponds to the assumed resist exposure threshold, $Q_{A\_resist}=5$ mJ/cm² (Eq. 2805); thus the exposure pattern in FIG. 6 would produce a 50-nm contact hole. The 21-point exposure pattern peaks at $Q_{A\_peak}=10$ mJ/cm² (Eq. 2806), and the clearing exposure level is $Q_{A\_clear}=21.2$ mJ/cm² (Eq. 2807). Multiplying this by the total print area $A_{print}$ yields the maximum total EUV energy $Q_{print}$ delivered to the wafer plane (within the 3.25-nm spectral band) per print cycle, $Q_{print}=31.26J$ (Eq. 2808).

The various system efficiency factors are then divided out of $Q_{print}$ to determine the source power requirement. The spectrally-averaged $L_1$, $L_2$ transmittance efficiency over a 3.25-nm spectral band centered at 11 nm is $\eta_{L_1,L_2}=0.0172$ (Eq. 2809). This factor takes into account the microlens absorption loss and vignetting by the $L_2$ aperture, and is weighted by the xenon spectrum (FIG. 5). The $L_1$ aperture fill factor is nominally 0.5, however a more accurate calculation based on FIG. 24 gives $\eta_{ff}=0.495$ (Eq. 2810). Dividing $\eta_{L_1,L_2}$ and $\eta_{ff}$ out of $Q_{print}$, the total EUV energy delivered to the printheads per print cycle is determined to be $Q_{heads}=3673$.J (Eq. 2811). The collimation optics (described in the next section) have an optical efficiency of $\eta_{coll}=0.0808$ (Eq. 2812). This factor includes the geometric efficiency from a $2\pi$-sr (steradian) hemispherical source emission range to the 64 24-mm-square printhead apertures, and also includes reflection losses at the collimation mirrors, but does not include the fold mirror reflectance. The fold mirrors have a combined reflection efficiency of $\eta_{fold}=0.485$(Eq. 2813). This includes two mirrors operating at a 15° grazing angle and three operating at 10.3°. (These efficiencies were calculated at the 11-nm wavelength, neglecting the mirror's reflectance spectrum.) An additional loss factor $\eta_{misc}=0.8$ (Eq. 2814) is also assumed to take into account miscellaneous losses such as optical attenuation by the ambient xenon gas, or DLC lens coating losses. Combining these efficiency losses with $Q_{heads}$, the estimated source energy requirement is $Q_{source}=1.171 \cdot 10^5$ J per print cycle (Eq. 2815). Dividing this by the cycle scan time ($t_{cycle\_scan}=992$.sec, Eq. 2704) yields the source power $\Phi_{source,\, 3.25\, nm}=118.1$ W (Eq. 2816). This is the power over $2\pi$ sr, within a 3.25-nm spectral band centered at 11 nm. It may be more useful to specify the power in a 2-nm band from 10 to 12 nm, because very little of the energy outside this band actually gets through the lenses (see FIG. 3). 78.4% of the xenon emission energy in the 3.25-nm band is within the 2-nm band, so the power required in the 2-nm band is $\Phi_{source,\, 2\, nm}=92.6$ W (Eq. 2817). (For comparison with the prior art, this corresponds to approximately 4.3 W within a 2% band at 13.5 nm, versus the 400 W requirement for EUV projection systems, Ref. 2.)

Collection Optics

The illumination system comprises collection optics and distribution optics. The collection optics reshape the point-source beam emitted by the LPP into horizontally collimated beams. (Collimating the source illumination in a horizontal direction is convenient if the system uses a liquid-jet xenon LPP source comprising a vertical xenon filament flowing across a horizontally-directed laser beam.) The distribution optics partition and redirect the horizontally collimated beams onto the microlens arrays, which are in a horizontal plane above horizontally-disposed wafers. (A horizontal orientation is advantageous for wafer handlers and scanners operating in a vacuum environment.) A description of the collection optics follows, and the distribution optics will be described in the next section.

The mirrors preferably comprise bare ruthenium films, except that some mirrors may be provided with special surface treatments, in the form of additional film coatings or diffractive surface relief structures, to enhance optical performance. The surface treatments could perform functions of apodization (to mitigate diffraction effects at the mirrors' limiting apertures), efficiency tuning (to attain uniform irradiance across all printheads), and spectral filtering (to mitigate the effects of chromatic dispersion in the microlenses and wavelength-dependent mirror reflectivity).

The source is collected by means of collimation mirrors comprising three concentric shells, each shell comprising two grazing-incidence collectors having a form similar to x-ray telescope mirrors of the Wolter-Schwartzchild type (Ref. 23). (Whereas x-ray telescope mirrors are designed to satisfy the Abbe sine condition, the collimator mirrors of the present invention are designed to produce uniform output irradiance, taking into account the variation in mirror reflection efficiency across the output aperture.)

Figure 29:
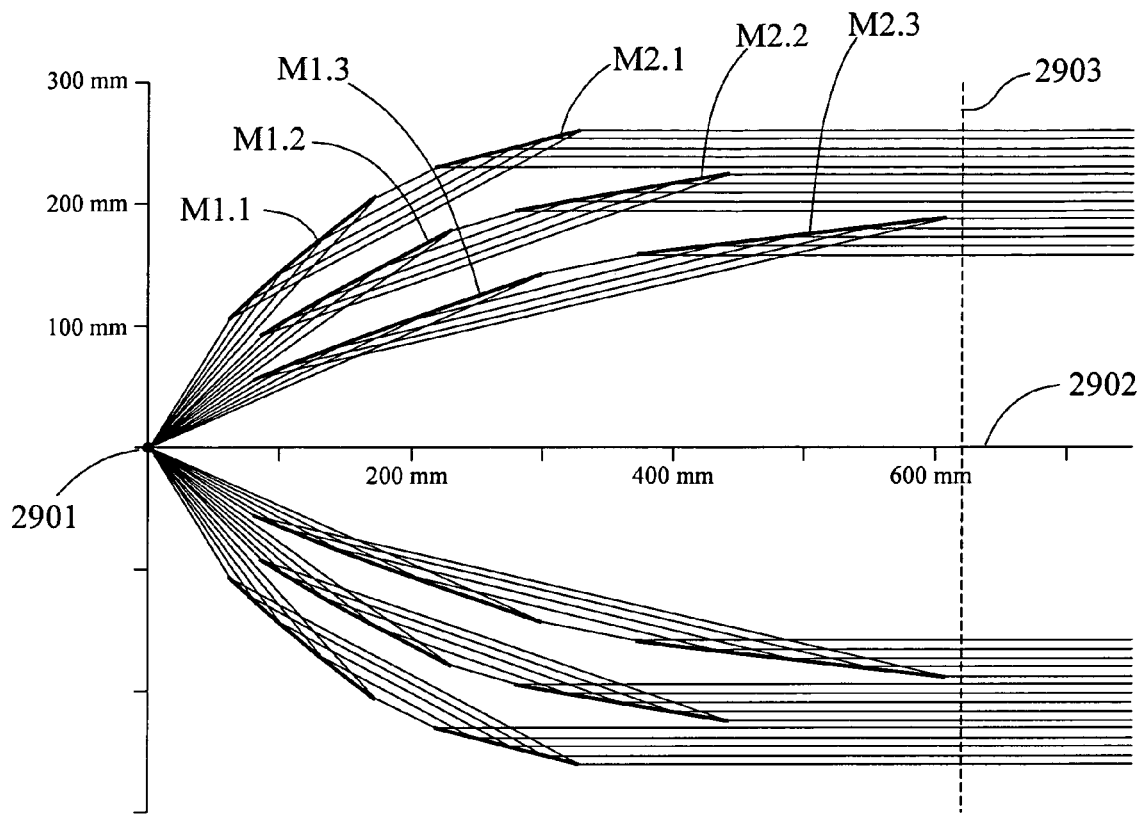
FIG. 29 is a cross-sectional view of the illumination collection optics.

The collection optics are illustrated cross-sectionally in FIG. 29. The LPP source 2901 emits point-divergent EUV radiation, which is partitioned into three beams by a set of three curved, grazing-incidence mirrors collectively designated M1 and individually designated M1.1, M1.2, and M1.3. A second set of three curved, grazing-incidence mirrors, collectively designated M2 and individually designated M2.1, M2.2, and M2.3, collimates the output from M1 in a horizontal direction. The M1 and M2 mirrors are all axially symmetric about a common horizontal axis 2902. The two sets of mirrors provide sufficient degrees of freedom to collimate the illumination, and also to provide uniform irradiance, taking into account the variation in mirror reflectivity with grazing angle. (The design could also be configured to take into account an axially-symmetric source emission profile.) The illustrated design is configured to provide uniform spectral irradiance at the 11-nm design wavelength, but in practice it could be configured to provide a uniform, spectrally-integrated clearing exposure level at the printing surface.

Figure 30:
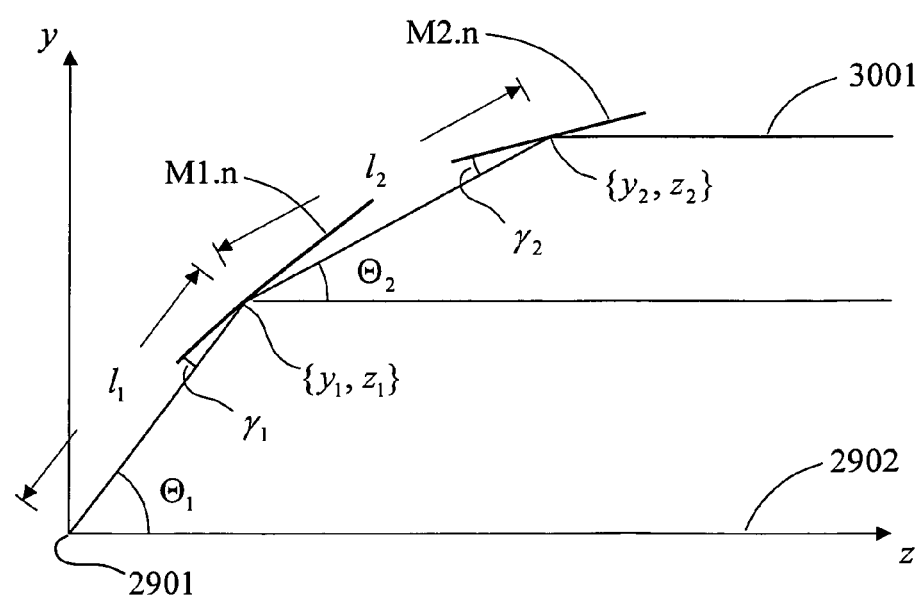
FIG. 30 illustrates the collection optics geometry.

The mirror design is determined by the optical geometry illustrated in FIG. 30, and by the defining equations tabulated in FIG. 31. Cross-sectional Cartesian coordinates y, z are employed in the geometry specification, wherein z is the horizontal coordinate and y is the vertical coordinate. (In this context y can be interpreted alternatively as the radial coordinate of a cylindrical coordinate system with axial coordinate z.) A particular geometric ray 3001 originates from the LPP source 2901, reflects off one of the mirrors M1.$n$ (n=1, 2, or 3) at point $\{y,z\} = \{y_1, z_1\}$, and reflects off mirror M2.$n$ at point $\{y,z\} = \{y_2, z_2\}$. After reflection, the ray direction is parallel to axis 2902. The ray's grazing angle on M1.$n$ is $\gamma_1$, and on M2.$n$ is $\gamma_2$. The ray segment from source 2901 to point $\{y_1, z_1\}$ has length $l_1$, and the segment's deviation angle from axis 2902 is $\Theta_1$. The ray segment from point $\{y_1, z_1\}$ to point $\{y_2, z_2\}$ has length $l_2$, and this segment's deviation angle from axis 2902 is $\Theta_2$.

Based on the geometry illustrated in FIG. 30, the $y_1$, $z_1$, $y_2$, and $z_2$ coordinates are defined by Eqs. 3101, 3102, 3104, and 3105 in FIG. 31; and based on the law of reflection, $\gamma_1$ and $\gamma_2$ are defined by Eqs. 3106 and 3107. These six defining equations contain four undetermined quantities: $l_1$, $l_2$, $\Theta_1$, and $\Theta_2$. Of these four, one ($\Theta_1$) will be taken to be a free parameter and the other three ($l_1$, $l_2$, and $\Theta_2$) will be taken to be implicit functions of the free parameter. (Using square braces to delimit function arguments, the functional dependence of these quantities may be indicated explicitly as $l_1 = l_1[\Theta_1]$, $l_2 = l_2[\Theta_1]$, $\Theta_2 = \Theta_2[\Theta_1]$.) Three additional equations are required to determine these three functions. Two of these (Eqs. 3103, 3108) are obtained from the law of reflection applied at points $\{y_1, z_1\}$ and $\{y_2, z_2\}$, and the third (Eq 3109) is obtained from the uniform-irradiance design condition. Eq. 3103 explicitly defines the function $l_2[\Theta_1]$. (This definition involves an integration constant, c, which is a free design parameter.) Eqs. 3108 and 3109 are differential equations, which can be numerically integrated to determine $l_1[\Theta_1]$ and $\Theta_2[\Theta_1]$. (The solution involves two additional integration constants, initial values for $l_1$, and $\Theta_2$, which are also free design parameters.) The factor $I_0$ in Eq. 3109 represents the LPP source intensity, weighted by all of the optical efficiency losses between the source and the wafer, and spectrally integrated. ($I_0$ is a function of $\Theta_1$.) The factor $E_{print}$ is a constant representing the local-area-averaged, spectrally integrated irradiance at the wafer plane. ($E_{print}$ represents the instantaneous wafer-plane irradiance, with all microshutters open, averaged over an area that is large compared to the microlens aperture dimensions but small compared to the printhead dimensions. Depending on how $E_{print}$ is defined, it may represent the irradiance incident on, or absorbed by, the resist.) The stipulation that $E_{print}$ is constant ensures a uniform clearing exposure level.

FIG. 32 outlines the derivation of Eqs. 3103 and 3108. Eq. 3201 is obtained from the law of reflection applied at point $\{y_1, z_1\}$. $dy_1$ and $dz_1$ are differential increments of $y_1$ and $z_1$ associated with an infinitesimal change in $\Theta_1$, and the vector $\{dy_1, dz_1\}$ is tangent to the M1.$n$ surface at point $\{y_1, z_1\}$. The left-hand term in Eq. 3201 is a vector normal to the surface. Similarly, in Eq. 3202 $dy_2$ and $dz_2$ are differential increments of $y_2$ and $z_2$, the vector $\{dy_2, dz_2\}$ is tangent to surface M2.$n$ at point $\{y_2, z_2\}$, and the left-hand term is normal to the surface. The sum of Eqs. 3201 and 3202 can be directly integrated to obtain Eq. 3203. The parenthesized expression in Eq. 3203 is equal to a constant denoted c; hence Eq. 3204 is obtained, and elimination of $z_2$ between Eqs. 3105 and 3204 yields Eq. 3103. Eq. 3202 can be simplified to the form of Eq. 3205, from which Eq. 3108 is obtained.

The derivation of Eq. 3109 is outlined in FIG. 33. The M1, M2 mirror design is based on the assumption that the spectral radiant intensity $I_\lambda$ emitted by the LPP (i.e., emitted EUV power per unit solid angle, per unit wavelength) is a function only of wavelength $\lambda$ and the axial emission angle $\Theta_1$: $I_\lambda = I_\lambda[\lambda, \Theta_1]$. The differential EUV power $d\Phi_{source}$ emitted by the source into differential solid angle $d\omega$ and differential wavelength band $d\lambda$ is $I_\lambda\, d\omega\, d\lambda$, Eq. 3301. Considering the directional range bounded by emission angles $\Theta_1$ and $\Theta_1 + d\Theta_1$, and by an azimuthal angle range $d\phi$ relative to axis 2002, the solid angle $d\omega$ defined by this range is $\sin\Theta_1\, d\Theta_1\, d\phi$, Eq. 3302. The M1 and M2 mirrors map rays within this range into a collimated beam bounded by corresponding y limits, $y_2$ and $y_2+dy_2$, and the same azimuthal range $d\phi$. These rays define a collimated beam covering aperture area $dA=y_2\,dy_2\,d\phi$, Eq. 3303. The aperture area is preserved as the collimated beam traverses the distribution optics to the printhead array, but the power in the beam at the printheads, $d\Phi_{head}$, is attenuated relative to $d\Phi_{source}$ by a factor $\eta_{mirror}$ representing the collection and distribution mirrors' combined reflection efficiency, Eq. 3304. (In Eqs. 2812 and 2813 of FIG. 28 the mirror efficiency is represented by two separate factors, $\eta_{coll}$ and $\eta_{fold}$, but in a more accurate analysis $\eta_{mirror}$ would not actually be separable into separate mirror contributions because the mirror reflectance is polarization-dependent.) It is assumed that $\eta_{mirror}$ is a function only of wavelength $\lambda$ and the grazing angles $\gamma_1$ and $\gamma_2$: $\eta_{mirror}=\eta_{mirror}[\lambda, \gamma_1, \gamma_2]$. Combining the above factors, the differential irradiance $dE_{head}$ at the printheads within the $d\lambda$ wavelength band is obtained, Eq. 3305. An additional wavelength-dependent factor $\eta_{head}$, representing the printhead transmission efficiency, is applied to $dE_{head}$ to obtain the local-area-averaged, wafer-plane, differential irradiance $dE_{print}$. ($dE_{print}$ represents an average over an area that is large compared to the microlens aperture dimensions, but small compared to the printhead dimensions.) $\eta_{head}$ includes the lens fill factor $\eta_{ff}$ and lens transmittance $\eta_{L_1, L_2}$ (Eqs. 2810 and 2809). $dE_{print}$ may also include a resist efficiency factor $\eta_{resist}$ (e.g., so that $dE_{print}$ represents the differential irradiance actually absorbed by the resist—not just the incident irradiance), Eq. 3306. Upon integrating $dE_{print}$ over wavelength, the total (spectrally-integrated) wafer-plane irradiance $E_{print}$ is obtained, Eqs. 3307 and 3308. $E_{print}$ contains a factor $I_0$ which represents the source intensity, weighted by all of the system efficiency factors between the source and resist, and integrated over wavelength, Eq. 3308. The functional arguments of the various factors in Eq. 3308 are indicated explicitly. All of the integrand factors are functions of $\lambda$; $I_\lambda$ is also a function of $\Theta_1$; and $\eta_{mirror}$ is also a function of $\gamma_1$ and $\gamma_2$ (which are implicitly functions of $\Theta_1$). Eqs. 3106 and 3107). $I_0$ is a function only of $\Theta_1$. $E_{print}$ does not itself have any functional dependencies, because the design objective is to make $E_{print}$ constant over the wafer. Eq. 3109 follows from Eq. 3307.

The M1, M2 design assumptions and parameters for the illustrated embodiment are tabulated in FIG. 34 (for M1.1 and M2.1), FIG. 35 (for M1.2 and M2.2), and FIG. 36 (for M1.3 and M2.3). Two simplifications of Eq. 3308 are used for this design: First, the $\Theta_1$ dependence of $I_\lambda$, $[\lambda, \Theta_1]$ is neglected. Second, $\eta_{mirror}[\lambda, \gamma_1, \gamma_2]$ is assumed to be multiplicatively separable into a function of only $\lambda$ and a function of only $\gamma_1$ and $\gamma_2$, implying that $I_0[\Theta_1]$ has the simplified form of Eq. 3401, in which $I_1$ is a design constant. The M1.$n$, M2.$n$ design prescription outlined above (FIGS. 29–33) involves six free design parameters: the constants $c$ and $E_{print}$, two $\Theta_1$ limits defining the M1.$n$ aperture limits (these will be designated $\Theta_{1\_min}$ and $\Theta_{1\_max}$) and the initial conditions on $l_1$ and $\Theta_2$ associated with the differential equations, Eqs. 3108 and 3109. Thus, six numeric constraints must be specified for each mirror pair M1$n$, M2.$n$, $n=1, 2, 3$. Specified quantities are indicated by the "spec." notation in FIGS. 34–36, and the remaining quantities are derived from the specifications.

For the M1.1, M2.1 mirror pair, the following six constraints are imposed:

(1) $\Theta_{1\_max}$ is 60°, Eq. 3402. A larger $\Theta_{1\_max}$ would improve geometric collection efficiency, but to keep the grazing angles $\gamma_1$ and $\gamma_2$ less than approximately 15° $\Theta_{1\_max}$ is limited to 60°.

(2) $\Theta_{1\_min}$ is 50°, Eq. 3403. A smaller $\Theta_{1\_min}$ could improve collection efficiency, but would increase the overall length of the collection optics.

(3) $l_2[\Theta_{1\_min}]$ is 50 mm, Eq. 3404. A smaller $l_2[\Theta_{1\_min}]$ would make the system somewhat shorter and would increase mechanical clearances, but would also result in strong nonlinearities in the functions $\gamma_1[\Theta_1]$ and $\gamma_2[\Theta_1]$.

(4) $\gamma_2[\Theta_{1\_max}]$ is specified as 15° (Eq. 3405), implying that $\gamma_1[\Theta_{1\_max}]$ is also 15° (Eqs. 3106, 3107). This is to ensure that the grazing angles do not significantly exceed 15°—otherwise reflection efficiency would be degraded.

(5) $y_2[\Theta_{1\_max}]$ is 260 mm (Eq. 3406).

(6) $y_2[\Theta_{1\_min}]$ is 230 mm (Eq. 3407). The 30 mm difference is sufficient to accommodate the 24-mm printhead width plus optical clearances. Smaller $y_2$ limits would make the collection optics more compact, but would result in optical interference within the distribution optics system.

Based on the above specifications, the quantities $c$, $I_1/E_{print}$, $I_1[\Theta_{1\_min}]$, and $\Theta_2[\Theta_{1\_min}]$ have the values given in Eqs. 3408–3411.

For the M1.2, M2.2 mirror pair, the design constraints are as follows (FIG. 35):

(1) $\Theta_{1\_max}$ is 47°, Eq. 3501. This is to provide 3° clearance between the M1.1 and M1.2 collection ranges (cf. Eq. 3403), resulting in a 6-mm edge thickness allowance for M1.2.

(2) $l_2[\Theta_{1\_min}]$ is 50 mm, Eq. 3502 (based on the same tradeoff considerations that apply to M1.1, M2.1).

(3) $\gamma_1[\Theta_{1\_min}]$ and $\gamma2[\Theta_{1\_min}]$ are equal, Eq. 3503. This is to balance the optical power between M1.2 and M2.2 and minimize reflection loss. ($\gamma_1$ and $\gamma_2$ are well below 15° over the full M1.2, M2.2 apertures.)

(4) The $I_1/E_{print}$ ratio is matched to that of mirrors M1.1, M2.1, Eq. 3504 (cf. Eq. 3409). This is to ensure that all the mirrors produce the same irradiance level.

(5) $y_2[\Theta_{1\_max}]$ is 224 mm, Eq. 3505. This is 6 mm less than the M2.1 lower $y_2$ limit (Eq. 3407), providing adequate allowance for M2.2 edge thickness.

(6) $y_2[\Theta_{1\_min}]$ is 194 mm, Eq. 3506. Again, the 30 mm difference between the $y_2$ limits is selected to accommodate the 24 mm printhead width plus optical clearances.

Based on these specifications, $\Theta_{1\_min}$, $c$, $l_1[\Theta_{1\_min}]$, and $\Theta_2[\Theta_{1\_min}]$ have the values given in Eqs. 3507–3510.

The M1.3, M2.3 mirror design parameters are outlined in FIG. 36:

(1) $\Theta_{1\_max}$ is 34.7916°, Eq. 3601. This is to provide 3° clearance between the M1.2 and M1.3 collection ranges (cf. Eq. 3507), resulting in a 5-mm edge thickness allowance for M1.3.

(2) $l_2[\Theta_{1\_min}]$ is 70 mm, Eq. 3602.

(3) $\gamma_1[\Theta_{1\_min}]$ and $\gamma_2[\Theta_{1\_min}]$ are equal, Eq. 3603.

(4) The $I_1/E_{print}$ ratio is matched to that of mirrors M1.1, M2.1, Eq. 3604 (cf. Eq. 3409).

(5) $y_2[\Theta_{1\_max}]$ is 188 mm, Eq. 3605. This is 6 mm less than the M2.2 lower $y_2$ limit (Eq. 3506).

(6) $y_2[\Theta_{1\_min}]$ is 158 mm, Eq. 3606.

Based on these specifications, $\Theta_{1\_min}$, $c$, $1_1[\Theta_{1\_min}]$, and $\Theta_2[\Theta_{1\_min}]$ have the values given in Eqs. 3607–3610.

Distribution Optics

The collimated output from the collection optics (the three shell reflectors described above) is subdivided and distributed by the distribution optics. In short, the distribution optics consist of flat, grazing-incidence fold mirrors to illuminate the print modules. In a specific embodiment, there are two wafer print modules, each comprising 32 printheads covering a 300-mm wafer (FIG. 23). Further, each printhead comprises 3,629,988 microlens apertures and microshutters distributed over a 24-mm square printhead aperture (FIG. 28, Eq. 2801).

Figure 37:
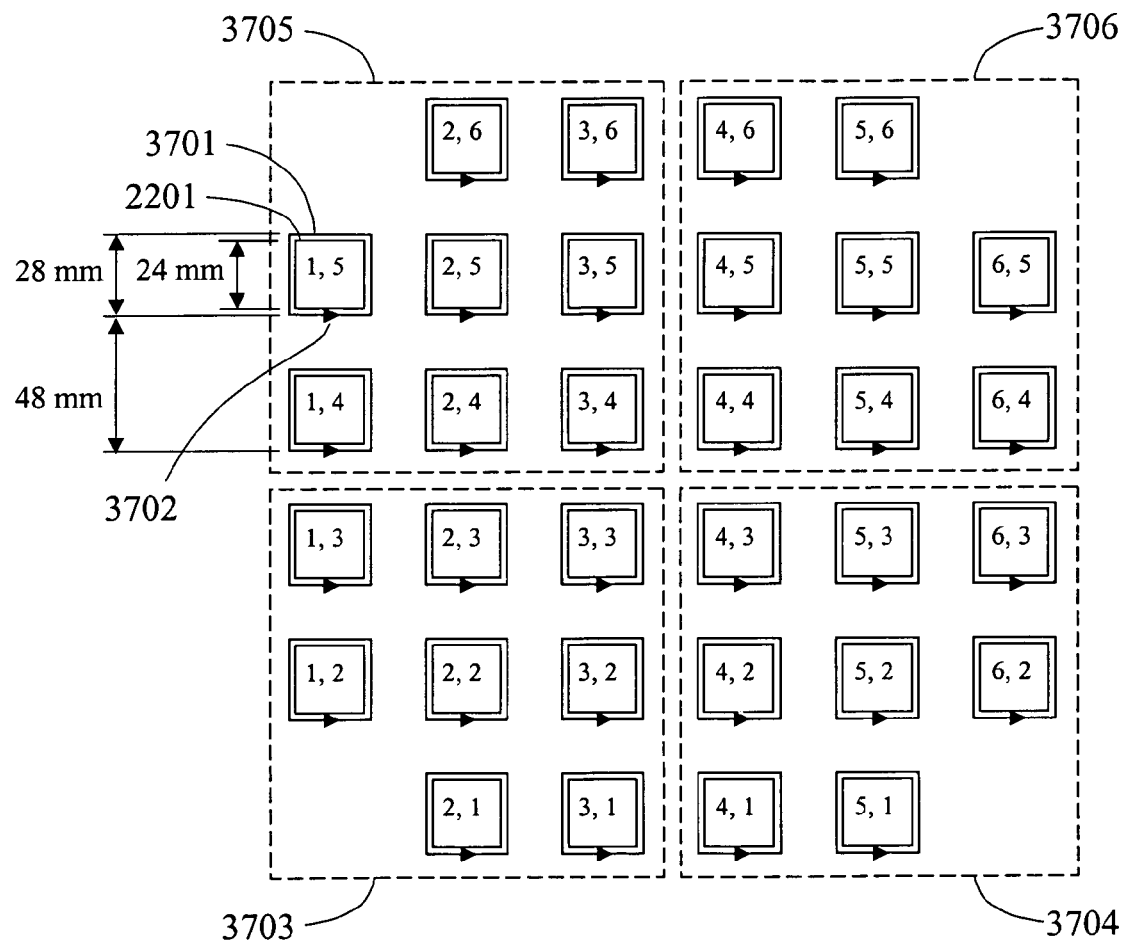
FIG. 37 is a plan view of the illumination pattern on a print module.

FIG. 37 illustrates the illumination pattern on a print module (cf. FIG. 23). Each printhead 2201 is covered by a 28-mm square illumination zone 3701. There is a 2-mm overfill clearance around the 24-mm-square printhead to accommodate the source's penumbral shadow region and edge diffraction effects. (These factors are discussed in the next section.) FIG. 37 shows small arrow indicators on the illumination zones (e.g., arrow 3702 on zone 3701); these serve as orientation references for correlating various views of the distribution optics. The printheads and illumination zones are indexed by their column and row indices in the array, e.g., zone 3701 has array indices 1, 5 and may be designated as "zone 1, 5". The zones are subdivided into four aperture subgroups 3703, 3704, 3705, and 3706, each comprising 8 zones. Each subgroup may be designated by the array indices of its central zone, e.g., group 3703 may be designated as "aperture subgroup 2, 2".

Figure 38:
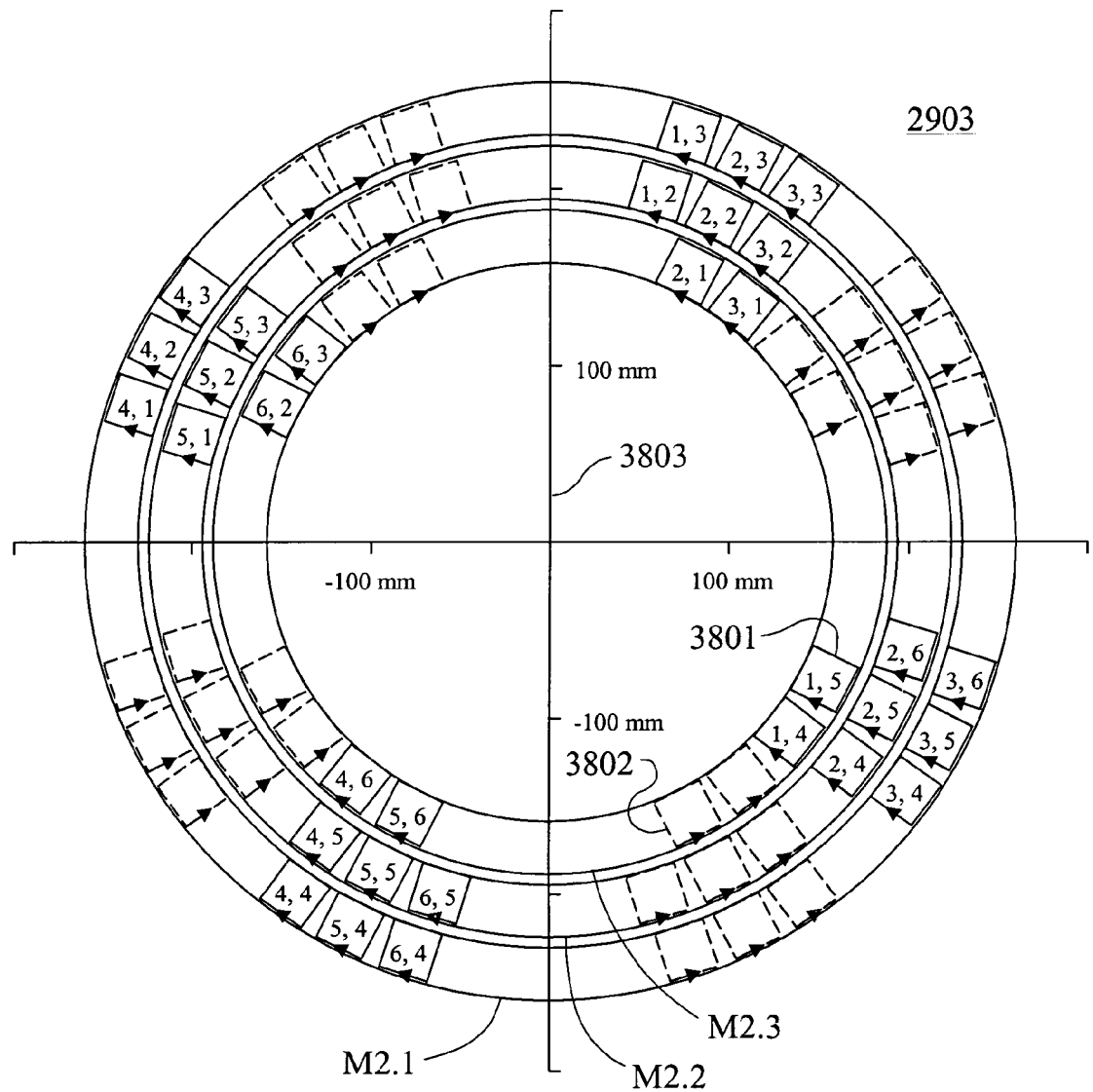
FIG. 38 is an axial view of the illumination zones relative to the collection optics.

FIG. 38 is an axial view of the collection mirrors M2.1, M2.2, M2.3, with the line of sight parallel to the collimated beam direction. This shows the collimated output beam of the collection optics in the projection plane designated 2903 in FIG. 29. The beam comprises illumination subapertures corresponding to individual illumination zones—for example, subaperture 3801 illuminates zone 1, 5. The indexed subapertures in FIG. 38 correspond to illumination zones on one of the two print modules (FIG. 37). The dashed rectangles (e.g., 3802) represent subapertures corresponding to the other print module. Portions of the M2.1, M2.2, M2.3 apertures outside of the illumination subapertures are optically inactive and may be used for mechanical framing. The entire optical system, including both modules, has bilateral symmetry across a vertical center plane 3803.

Figure 39:
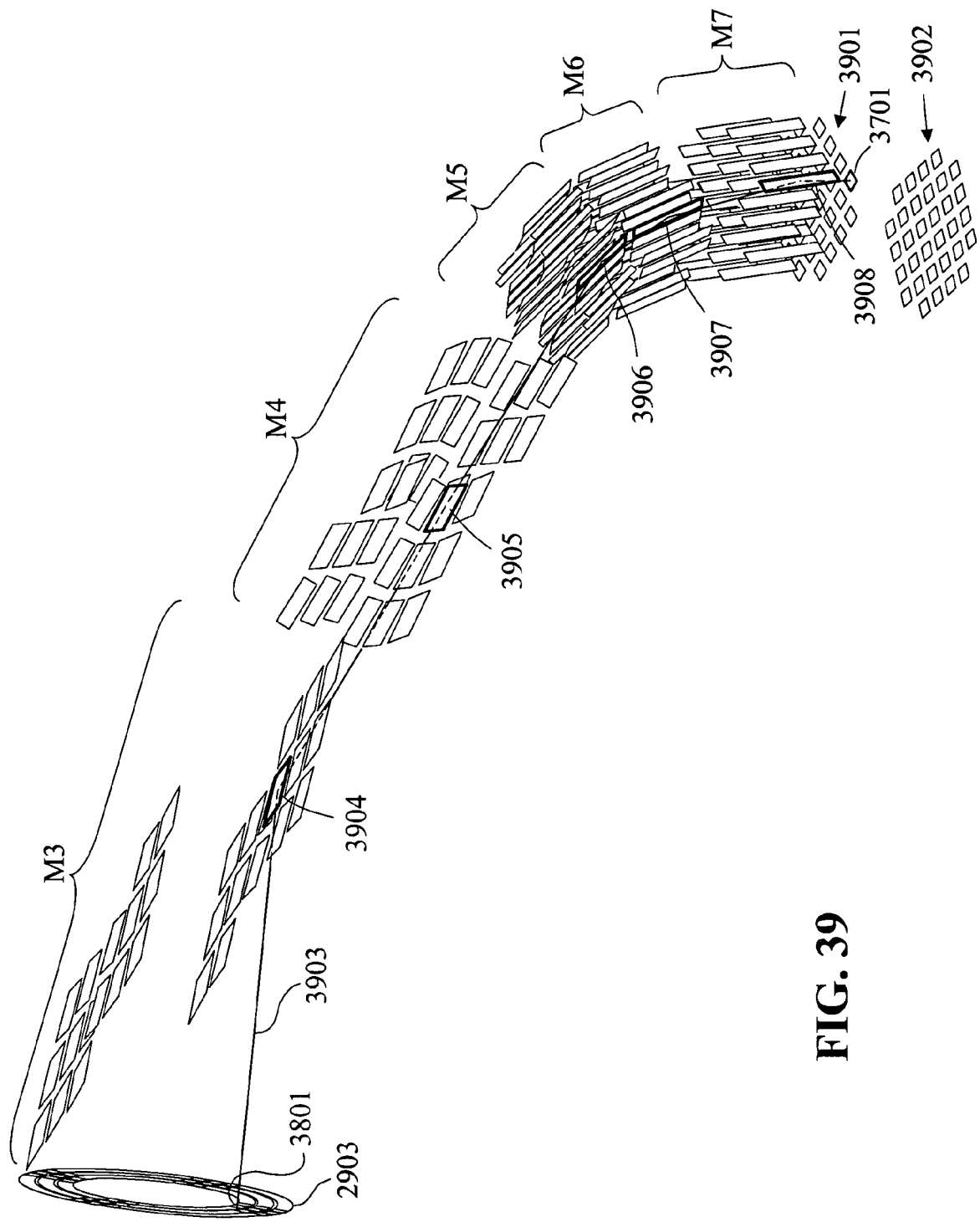
FIG. 39 illustrates the illumination distribution optics.

FIG. 39 illustrates the distribution optics. The figure does not show the collection mirrors, but it shows the projection plane 2903 of FIG. 38. The illumination zones of one of the print modules (e.g., zone 3701) are indicated collectively as 3901, and the zones for the other module are indicated as 3902. Only the distribution optics for zones 3901 are shown—the optics for zones 3902 have a symmetric form, based on the system's bilateral symmetry. The distribution optics for zones 3901 comprise five sets of flat mirrors indicated as M3, M4, M5, M6, and M7. The illustrated parallelograms in each set represent the projections of the illumination zones onto corresponding mirror planes. (Many of the parallelograms are non-rectangular, causing the perspective view of FIG. 39 to appear somewhat distorted.)

The center ray 3903 for one particular illumination zone (3701) is shown in FIG. 39, and the mirror apertures intercepted by this ray are highlighted. The ray traverses illumination subaperture 3801 on projection plane 2903, and intercepts mirror apertures 3904, 3905, 3906, 3907, and 3908 in mirror sets M3, M4, M5, M6, and M7, respectively. The grazing angles are 15° on mirrors M3 and M4, and are approximately 10.3° on mirrors M5, M6, and M7. In the projected view of FIG. 38, the projection apertures and M3 mirror apertures are superimposed (e.g., projected subaperture 3801 coincides with mirror aperture 3904 in this view).

Also, in FIG. 37 the illumination zones coincide with the M7 apertures (e.g., zone 3701 coincides with mirror aperture 3908).

The mirror surfaces in each set M3, M4, and M7 are parallel. Furthermore, the M3 and M4 mirror surfaces corresponding to each aperture subgroup are coplanar. Thus, M3 and M4 may each comprise just four mirrors, one for each subgroup. (Some of the M7 surfaces are also coplanar, allowing them to be consolidated.) The coplanarity constraint in M3 and M4 is not a strict design requirement—the system might be made more compact by removing this constraint, but the number of mirror parts would increase significantly.

The illumination beams for the 32 illumination zones 3901 all follow parallel paths between successive mirror sets, except between M5 and M6. The beam directions between M5 and M6, and the M5 and M6 mirror surface tilts, are selected to induce slight orientation shifts between the illumination subapertures in projection plane 2903. As illustrated in FIG. 38, the subapertures (e.g., 3801) for each print module all have nearly the same orientation, except for slight orientational differences to fit them to the annular M2 apertures. (Note the orientation arrows.) These orientational differences are induced by the M5, M6 mirror tilts.

Figure 40:
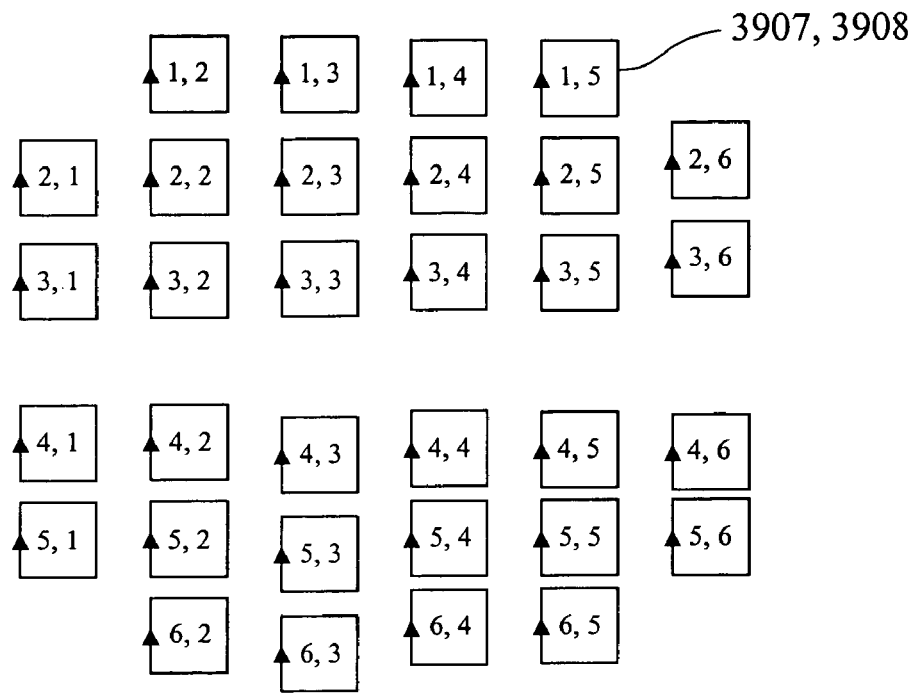
Figure 41:
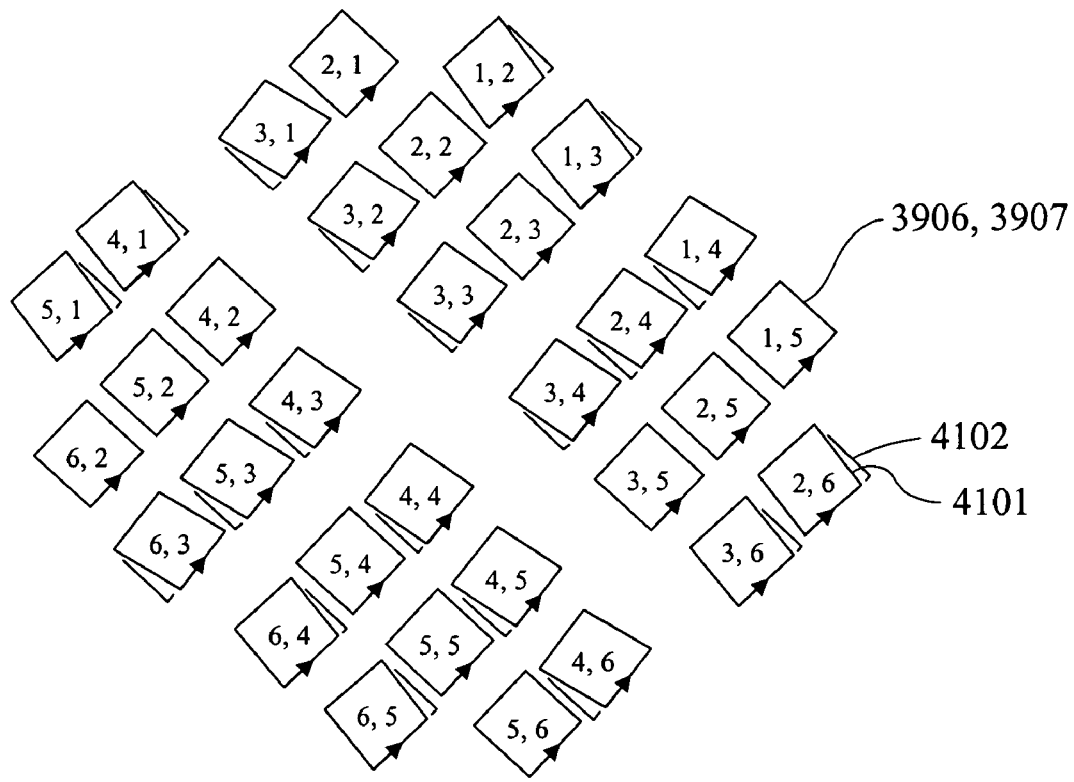
Figure 42:
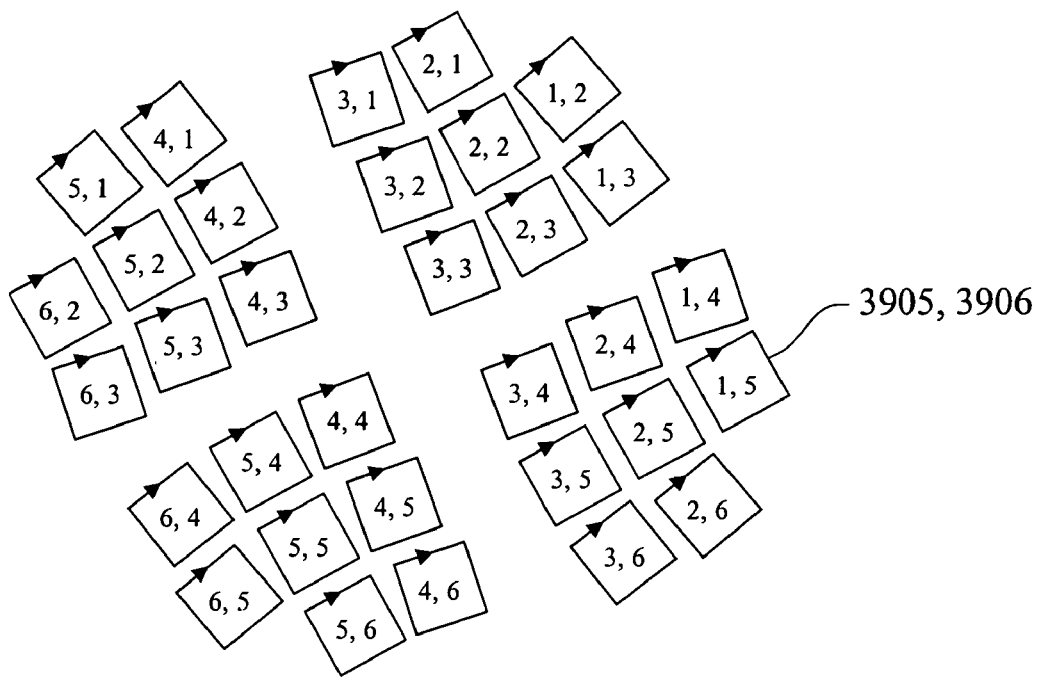

FIGS. 40–43 show several additional views of the distribution optics. FIG. 40 is a projected view of M6 and M7, with the line of sight parallel to the beam direction between M6 and M7. In this view, the M6 and M7 mirror apertures (e.g., 3907 and 3908) are superimposed. FIG. 41 shows the M5 and M6 mirrors, with the line of sight parallel to the some of the beam direction between M5 and M6. In this view, mirrors 3906 and 3907 are superimposed. The illumination beams are not all parallel between M5 and M6, so some of the M5 mirrors are not exactly superimposed on the corresponding M6 mirrors in this view (e.g., M5 mirror 4101 is not exactly superimposed on M6 mirror 4102). FIG. 42 illustrates the M4 and M5 mirrors, with the line of sight parallel to the beam direction between M4 and M5. Mirror apertures 3905 and 3906 are superimposed in this view. FIG. 43 shows a view of M3 and M4 with the line of sight parallel to the beam direction between M3 and M4. Mirror apertures 3904 and 3905 are superimposed in this view.

FIGS. 44–47 tabulate raytrace data for the distribution optics. Each figure pertains to one of the four aperture subgroups. Each column in the tables contains ray intercept data for an illumination ray propagating from projection plane 2903 to the center of one of the printheads. The printhead array indices are indicated in the top row of each table. The row with the "P" header specifies the ray position on projection plane 2903; the "M3" . . . "M7" rows specify the ray intercept points on the mirrors, and the "H" column specifies the printhead center position. The points are specified as x, y, z Cartesian coordinate triplets, wherein the coordinate system's origin is at the LPP source, y is the vertical coordinate, and x and z are horizontal coordinates with z along the collection optics' axis (FIG. 30). The coordinates are specified in millimeter units. This data is for one of the two printhead sets 3901 (FIG. 39); for the other set 3902 the x coordinates are sign-inverted. The data in FIGS. 44–47 is sufficient to determine the mirror surface tilts and the printhead aperture orientations, from which the mirror aperture geometry can be determined by reverse ray-tracing from the illumination zones' corner points (FIG. 37).

Edge Effects and Apodization

The illumination zones on the printheads (FIG. 37) are slightly oversized to accommodate two mirror edge effects: edge shadow blur due to the extended source size, and edge diffraction.

Figures 48, 49:
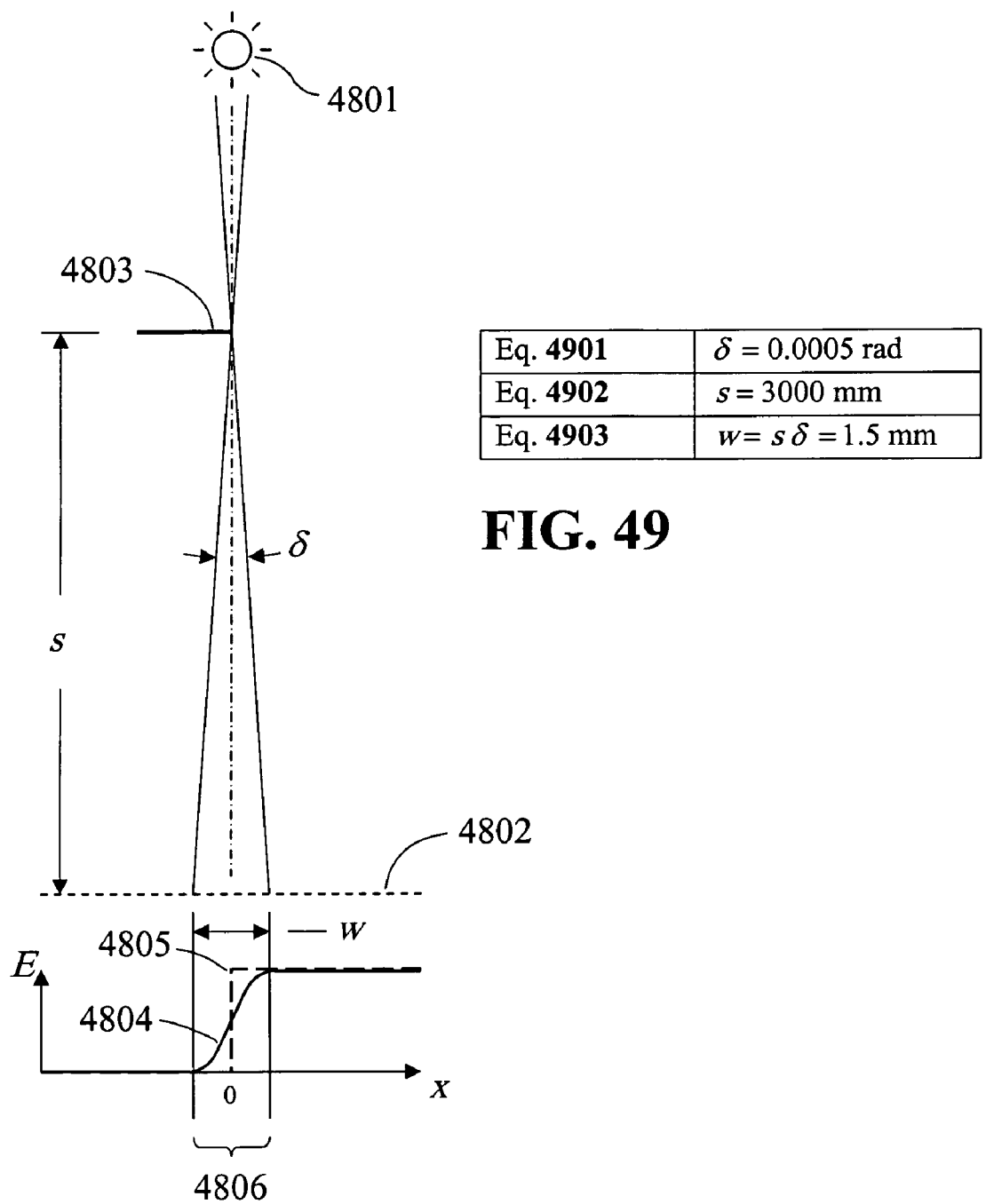
FIGS. 48 and 49 outline the analysis of the illumination source's penumbral shadow at the edge of an illumination zone.

FIGS. 48 and 49 conceptually illustrate the first of these effects, shadow blur. An extended illumination source 4801 illuminates plane 4802. Part of the illumination beam is blocked by a straight-edge mask 4803 (representing the effect of a mirror edge). The irradiance E across the geometric shadow, as a function of position x on illumination plane 4802, is illustrated as curve 4804 for the extended source, and as 4805 for an ideal point source. The nominal shadow edge position, corresponding to the boundary of illumination zone 3701 in FIG. 37, is at x=0. The width w of the penumbral shadow region 4806 (i.e., the sloped portion of curve 4804) is proportional to the source's angular divergence δ and the distance s from edge 4803 to plane 4802. The EUV collection optics produces a collimated beam with 0.5 mrad divergence (Eq. 4901—this assumes a 100-micron LPP plasma source), and the maximum optical path length s from the mirror edges to the printheads is approximately 3 meters (Eq. 4902), so w is approximately 1.5 mm (Eq. 4903). The penumbra is confined to the region |x|<0.75 mm, so the 2-mm illumination overfill clearance (FIG. 37) is more than adequate to accommodate the penumbral shadow.

FIGS. 50–53 illustrate the edge diffraction effect. A plane-wave illumination beam 5001 with a wavelength λ of 11 nm (Eq. 5101) is partially blocked by the straight-edge mask 4803, inducing a diffraction pattern in the shadow region on the illumination plane 4802, which is at a maximum distance s of 3 meters from the mask (Eq. 5102). The irradiance E across the diffraction pattern, as a function of position x on illumination plane 4802, is illustrated as curve 5002. (This represents the diffraction pattern for an on-axis LPP source point. For an off-axis point, the pattern may be laterally shifted by up to 0.75 mm, as indicated by FIG. 48.) E is proportional to the magnitude-squared of the complex amplitude A (Eq. 5103). The approximate functional form of A versus x is tabulated in Eq. 5104. (This only includes the effect of a single diffracting edge. In general the effects of multiple diffracting edges must be considered.) In this expression $e$ and S are the Fresnel integrals (Ref. 11, section 8.7.2, Eqs. 15), and the field amplitude is normalized so that A=1 in the absence of the diffracting mask 4803. The second approximate form of A in Eq. 5104 is valid when x is positive and large in comparison to $\sqrt{\lambda s}$=0.18 mm. (This approximation is obtained by ignoring small terms in Ref. 11, section 8.7.2, Eqs. 16, and setting Q=1 and P=0 in Eqs. 15.) The exponential argument in Eq. 5102 is a quadratic approximation to a cylindrical-wave phase function with the cylinder axis on the diffracting edge; hence it is evident that the amplitude A in the illuminated area comprises the undiffracted (unit-amplitude) plane-wave field (5003) plus a diffracted, cylindrical-wave field (5004) appearing to originate from the mask edge. FIG. 52 illustrates the magnitude of the diffracted wave (|A−1|) as a function of x.

The irradiance distribution E on the printhead top surface (i.e. plane 4802) is not itself directly relevant to printing performance—what matters is the wafer-plane irradiance, which is illustrated conceptually in FIG. 53 (cf. FIGS. 1A–1C). The electromagnetic field incident on a particular lens $L_1$ comprises the undiffracted field 5003 and the edge-diffracted field 5004. (On the scale of the lens aperture both fields are effectively plane waves. The wavefront curvature of field 5004 is insignificant on this scale.) The undiffracted field 5003 is focused to an on-axis spot on the second-stage lens ($L_2$) aperture. The irradiance profile of this spot, illustrated as curve 5301 in FIG. 53, has a monochromatic FWHM of approximately 0.52 micron. The diffracted field similarly produces an off-center, focused spot of lower intensity on $L_2$; its irradiance profile is illustrated as curve 5302. $L_2$ focuses the on-axis spot to a smaller, wafer-plane focus spot, illustrated by intensity profile 5303, which has a FWHM of 40 nm. The off-axis, edge-diffracted spot on $L_2$ is clipped by the $L_2$ aperture and is focused to a second wafer-plane focus spot, illustrated by intensity profile 5304. The two wafer-plane spots combine coherently, resulting in a somewhat distorted, lower-resolution, combined focus spot. (To some extent the distortions may cancel out when averaged over wavelengths and source points, but the degraded optical resolution will not be improved by such averaging.)

Figures 54, 55, 56:
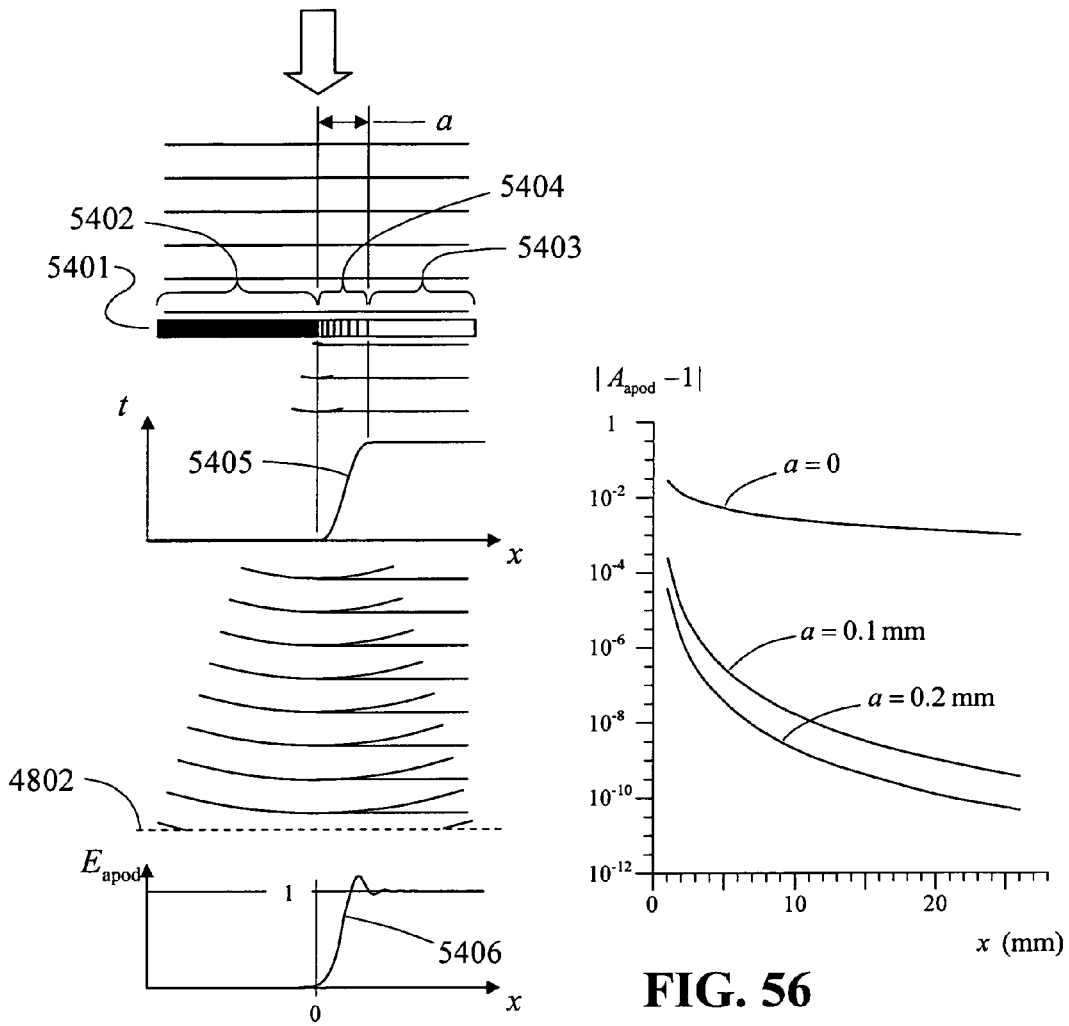
FIGS. 54–56 outline the analysis of edge diffraction with apodization.

FIGS. 54–56 illustrate a mechanism for apodizing the mirror apertures that can be used to mitigate diffraction effects. FIG. 54 is similar to FIG. 50, except that the diffracting edge 4803 is replaced by a transmission plate 5401 comprising an opaque region 5402, a clear region 5403, and a graded-transmittance region (the "apodization edge") 5404. The transmission plate 5401 conceptually represents the effect of an apodized mirror edge. The plate's amplitude transmittance t versus lateral position x on the plate is represented by curve 5405. The apodization edge width is a, and the transmittance varies smoothly from zero to one across the apodization edge. The irradiance $E_{apod}$ across the illumination plane 4802, with apodization, is illustrated by curve 5406. Compared to the intensity profile without apodization (curve 5002 in FIG. 50), the apodized profile 5406 is much more uniform.

Eq. 5501 in FIG. 55 illustrates a possible functional form for the apodizer transmittance t versus x. (This is the amplitude transmittance—the intensity transmittance is $|t|^2$.) Denoting the complex field amplitude on the illumination plane 4802 as $A_{apod}$, the irradiance $E_{apod}$ is proportional to the magnitude-squared of $A_{apod}$ (Eq. 5502). The amplitude $A_{apod}$, with apodization, is equal to the convolution of the unapodized amplitude A (Eq. 5104) with the derivative of t (Eq. 5503). FIG. 56 illustrates the diffracted field amplitude $|A_{apod}-1|$ for several values of the apodization edge width: a=0, a=0.1 mm, and a=0.2 mm. (The a=0 curve is equivalent to FIG. 52, but plotted on a log scale.) With a=0.2 mm, the diffracted amplitude is over four orders of magnitude smaller than the undiffracted amplitude for x>1 mm.

FIG. 57 illustrates a mirror surface 5701 with an apodization edge 5702 (shaded area). The apodization mechanism could comprise a gradient-thickness absorbing film formed on the mirror's periphery (e.g., via shadow-mask deposition or gray-scale lithography).

FIG. 58A illustrates an alternative apodization mechanism. A diffraction grating-type pattern comprising holes and islands (e.g., island 5801) is formed in an absorbing film of uniform thickness on the mirror periphery. The pattern simulates the effect of gray-scale patterning in a manner similar to half-tone printing. By making the grating periodicity sufficiently small, the grating's diffracted orders will have a sufficiently large deviation angle from the zero order that they will be eliminated by the $L_2$ apertures, and only the zero order will get through the microlenses. The variation in grating structure across the apodization edge 5702 effectively apodizes the zero order. (Ref. 24 discusses transmission apodizers of a similar type.)

FIG. 58B illustrates another type of mirror apodizer, this one consisting of a phase grating. As in FIG. 58A, the structure is a grating-like pattern, but in this case there is no absorbing film. Instead, the grating elements (e.g., element 5802) are shallow wells or mesas formed in the mirror surface. (The grating elements are illustrated as circles in FIG. 58B, but other shapes such as lines, triangles, etc. could also be used.) The depth of the structure is selected to induce a phase shift of π in the reflected beam at the 11-nm design wavelength. (For example, for a grazing angle of 15° the depth would be 10.6 nm.) If the grating elements' fill factor is 50% the zero order will be extinguished (at least at the design wavelength, but also to a significant extent at other nearby wavelengths). The fill factor varies from 0 to 50% across the apodization edge 5702, resulting in effective apodization of the zero order. In a variation of this method, the structure depth, rather than (or in addition to) the fill factor, may be controlled to determine the zero-order reflectivity.

[Note: Phase apodizers such as that illustrated in FIG. 58B can be applied to transmission elements as well as mirrors, and may be employed in an obvious manner for other applications such as microscopy.]

Efficiency Tuning

The illumination optics are designed to provide approximately uniform illumination over the printheads. This is achieved by designing the collection mirrors to compensate for radial variation in the mirror reflectivities and source intensity (the $\eta_{mirror}$ and $I_\lambda$ factors in FIG. 33, Eq. 3308) and designing the distribution optics so that all mirrors in each mirror set M3, M4, M5, M6, and M7 (FIG. 39) have the same—or nearly the same—grazing angles. (The angles are not all the same in M5 and M6, but the range of variation is only 0.013°.) However, the optical design does not achieve perfectly uniform illumination, primarily due to two factors: polarization dependence of the mirror reflectivity, and ambient gas absorption along the optical path. Some of the mirrors' surface reflectivities may be modified to counterbalance these factors. The same types of mechanisms described above for apodization (e.g., absorbing films, halftone gratings, or phase gratings; cf. FIGS. 58A, 58B) may also be employed for efficiency tuning.

Spectral Filtering

In the above-outlined optical design, the wafer-plane irradiance is spectrally filtered by three mechanisms: (1) the combination of $L_1$ chromatic dispersion and the $L_2$ aperture's spatial filtering action, (2) long-wavelength absorption by ruthenium, and (3) the LPP spectrum's sharp spectral peak. The first mechanism could be enhanced by using a phase Fresnel lens or zone plate lens for $L_1$. Additional spectral filtering may be required for some applications. (For example, the Bragg lenses illustrated in FIGS. 18 and 20 may require narrow-band illumination.) Multilayer, near-normal-incidence mirrors may be incorporated in the design to function as narrow bandpass filters if a very high degree of filtering is required. But a simpler approach, which may work for some applications, would be to modify the grazing-incidence mirrors' surface structure to provide spectral filtering.

A phase diffraction grating can be used as a spectral filter. The grating would comprise shallow wells or mesas formed on a flat mirror surface, similar to the apodizing phase grating (FIG. 58B), except that in this case the induced phase shift at the design wavelength (11 nm) would be an integer multiple of 2π, rather than π. Thus, zero-order reflection efficiency would be maximized at the design wavelength and would fall off at other nearby wavelengths due to the grating's dephasing effect. Typically, the grating structure would be uniform across the mirror surface, although some nonuniformity may be used to counterbalance spatial nonuniformity of the illumination spectrum (e.g., due to variation in the collection mirrors' reflectance spectrum with grazing angle).

The grating may comprise more than two phase levels to provide extra degrees of freedom in the design. A variety of grating structure types, such as lamellar line gratings or 3-D patterns of isolated holes or mesas, may be employed. For example, FIGS. 59A and 59B show cross-sectional views of a line grating comprising a ruthenium film 5901 with four surface levels 5902, 5903, 5904, and 5905. The grating lines are perpendicular to the plane of the figure in FIG. 59A, and are parallel in FIG. 59B. Grating design data is tabulated in FIG. 60. The grating is configured for operation at an incident grazing angle γ of 15° (Eq. 6001; FIG. 59B) and design wavelength $\lambda_{design}$ of 11 nm (Eq. 6002). As illustrated in FIG. 59B the grating preferably operates in a conical diffraction mode, with the plane of incidence parallel to the grating lines. (The incidence plane is defined by the incident and zero-order diffracted beams, which are respectively indicated as 5906 and 5907. If the grating were to operate in a planar diffraction mode, with the incidence plane perpendicular to the grating lines, the zero-order reflection efficiency would be much lower.) The grating period Λ is 1.5 micron (FIG. 59A, Eq. 6003). A height difference of h=21.25 nm between two grating surface zones would induce a 2π phase shift between the portions of the reflected field intercepting the two zones (Eq. 6004). The depth of surface levels 5902, 5903, 5904, and 5905 relative to the top level (5902), respectively designated $H_1$, $H_2$, $H_3$, and $H_4$, are integer multiples of h (Eq. 6005). The integer multiples, designated $m_1$, $m_2$, $m_3$, and $m_4$, are 0, 8, 12, and 4, respectively (Eqs. 6006). The area fractions covered by levels 5902, 5903, 5904, and 5905, designated $f_4$, $f_2$, $f_3$, and $f_4$, are all 0.25 (Eqs. 6007).

The grating period should be sufficiently small that the first and higher diffracted orders are adequately filtered out by the microlenses' spatial filtering action. The angular deviation of the first orders from the zero order is approximately $\lambda_{design}/\Lambda$, which is 7.3 mrad in the above design. Projecting this angle over the 385 μm focal length of $L_1$ (FIGS. 1A–1C, 2), the separation distance between the zero and first orders on the $L_2$ aperture plane is determined to be 2.8 μm, which us much larger than the $L_2$ aperture diameter (1 μm) and the $L_1$-focused beam's FWHM at the $L_2$ aperture plane (0.6 μm, including the source size and chromatic spread). Thus very little of the first and higher diffracted orders will get through $L_2$.

Based on the above design parameters, the grating's zero-order reflection efficiency $R_{grating}$ at an arbitrary wavelength λ is less than the reflectivity $R_{flat}$ of a flat mirror surface by a factor of $R_{rel}$ (the relative reflectance ratio), which has the approximate functional form given by Eq. 6008. FIG. 61 shows a plot 6101 of $R_{rel}$ versus λ based on this equation (dashed line). The central reflectance peak width is approximately 0.7 nm. The grating has other reflectance peaks (e.g., at wavelength 8.8 nm), but these could be filtered out by the other spectral-filtering mechanisms mentioned above. (Also, gratings formed on multiple mirrors, such as a set of gratings formed on the M6 mirrors and a second set of gratings formed on the M7 mirrors, may be used in combination to block side peaks.) Eq. 6008 is a scalar approximation, which models the grating as a thin phase plate. A more accurate numerical computation yields the relative reflectance curve 6102. Although Eq. 6008 is only an approximation, it is equally applicable to more generalized grating structures such as crossed gratings (although its accuracy can be much worse for other grating types). The number of grating levels, the depth factors $m_j$, and area fractions $f_j$ are free design parameters, which may be selected to obtain a good preliminary design; and more accurate numerical simulations may then be used to refine the design.

[Note: Spectral-filter phase gratings may be applied to transmission elements as well as mirrors, and such gratings may be employed in an obvious manner for other applications such as microscopy.]

Control System Architecture

Figure 62:
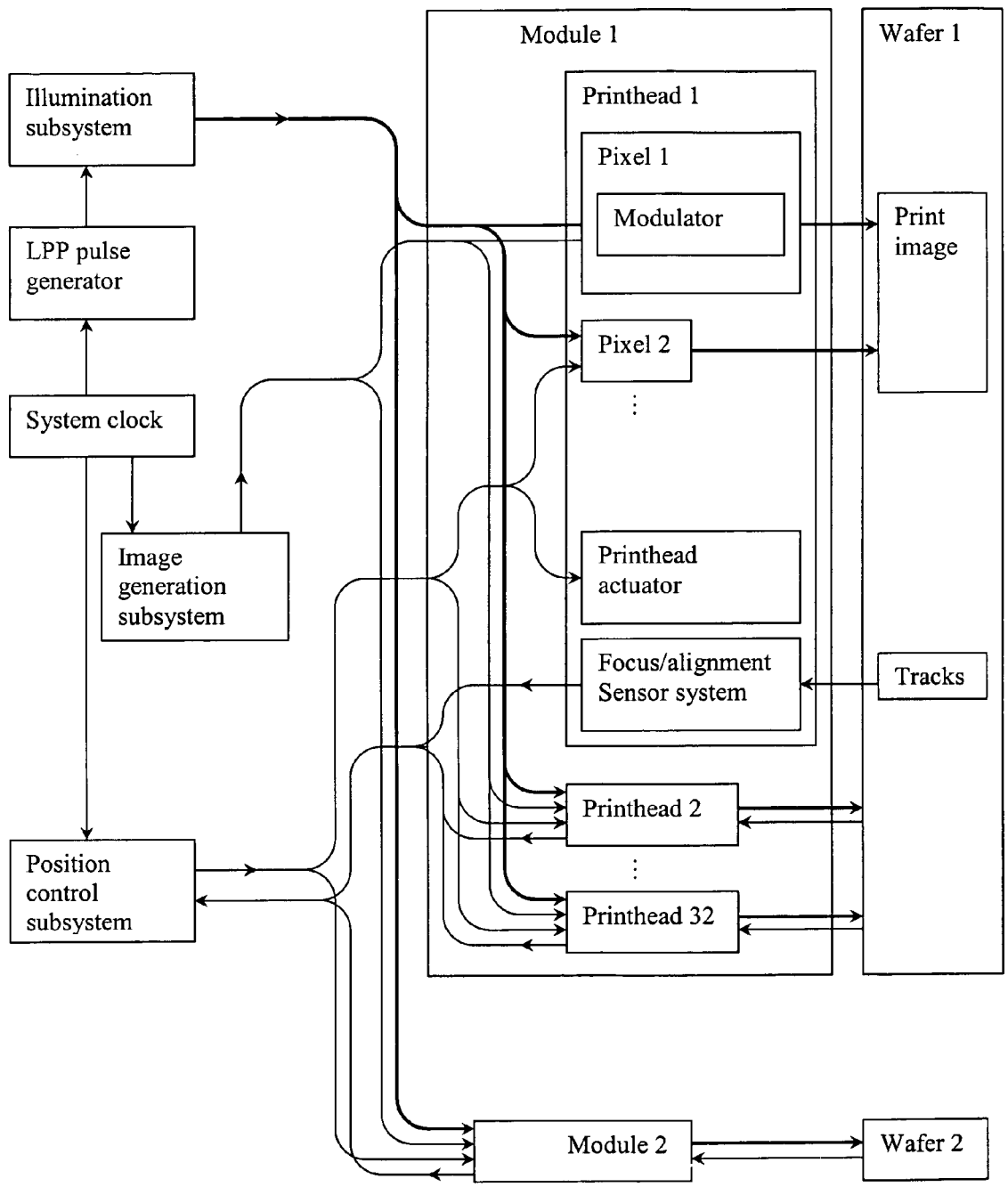
FIG. 62 is a block diagram illustrating the control system's main architectural components and interactions.

FIG. 62 is a block diagram illustrating the control system's main architectural components and interactions, in a preferred embodiment. The various elements were described in detail above or in Ref. 1, and will only be summarized here.

The printer comprises major subsystems for EUV illumination, position control, and image generation, which are synchronized to a common system clock. The illumination system includes the LPP pulse generator, the EUV source, and the illumination optics (grazing-incidence mirrors). Illumination is supplied to two wafer print modules ("Module 1", "Module 2"), each of which prints onto a separate corresponding wafer. (Bold lines in FIG. 62 represent EUV radiation paths, whereas light lines represent data or informational paths.) Each module comprises 32 printheads, and each printhead comprises an array of printer pixels, a printhead actuator, and a focus/alignment system. The control elements within each pixel include a modulator, which is controlled by the image generation subsystem.

The position control subsystem receives positional information from focus/alignment sensors formed integrally on the printheads, which sense each printhead's position relative to wafer tracking patterns (the "Tracks" in FIG. 62). This information is processed by the position control system and is used to control the printhead actuators.

REFERENCES

The following are the references referred to in the application:

1. U.S. Pat. No. 6,489,685, "Maskless, Microlens EUV Lithography System," Dec. 24, 2002. [Note: There is an extensive Certificate of Correction. An updated version of the patent document, including amendments and corrections, is available at http://ip.com/pubView/IPCOM000022681D or http://kjinnovation.com/.]
2. U. Stamm et al., "High Power EUV Lithography Sources Based on Gas Discharges and Laser Produced Plasmas," Proc. SPIE, vol. 5037, 119–129 (2003).
3. W. N. Partlo et al., "Progress Toward use of a Dense Plasma Focus as a Light Source for Production EUV Lithography," Proc. of SPIE, vol. 4343, 232–248 (2001).
4. International Sematech, 5th Next Generation Lithography (NGL) Workshop, 29–30 August 2001; Poster Presentation—Cymer. http://www.sematech.org/resources/litho/meetings/ngl/20010829/index.htm
5. U.S. Pat. No. 6,285,737, "Condenser for extreme-UV lithography with discharge source," Sep. 4, 2001.
6. Tamotsu Abe et al., "Development of a Liquid-Jet Laser-Produced-Plasma Light Source for EUV Lithography," Proc. SPIE, vol. 5037, 776–783 (2003).
7. U.S. Pat. No. 6,133,986, "Microlens Scanner for Microlithography and Wide-Field Confocal Microscopy," Oct. 17, 2000.
8. NanoFilm Technology, http://www.nanofilm.com.sg/index.htm
9. S. Graham et al., "Atomic Hydrogen Cleaning of EUV Multilayer Optics," Proc. SPIE, vol. 5037, 460–469 (2003).
10. A. W. Wong, Resolution Enhancement Techniques in Optical Lithography, SPIE Press, 2001.
11. Max Born and Emil Wolf, Principles of Optics, 7$^{th}$ Ed., Cambridge University Press (1999).
12. R. H. Liu et al., "Investigation of the LIGA process to fabricate microchannel plates," Transducers '97, vol. 1, 645–648 (1997).
13. H. Loeschner et al., "Masked Ion Beam Lithography and Direct-Structuring on Curved Surfaces," Proc. SPIE, vol. 5037, 156–161 (2003).
14. F. Yongqi et al., "Investigation of direct milling of micro-optical elements with continuous relief on a substrate by focused ion beam technology," Opt. Eng. Vol. 39(11), 3008–3013 (2000).
15. F. Yongqui et al., "Semiconductor Microlenses Fabricated by One-Step Focused Ion Beam Direct Writing," IEEE Transactions on Semiconductor Manufacturing, vol. 15(2), 229–231 (2002).
16. J. Brugger et al., "Resistless patterning of sub-micron structures by evaporation through nanostencils," Microelectronic Engineering 53, 403–405 (2003).
17. G. M. Peake et al., "A Micromachined, Shadow-Mask Technology for the OMVPE Fabrication of Integrated Optical Structures," Journal of Electronic Materials, vol. 29(1), 86–90 (1999).
18. R. Grunwald, "Microlens formation by thin-film deposition with mesh-shaped masks," Applied Optics, vol. 38(19), 4117–4124 (1999).
19. M. Nakahara et al., "Etching technique for ruthenium with a high etch rate and high selectivity using ozone gas," J. Vac. Sci. Tech. B, vol. 19(6), 2133–2136 (2001).
20. B. D. MacLeod, "Fully Automated Interference Lithography," Proc. SPIE, vol. 4688, 910–921 (2002).
21. A. Stein and C. Jacobsen, "Diffraction x-ray optics using production fabrication methods," J. Vac. Sci. Technol. vol. B 21(1), 214–219 (2003).
22. K. Miyamoto, "The Phase Fresnel Lens," J. Opt. Soc. Am., vol. 51(1), 17–20 (1961).
23. James E. Harvey, "Grazing incidence hyperboloid-hyperboloid designs for wide-field x-ray imaging applications," Applied Optics, vol. 40(1), 136–144 (2001).
24. U.S. Pat. No. 5,859,424, "Apodizing Filter System Useful for Reducing Spot Size in Optical Measurements and Other Applications," Jan. 12, 1999.

CONCLUSION

As has been described, embodiments of the invention incorporate a variety of improvements over the Ref. 1 design to make it more practical and manufacturable. It was recognized that the system described in Ref. 1 has no projection optics, and hence no imaging requirements necessitating the use of near-normal-incidence mirrors. Accordingly it was possible to eliminate such elements in the illumination optics in order to improve both optical efficiency and mirror durability, and reduce cost.

Some of the improvements require tradeoffs, however. For example, the estimated printing throughput is only 6 wph (wafers per hour), per LPP source, compared to 62 wph for Ref. 1 (and up to 120 wph for conventional projection lithography systems). The larger first-stage microlens apertures and lower fill factor reduce the total number of microlenses per module by a factor of 5, which accounts for a factor of 5 in the throughput loss. In addition, the system only supplies two wafer print modules per LPP (versus 8 for Ref. 1), accounting for another factor of 4. These factors are partially counterbalanced by the higher LPP repetition rate (10 kHz, versus 6 kHz for Ref. 1) and a coarser printing grid step (8 nm, versus 6.86 nm for Ref. 1). The throughput could be improved by designing the system to use more microlenses (e.g., smaller, more closely-spaced, first-stage lens apertures), a higher laser repetition rate (e.g., at 20 kHz throughput would be doubled), or a coarser grid step (e.g., a 16 nm grid step would quadruple throughput).

The lens efficiency is comparatively low as a consequence of the large first-stage lens aperture, the increased lens center thickness, and the high optical resolution. The monochromatic transmission efficiency through the first- and second-stage microlenses at the 11-nm design wavelength is 2.7% (compared to a narrow-band efficiency of 17% achieved by the Ref. 1 design). Nevertheless, the high mirror efficiency results in a modest LPP power requirement of 93 W hemispherical source emission in the wavelength range 10–12 nm. For comparison with the prior art, this corresponds to approximately 4.3 W within a 2% band at 13.5 nm, versus the 400 W requirement for EUV projection systems. Throughput is 20× lower, but power consumption is approximately 100× lower, resulting in a net gain of 5× in energy efficiency (EUV source energy per wafer) relative to projection systems. Further efficiency could be achieved by using smaller, thinner, or more closely spaced microlenses, or by using alternative lens types such as Bragg diffraction lenses and phase Fresnel lenses described above (at the cost of simplicity).

Notwithstanding these tradeoffs, the foregoing specification describes an EUV lithography system that has all of the favorable features and advantages of the Ref. 1 system, but which also eliminates the need for multilayer EUV mirrors. This results in several additional advantages: (1) the cost and technical complexity of the system are considerably reduced, (2) mirror durability is improved, and (3) the usable wavelength bandwidth can be greatly increased, so that a much lower-power EUV source can be used. The disclosure also discusses a number of practical design details and options relating to system manufacturability and optical performance. Much of the disclosure is directed toward detailing the design specifics of particular preferred embodiments, but the demonstrated design concepts and methodologies can be equally well applied to a diversity of applications ranging from, e.g., document printing to x-ray lithography.

While the above is a complete description of specific embodiments of the invention, the above description should not be taken as limiting the scope of the invention as defined by the claims.

What is claimed is:

1. A printing exposure apparatus comprising a radiation source, illumination optics, a modulator mechanism, a microlens array, and a scanning mechanism, wherein:
    the illumination optics convey radiation from the radiation source to the microlens array;
    the microlens array focuses the radiation onto a corresponding array of focal points on a printing surface;
    the modulator mechanism modulates the radiation, whereby the focal points' exposure intensity levels are controllably varied;
    the scanning mechanism establishes relative motion between the printing surface and the microlens array in synchronization with the modulator mechanism as the printing surface is exposed, whereby a synthesized, high-resolution exposure image is formed on the printing surface; and
    the illumination optics consist of grazing-incidence mirrors.

2. The apparatus of claim 1, wherein the radiation on the microlens array has a spectral bandwidth that is not significantly limited by mirror reflections.

3. The apparatus of claim 1, wherein the radiation comprises BUY radiation in the 5 to 15 nanometer wavelength range.

4. The exposure apparatus of claim 3, wherein the radiation source is a xenon laser-produced plasma source.

5. The apparatus of claim 1, wherein the microlens array is a multistage lens array.

6. The apparatus of claim 5, wherein the microlens array is a two-stage lens array.

7. The apparatus of claim 1, wherein at least some of the microlenses are continuous-profile, refractive elements.

8. The apparatus of claim 1, wherein at least some of the microlenses are Bragg diffraction lenses.

9. The apparatus of claim 1, wherein at least some of the microlenses are zone plate lenses.

10. The apparatus of claim 1, wherein at least some of the microlenses are phase Fresnel lenses.

11. The apparatus of claim 1, wherein the microlenses are composed of ruthenium.

12. The apparatus of claim 1, wherein the modulation mechanism comprises microshutters proximate to the microlenses.

13. The apparatus of claim 1, wherein the mirrors are composed of ruthenium.

14. The apparatus of claim 1, wherein the illumination optics consist of:
    collection optics, which collect and collimate radiation from the radiation source; and
    distribution optics, which partition and distribute the collimated radiation onto a plurality of microlens arrays including the microlens array of claim 1.

15. The apparatus of claim 14, wherein:
    the microlens arrays are generally horizontal;
    the collection optics provide generally horizontal collimated illumination; and
    the distribution optics redirect the collimated illumination so that the illumination is traveling in a generally vertical direction when it encounters the microlens arrays.

16. The apparatus of claim 14, wherein:
    the collection optics consist of first and second sets of curved, grazing-incidence mirrors;
    the radiation path from the source to any particular microlens array serially intercepts a mirror of the first set and a mirror of the second set; and
    the first and second sets of mirrors are configured to provide collimated output radiation of substantially uniform irradiance.

17. The apparatus of claim 14, wherein the distribution optics consist of flat, grazing-incidence mirrors.

18. The apparatus of claim 1, wherein at least one mirror is apodized to minimize edge diffraction effects.

19. The apparatus of claim 18, wherein the apodized mirror has a surface on a periphery of which is disposed a diffraction grating that performs the apodization.

20. The apparatus of claim 1, wherein at least one mirror has a reflectance characteristic that is configured to improve illumination uniformity on the microlens array.

21. The apparatus of claim 20, wherein the reflectance is configured by means of a diffraction grating structure disposed on the mirror surface.

22. The apparatus of claim 1, wherein at least one mirror has disposed on a surface thereof a diffraction grating structure that performs a spectral-filtering function.

23. A printing exposure apparatus comprising:
a radiation source;
a plurality of microlens arrays, at least one of the microlenses in at least one of the microlens arrays being a multistage lens;
illumination optics that convey radiation from the radiation source to the microlens arrays, the illumination optics and the microlens arrays being configured to focus the radiation from the radiation source on a corresponding plurality of focal point arrays on a printing surface;
a modulator mechanism disposed between the radiation source and the printing surface that modulates the radiation, whereby the focal points' exposure intensity levels are controllably varied; and
a scanning mechanism that establishes relative motion between the printing surface and the microlens arrays in synchronization with the modulator mechanism as the printing surface is exposed, whereby a synthesized, high-resolution exposure image is formed on the printing surface;
the illumination optics consisting of
collection optics consisting of at least one grazing-incidence mirror, the collection optics being configured to collect radiation from the radiation source, and
distribution optics consisting of at least one grazing-incidence mirror, the distribution optics being configured to partition radiation from the collection optics and distribute the radiation onto the plurality of microlens arrays.

24. The apparatus of claim 23, wherein the radiation on the microlens arrays has a spectral bandwidth that is not significantly limited by mirror reflections.

25. The apparatus of claim 23 wherein:
the collection optics consist of first and second sets of curved, grazing-incidence mirrors;
the radiation path from the source to any particular microlens array serially intercepts a mirror of the first set and a mirror of the second set;
the first and second sets of mirrors are configured to provide collimated output radiation of substantially uniform irradiance; and
the distribution optics consist of flat, grazing-incidence mirrors.

26. The apparatus of claim 25 wherein the illumination optics include at least one mirror that is apodized to minimize edge diffraction effects.

27. The apparatus of claim 25 wherein the illumination optics include at least one mirror that is configured with a reflectance characteristic that is configured to improve illumination uniformity on the microlens arrays.

28. The apparatus of claim 25 wherein the illumination optics include at least one mirror that is configured with a diffraction grating that performs a spectral-filtering function.

29. The apparatus of claim 23 wherein:
all the grazing-angle mirrors in the illumination optics are ruthenium elements operating at a grazing angle of approximately 15° or less.

* * * * *

UNITED STATES PATENT AND TRADEMARK OFFICE
CERTIFICATE OF CORRECTION

PATENT NO. : 7,116,405 B2  Page 1 of 1
APPLICATION NO. : 10/897082
DATED : October 3, 2006
INVENTOR(S) : Kenneth C. Johnson It is certified that error appears in the above-identified patent and that said Letters Patent is hereby corrected as shown below:

In the Specification:

Col. 2, line 25, please delete ")".

Col. 2, line 53, after "grazing-incidence mirror" please insert --)--.

Col. 13, line 54, please change "$10_6$" to --$10^6$--.

Col. 13, line 65, please change "$N^{pixel/head}$" to --$N_{pixel/head}$--.

Col. 14, line 5, please change "$A^{print}$" to --$A_{print}$--.

Col. 14, line 30, before "0.0172" please insert -- = --.

Col. 16, line 15, please change ")]" to --]--.

Col. 18, line 22, please change "$I_1[\Theta_{1\_min}]$" to --$l_1[\Theta_{1\_min}]$--.

Col. 18, line 32, please change "$\gamma 2$" to --$\gamma_2$--.

Col. 20, line 32, please change "parallel to the" to --parallel to--.

Col. 21, line 44, please change " $c$ and S" to -- $\mathcal{C}$ and $S$--.

Col. 24, line 45, please change "us" to --is--.

In the claims:

Col. 28, line 10, please change "BUY" to --EUV--.

Signed and Sealed this

Ninth Day of February, 2010

David J. Kappos
*Director of the United States Patent and Trademark Office*